(12) United States Patent
Park et al.

(10) Patent No.: US 8,873,324 B2
(45) Date of Patent: Oct. 28, 2014

(54) METHOD OF REFRESHING A MEMORY DEVICE, REFRESH ADDRESS GENERATOR AND MEMORY DEVICE

(75) Inventors: Chul-Woo Park, Yongin-Si (KR); Joo-Sun Choi, Yongin-Si (KR); Hong-Sun Hwang, Suwon-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 238 days.

(21) Appl. No.: 13/240,049

(22) Filed: Sep. 22, 2011

(65) Prior Publication Data

US 2012/0300568 A1 Nov. 29, 2012

(30) Foreign Application Priority Data

May 25, 2011 (KR) ........................ 10-2011-0049579

(51) Int. Cl.
*G11C 7/00* (2006.01)
(52) U.S. Cl.
USPC ....... 365/222; 365/149; 365/230.01; 365/201
(58) Field of Classification Search
USPC .................................. 365/222, 149, 230.01
See application file for complete search history.

(56) References Cited

U.S. PATENT DOCUMENTS

| | | | | |
|---|---|---|---|---|
| 7,095,669 | B2 | 8/2006 | Oh | 365/222 |
| 7,269,085 | B2 * | 9/2007 | Sohn et al. | 365/222 |
| 7,301,844 | B2 | 11/2007 | Dono et al. | 365/222 |
| 7,565,479 | B2 | 7/2009 | Best et al. | 711/106 |
| 2007/0033338 | A1 * | 2/2007 | Tsern | 711/106 |
| 2013/0279284 | A1 * | 10/2013 | Jeong | 365/222 |

OTHER PUBLICATIONS

Korean Patent Publication No. 1020060080331 to Sohn et al., having Publication date of Jul. 10, 2006 (w/ English Abstract page).
Japanese Patent Publication No. 2006-338759 to Dono et al., having Publication date of Dec. 14, 2006 (w/ English Abstract page).

* cited by examiner

*Primary Examiner* — Richard Elms
*Assistant Examiner* — Han Yang
(74) *Attorney, Agent, or Firm* — Monica H. Choi

(57) ABSTRACT

A refresh address is generated with a refresh period for refreshing a memory device with refresh leveraging. A respective refresh is performed on a weak cell having a first address when the refresh address is a second address instead of on a first strong cell having the second address. A respective refresh is performed on one of the first strong cell or a second strong cell having a third address when the refresh address is the third address. Address information is stored for only one of the first, second, and third addresses such that memory capacity may be reduced. In alternative aspects, a respective refresh is performed on one of a weak cell, a first strong cell, or a second strong cell depending on a flag when the refresh address is any of at least one predetermined address to result in refresh leveraging.

54 Claims, 40 Drawing Sheets

METHOD OF REFRESHING A MEMORY DEVICE, REFRESH ADDRESS GENERATOR AND MEMORY DEVICE

CROSS-REFERENCE TO RELATED APPLICATION(S)

This application claims priority under 35 USC §119 to Korean Patent Application No. 10-2011-0049579, filed on May 25, 2011, in the Korean Intellectual Property Office (KIPO), the contents of which are incorporated herein in its entirety by reference.

BACKGROUND

1. Technical Field

The present invention relates generally to performing a refresh in a memory device, and more particularly to refresh leveraging using multiple strong memory cells for a weak memory cell.

2. Discussion of the Related Art

A volatile memory device, such as a dynamic random access memory (DRAM), performs a refresh operation to retain data stored in memory cells. If a memory cell has a retention time shorter than a refresh period of the refresh operation, a row of memory cells with such a memory cell should be replaced with a row of redundancy cells.

As the size of the memory cell shrinks, the number of memory cells having retention times shorter than the refresh period increases. Accordingly, the number of rows of redundancy cells should be increased in a conventional volatile memory device. However, such a high number of redundancy cells increases the size and complexity of the volatile memory device.

SUMMARY

Accordingly, refreshes are performed more frequently for weak memory cells for reducing the number of redundancy memory cells.

In a method of refreshing a memory device according to an aspect of the present invention, a refresh address is generated with a refresh period. A respective refresh is performed on a weak cell having a first address when the refresh address is a second address instead of on a first strong cell having the second address. In addition, a respective refresh is performed on one of the first strong cell or a second strong cell having a third address when the refresh address is the third address. Address information is stored for only one of the first, second, and third addresses.

In an example embodiment of the present invention, only one of the first, second, and third addresses is stored, and the remaining two of the first, second, and third addresses are determinable from a predetermined bit relationship.

In a further example embodiment of the present invention, each of the first and second strong cells is not refreshed every refresh period, and another refresh is performed on the weak cell when the refresh address is the first address such that the weak cell is refreshed multiple times during the refresh period.

In another example embodiment of the present invention, the refresh address is compared with the address information to determine when the refresh address is any of the second and third addresses.

In a further example embodiment of the present invention, the weak cell has a respective retention time shorter than the refresh period, and the first and second strong cells each have a respective retention time longer than twice the refresh period.

In another example embodiment of the present invention, a respective refresh is performed on one of the first and second strong cells depending on a flag when the refresh address is the third address.

In a further example embodiment of the present invention, the first and second addresses differ by inversion of a most significant bit, and the second and third addresses differ by inversion of a least significant bit.

In another example embodiment of the present invention, the first, second, and third addresses are each a respective row address. In that case, a respective refresh is performed on a weak row having the first address when the refresh address is the second address instead of on a first strong row having the second address. Also, a respective refresh is performed on one of the first strong row or a second strong row having the third address when the refresh address is the third address.

In a further example embodiment of the present invention, the first and second addresses differ by inversion of a most significant bit, and the second and third addresses differ by inversion of another bit that is not the most significant bit.

In another example embodiment of the present invention, the third address is selected from a pool of addresses having a range defined by at least two least significant bits of one of the first and second addresses.

In a further example embodiment of the present invention, a respective refresh is performed on one of the weak cell or the first strong cell depending on a flag when the refresh address is the second address. In addition, a respective refresh is performed on one of the weak cell or the second strong cell depending on the flag when the refresh address is the third address.

In another example embodiment of the present invention, a respective refresh is performed on the weak cell having the first address when the refresh address is the second address instead of on the first strong cell in a selected memory bank. Furthermore, a refresh is performed on a respective cell having the second address in a non-selected memory bank.

In a further example embodiment of the present invention, a refresh is performed on one of the first and second strong cells when the refresh address is the third address in the selected memory bank. In addition, a refresh is performed on a respective cell having the third address in the non-selected memory bank.

In another example embodiment of the present invention, a respective refresh is performed on the weak cell when the refresh address is any of multiple second addresses instead of on respective cells of the second addresses.

In a further example embodiment of the present invention, a refresh is performed on one of the respective cells of the second addresses or respective cells of multiple third addresses when the refresh address is any of the third addresses.

In another example embodiment of the present invention, a refresh is performed on one of the respective cells of the second addresses or the second strong cell when the refresh address is the third address. In that case, the second addresses are stored for being compared to the refresh address. In addition, respective refreshes are performed for a respective weak cell each time the refresh address is any of respective multiple second addresses for each of multiple memory banks.

In a method of refreshing a memory device according to another aspect of the present invention, a refresh address is generated with a refresh period. A respective refresh is performed on a weak cell having a first address when the refresh address is a second address instead of on a first strong cell having the second address. In addition, a respective refresh is performed on one of the first strong cell or a second strong cell having a third address when the refresh address is the third address. Furthermore, the third address is selected from a pool of addresses having a range defined by at least two least significant bits of one of the first and second addresses.

A refresh address generator according to another aspect of the present invention includes a counter, an address changing unit, and a storing unit. The counter generates an initial refresh address with a refresh period. The address changing unit generates a final refresh address that is a first address of a weak cell such that the weak cell is refreshed instead of a first strong cell having a second address when the initial refresh address is the second address. The address changing unit generates the final refresh address as one of the second address and a third address of a second strong cell when the initial refresh address is the third address. In addition, one of the first and second strong cells having the final refresh address is refreshed. The storing unit stores address information for only one of the first, second, and third addresses.

In an example embodiment of the present invention, the storing unit stores only one of the first, second, and third addresses, and the remaining two of the first, second, and third addresses are determinable from a predetermined bit relationship.

In a further example embodiment of the present invention, each of the first and second strong cells is not refreshed every refresh period. In addition, the address changing unit generates the final refresh address as the first address when the initial refresh address is the first address such that the weak cell is refreshed multiple times during the refresh period.

In another example embodiment of the present invention, the refresh address generator further includes a comparing unit for comparing the initial refresh address with the address information for determining when the initial refresh address is any of the second and third addresses.

In a further example embodiment of the present invention, the weak cell has a respective retention time shorter than the refresh period, and the first and second strong cells each have a respective retention time longer than twice the refresh period.

In another example embodiment of the present invention, the address changing unit generates the final refresh address as one of the second and third addresses depending on a flag when the initial refresh address is the third address.

In a further example embodiment of the present invention, the first and second addresses differ by inversion of a most significant bit, and the second and third addresses differ by inversion of a least significant bit.

In another example embodiment of the present invention, the first, second, and third addresses are each a respective row address. In that case, a refresh is performed on a weak row having the first address instead of on a first strong row having the second address when the initial refresh address is the second address. Also, a refresh is performed on one of the first strong row or a second strong row having the third address when the initial refresh address is the third address.

In a further example embodiment of the present invention, the first and second addresses differ by inversion of a most significant bit, and the second and third addresses differ by inversion of another bit that is not the most significant bit.

In another example embodiment of the present invention, the third address is selected from a pool of addresses having a range defined by at least two least significant bits of one of the first and second addresses.

In a further example embodiment of the present invention, the address changing unit generates the final refresh address as one of the first and second addresses depending on a flag when the initial refresh address is the second address. In addition, the address changing unit generates the final refresh address as one of the first and third addresses depending on the flag when the refresh address is the third address.

In another example embodiment of the present invention, the storing unit stores bank address information such that a respective refresh is performed on the weak cell when the initial refresh address is the second address instead of on the first strong cell in a selected memory bank as indicated by the bank address. Furthermore, a respective refresh is preformed on a respective cell having the second address in a non-selected memory bank.

In a further example embodiment of the present invention, a respective refresh is performed on one of the first and second strong cells when the initial refresh address is the third address in the selected memory bank. Additionally, a respective refresh is performed on a respective cell having the third address in the non-selected memory bank.

In another example embodiment of the present invention, the address changing unit generates the final refresh address as the first address each time the initial refresh address is any of multiple second addresses.

In a further example embodiment of the present invention, the address changing unit generates the final refresh address as one of the second addresses and multiple third addresses when the initial refresh address is any of the third addresses.

In another example embodiment of the present invention, the address changing unit generates the final refresh address as one of the second and third addresses when the initial refresh address is the third address.

In a further example embodiment of the present invention, the storing unit stores the second addresses for being compared to the initial refresh address.

In another example embodiment of the present invention, respective refreshes are performed for a respective weak cell each time the initial refresh address is any of respective multiple second addresses for each of multiple memory banks.

A refresh address generator according to another aspect of the present invention includes a counter and an address changing unit. The counter generates an initial refresh address with a refresh period. The address changing unit generates a final refresh address that is a first address of a weak cell such that the weak cell is refreshed instead of a first strong cell having a second address when the initial refresh address is the second address. The address changing unit generates the final refresh address as one of the second address and a third address of a second strong cell when the initial refresh address is the third address. One of the first and second strong cells having the final refresh address is refreshed. The third address is selected from a pool of addresses having a range defined by at least two least significant bits of one of the first and second addresses.

In a method of refreshing a memory device according to another aspect of the present invention, a refresh address is generated with a refresh period. A respective refresh is performed on one of a weak cell having a first address or a first strong cell having a second address depending on a flag when the refresh address is the second address. In addition, a respective refresh is performed on one of the weak cell or a second strong cell having a third address depending on the flag when the refresh address is the third address.

According to an example embodiment of the present invention, a respective refresh is performed on the weak cell instead of on the first strong cell when the flag is at a first predetermined level and the refresh address is the second address. In addition, a respective refresh is performed on the first strong cell instead of on the weak cell when the flag is at a second predetermined level and the refresh address is the second address. Furthermore, a respective refresh is performed on the weak cell instead of on the second strong cell when the flag is at the second predetermined level and the refresh address is the third address. Additionally, a respective refresh is performed on the second strong cell instead of on the weak cell when the flag is at the first predetermined level and the refresh address is the third address.

According to a further example embodiment of the present invention, each of the first and second strong cells is not refreshed every refresh period, and the weak cell is refreshed multiple times during the refresh period.

According to another example embodiment of the present invention, the weak cell has a respective retention time shorter than the refresh period, and the first and second strong cells each have a respective retention time longer than twice the refresh period.

A refresh address generator according to an aspect of the present invention includes a counter and an address changing unit. The counter generates an initial refresh address with a refresh period. The address changing unit generates a final refresh address as one of a first address of a weak cell or a second address of a first strong cell depending on a flag when the initial refresh address is the second address. The address changing unit generates the final refresh address as one of the first address or a third address of a second strong cell depending on the flag when the initial refresh address is the third address. The weak cell or one of the first and second strong cells having the final refresh address is refreshed.

According to an example embodiment of the present invention, the address changing unit generates the final refresh address as the first address instead of the second address when the flag is at a first predetermined level and the initial refresh address is the second address. In addition, the address changing unit generates the final refresh address as the second address instead of the first address when the flag is at a second predetermined level and the initial refresh address is the second address. Furthermore, the address changing unit generates the final refresh address as the first address instead of the third address when the flag is at the second predetermined level and the initial refresh address is the third address. Additionally, the address changing unit generates the final refresh address as the third address instead of the first address when the flag is at the first predetermined level and the initial refresh address is the third address.

In an example embodiment of the present invention, each of the first and second strong cells is not refreshed every refresh period, and the weak cell is refreshed multiple times during the refresh period.

In a further example embodiment of the present invention, the weak cell has a respective retention time shorter than the refresh period, and the first and second strong cells each have a respective retention time longer than twice the refresh period.

A memory device according to aspects of the present invention includes a cell array and a refresh address generator of the above-described example embodiments of the present invention. The present invention may be practiced with such a memory device operating within a memory module, a mobile system, or a computing system.

BRIEF DESCRIPTION OF THE DRAWINGS

The above and other example aspects of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1-40 refer to elements having similar structure and/or function, unless stated otherwise.

DETAILED DESCRIPTION OF THE EMBODIMENTS

Figure 1:
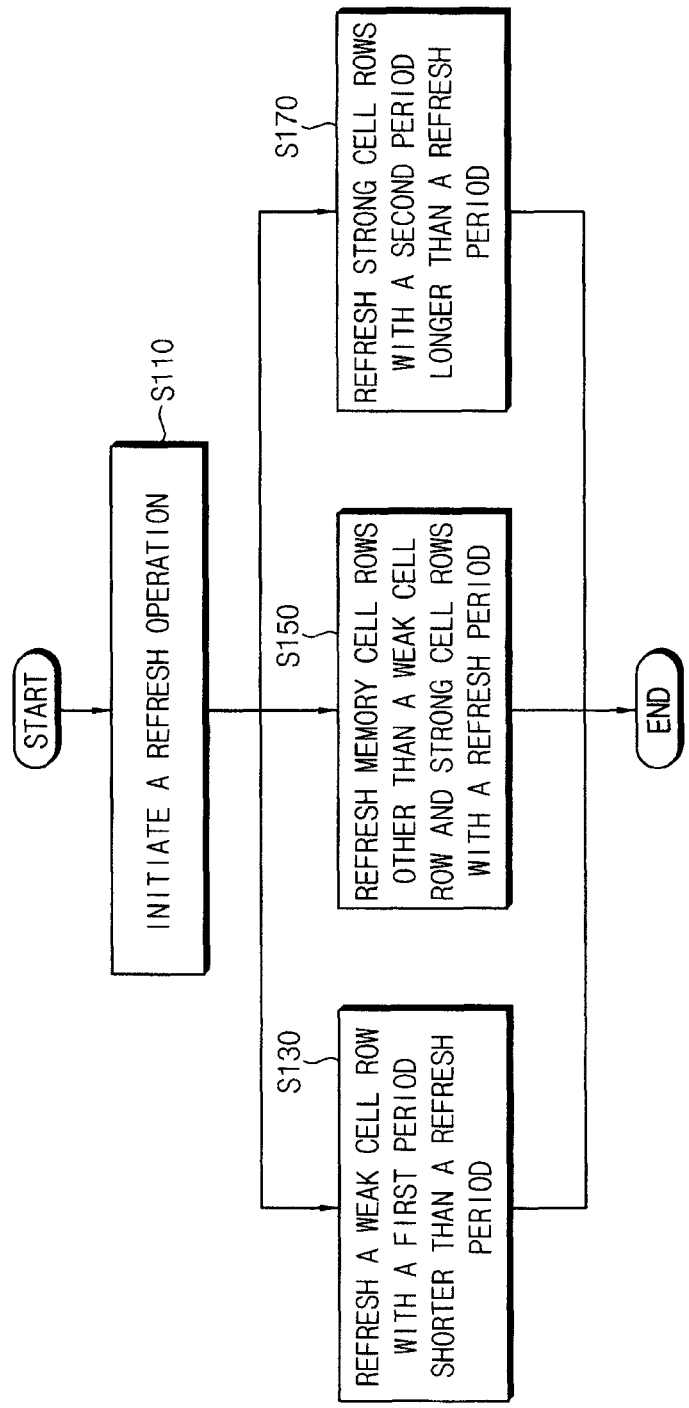
FIG. 1 is a flow chart of steps for refreshing a volatile memory device with refresh leveraging, according to an example embodiment of the present invention.

Exemplary embodiments are described more fully hereinafter with reference to the accompanying drawings. However, the present inventive concepts may be embodied in many different forms and should not be construed as limited to the exemplary embodiments set forth herein. Rather, these exemplary embodiments are provided so that this disclosure is thorough and complete for fully conveying the scope of the present inventive concept to those skilled in the art. In the drawings, the sizes and relative sizes of layers and regions may be exaggerated for clarity.

Although the terms first, second, third etc. may be used herein to refer to various elements, these elements should not be limited by these terms. These terms are used to distinguish one element from another. Thus, a first element could be termed a second element without departing from the teachings of the present inventive concept. As used herein, the term "and/or" includes any and all combinations of one or more of the associated listed items.

When an element is referred to as being "connected" or "coupled" to another element, the element can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a flow chart of steps for refreshing a volatile memory device with refresh leveraging, according to an example embodiment of the present invention. Referring to FIG. 1, if a volatile memory device is turned on, a refresh operation is initiated (S110). For example after a power-up sequence is completed or after a power-down mode is terminated, the refresh operation is initiated.

In an example embodiment, the refresh operation is an auto refresh operation that generates a refresh row address in response to a periodic refresh command (REF) for refreshing a memory cell row having the refresh row address. In another example embodiment, the refresh operation is a self refresh operation for periodically refreshing memory cell rows with a built-in timer in a self refresh mode of the volatile memory device in response to a self refresh entry command (SRE).

In a further example embodiment, the refresh operation is for a distributed refresh scheme with the refresh cycles being distributed such that the refresh cycles are timed at predetermined periodic refresh intervals (tREFI). In another example embodiment, the refresh operation is for a burst refresh scheme with a series of refresh cycles being consecutively performed.

Upon initiation of the refresh operation, at least one weak cell row is refreshed with a first period shorter than a refresh period (S130), and at least two strong cell rows corresponding to the weak cell row are each refreshed with a second period longer than the refresh period (S170). The weak cell row is a row of memory cells including at least one memory cell having a first retention time shorter than the refresh period. Each strong cell row is a row of memory cells having retention times longer than the refresh period.

The refresh period is defined as a standard of the volatile memory device. For example, the refresh period is 32 ms, 64 ms, etc. According to an aspect of the present invention, the first retention time is shorter than the refresh period and longer than or equal to half the refresh period. In addition, the second retention time is longer than or equal to double the refresh period. For example, the first period for refreshing each weak cell row is half the refresh period, and the second period for refreshing each strong cell row is double the refresh period. Each weak cell row is related to at least two strong cell rows, and is refreshed instead of at least one of the related strong cell rows during each refresh period. Refreshing a weak cell row instead of a strong cell row is also referred to herein as "refresh leveraging".

In one example embodiment of the present invention, a weak cell row corresponds to first and second strong cell rows, and the weak cell row is refreshed instead of the first strong cell row each time a refresh row address for the first strong cell row is generated by a refresh counter. Furthermore, the first and second strong cell rows are alternately refreshed each time a refresh row address for the second strong cell row is generated by the refresh counter.

Accordingly, the weak cell row is refreshed when the refresh row address for the first strong cell row is generated as well as when a refresh row address for the weak cell row is generated. Thus, the weak cell row is refreshed with the first period that is half the refresh period. Furthermore, each of the first and second strong cell rows is refreshed with the second period that is double the refresh period.

In an example embodiment of the present invention, the weak cell row is refreshed instead of the first strong cell row in odd-numbered refresh periods, and is refreshed instead of the second strong cell row in even-numbered refresh periods. Accordingly, the weak cell row is refreshed twice per refresh period, and each of the first and second strong cell rows is refreshed once every two refresh periods.

Memory cell rows other than the weak cell row and the first and second strong cell rows are refreshed with the refresh period (S150). That is, normal memory cell rows are refreshed with the refresh period defined in the standard of the volatile memory device.

The present invention is described for rows of memory cells with each being coupled to one word line. However, the present invention may be applied for any group of memory cells having a weak memory cell with a retention time shorter than the refresh period and first and second groups of memory cells with retention times longer than the refresh period. For example, the present invention may be applied for a weak memory cell with a retention time shorter than the refresh period and first and second strong memory cells with retention times longer than the refresh period.

As described above, each weak cell row is refreshed instead of a strong cell row each refresh period such that a total number of refreshes performed per refresh period is not increased. Accordingly, the period of refreshing the weak cell row is decreased without increasing an auto or self refresh current and refresh power consumption. Furthermore, the weak cell row need not be replaced with a row of redundancy cells since the period of refreshing the weak cell row is decreased below the retention time of the weak cell row. Accordingly, a redundancy cell array and a redundancy circuit of the volatile memory device may be reduced in size.

Figure 2:
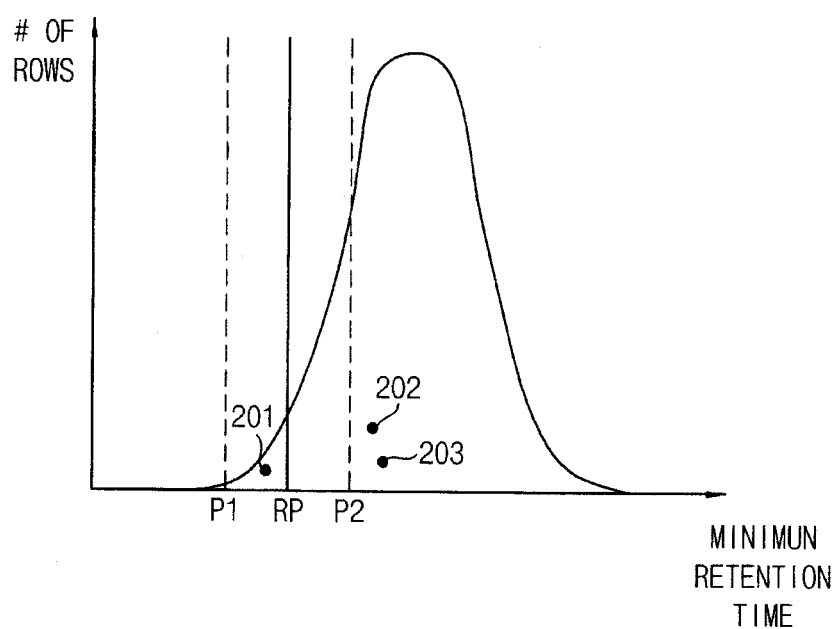
FIG. 2 is an example distribution graph of number of memory cell rows with minimum retention times for a volatile memory device.
Figure 3:
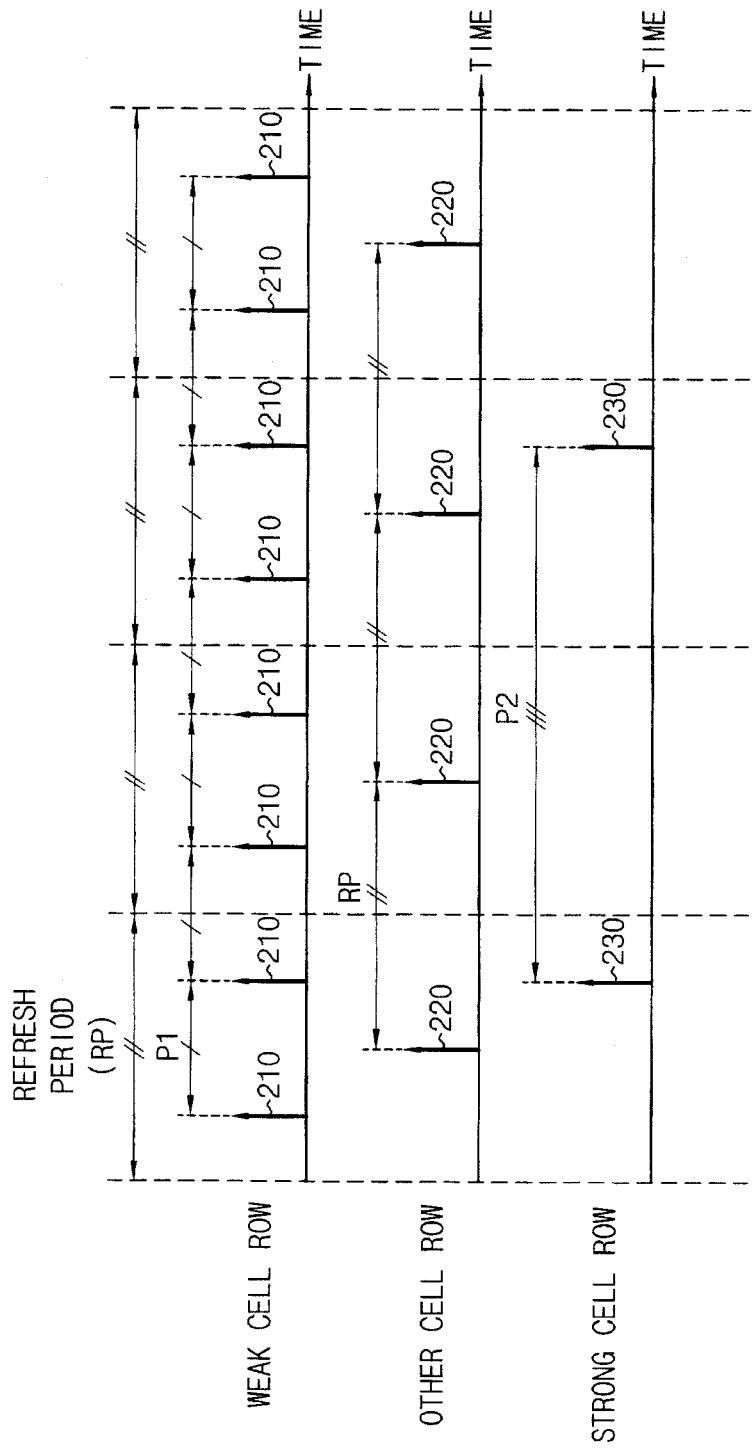
FIG. 3 is a timing diagram of example refreshes of memory cell rows performed according to a refresh method of FIG. 1, according to an example embodiment of the present invention.

FIG. 2 is an example distribution graph of number of memory cell rows with minimum retention times of memory cells in a memory cell row. FIG. 3 is a timing diagram of example refreshes performed according to a refresh method of FIG. 1.

Referring to FIGS. 2 and 3, a memory cell row having a minimum retention time shorter than a refresh period RP defined in the standard of the volatile memory device is a weak cell row 201. Here, a minimum retention time of a memory cell row is the shortest retention time among respective retention times of memory cells in the memory cell row. A refresh 210 for the weak cell row 201 is performed with a first period P1 that is shorter than or equal to the minimum retention time of the weak cell row. Since the weak cell row 201 is refreshed with the first period P1 shorter than its minimum retention time, the memory cell row need not be replaced with a row of redundancy cells.

At least two strong cell rows 202 and 203 are selected for each weak cell row 201. Memory cell rows having minimum retention times longer than or equal to a second period P2 are selected as the strong cell rows 202 and 203. The strong cell rows 202 and 203 retain data even if such rows 202 and 203 are refreshed with the second period P2 longer than the refresh period RP. Thus, some refreshes 230 are performed for the strong cell rows 202 and 203 while remaining refreshes designated for the strong cell rows 202 and 203 are performed for the weak cell row 201 instead.

As illustrated in FIG. 2, most memory cell rows have minimum retention times longer than or equal to the second period P2 (e.g., about double the refresh period RP). Accordingly, once the weak cell row 201 is found during a test procedure as part of a manufacturing process, the strong cell rows 202 and 203 corresponding to the weak cell row 201 are selected in any of numerous manners.

Aside from the strong cell rows 202 and 203, memory cell rows having minimum retention times longer than or equal to the refresh period RP are refreshed with the refresh period RP. A refresh row address for each memory cell row is generated with the refresh period RP by a refresh counter such that a refresh 220 for such a memory cell row is performed with the refresh period RP.

In an example embodiment of the present invention, a memory cell row having a minimum retention time shorter than the first period P1 is replaced with a row of redundancy cells. In another example embodiment of the present invention, the volatile memory device decreases a refresh period for such a memory cell row by relating the memory cell row to at least three strong cell rows as described below with reference to FIGS. 27-32. Accordingly, such a memory cell row retains data even if the memory cell row is not replaced with a row of redundancy cells.

Figure 4:
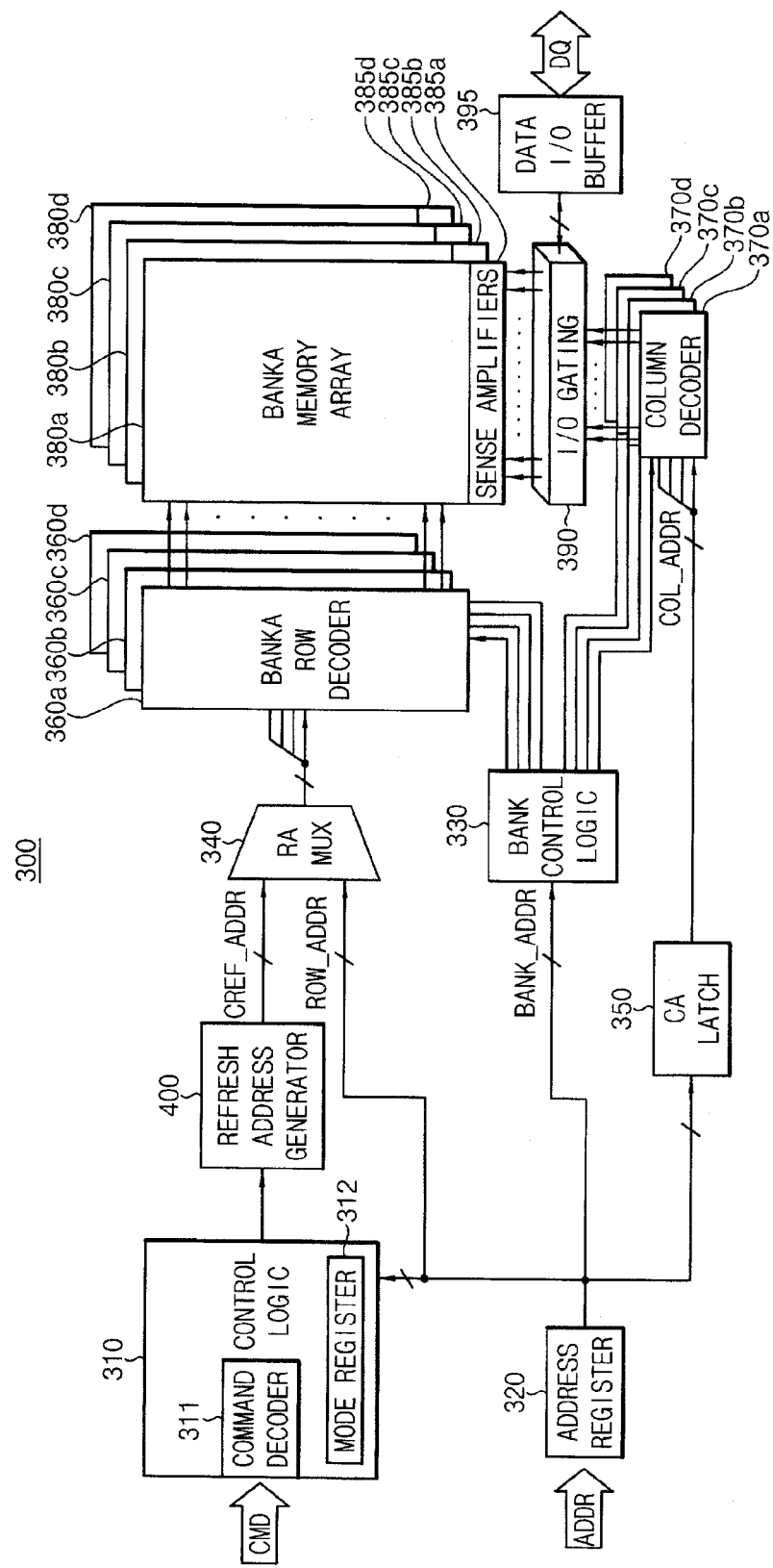
FIG. 4 is a block diagram of a volatile memory device for performing refresh operations with refresh leveraging, according to an example embodiment of the present invention.

FIG. 4 is a block diagram of a volatile memory device 300 for performing refresh leveraging according to an example embodiment of the present invention. The volatile memory device 300 includes a control logic 310, an address register 320, a bank control logic 330, a row address multiplexer 340, a column address latch 350, row decoders 360a-360d, column decoders 370a-370d, memory cell arrays 380a-380d, sense amplifiers 385a-385d, an input/output gating circuit 390, a data input/output buffer 395, and a refresh address generator 400. The volatile memory device 300 may be a dynamic random access memory (DRAM) such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), or other volatile memory devices having a refresh operation.

The memory cell array includes first, second, third, and fourth bank arrays 380a, 380b, 380c, and 380d, respectively. The row decoder includes first, second, third, and fourth bank row decoders 360a, 360b, 360c, and 360d respectively coupled to the first, second, third, and fourth bank arrays 380a, 380b, 380c, and 380d. The column decoder includes first, second, third, and fourth bank column decoders 370a, 370b, 370c, and 370d respectively coupled to the first, second, third, and fourth bank arrays 380a, 380b, 380c, and 380d.

The sense amplifier includes first, second, third, and fourth bank sense amplifiers 385a, 385b, 385c, and 385d respectively coupled to the first, second, third, and fourth bank arrays 380a, 380b, 380c, and 380d. The four bank arrays 380a, 380b, 380c, and 380d, the four bank row decoders 360a, 360b, 360c, and 360d, the four bank column decoders 370a, 370b, 370c, and 370d, and the four bank sense amplifiers 385a, 385b, 385c, and 385d may form first, second, third, and fourth banks, respectively. Although the volatile memory device 300 is illustrated in FIG. 4 as including four banks, the present invention may be practiced with the volatile memory device 300 including any number of banks.

The address register 320 receives an address ADDR including a bank address BANK_ADDR, a row address ROW_ADDR, and a column address COL_ADDR from a memory controller (not shown). The address register 320 transfers the received bank address BANK_ADDR to the bank control logic 330, the received row address ROW_ADDR to the row address multiplexer 340, and the received column address COL_ADDR to the column address latch 350.

The bank control logic 330 generates bank control signals in response to the bank address BANK_ADDR. One of the bank row decoders 360a, 360b, 360c, and 360d corresponding to the bank address BANK_ADDR is activated in response to the bank control signals, and one of the bank column decoders 370a, 370b, 370c, and 370d corresponding to the bank address BANK_ADDR is activated in response to the bank control signals.

The row address multiplexer 340 receives the row address ROW_ADDR from the address register 320 and a final refresh row address CREF_ADDR from the refresh address generator 400. The row address multiplexer 340 selectively outputs the row address ROW_ADDR or the final refresh row address CREF_ADDR for application to the bank row decoders 360a, 360b, 360c, and 360d.

The activated one of the bank row decoders 360a, 360b, 360c, and 360d decodes the row address from the row address multiplexer 340 and activates a word line corresponding to the row address. For example, the activated bank row decoder applies a word line driving voltage to the word line corresponding to the row address.

The column address latch 350 receives and temporarily stores the column address COL_ADDR from the address register 320. In a burst mode according to an example embodiment of the present invention, the column address latch 350 generates column addresses incremented from the received column address COL_ADDR. The column address latch 350 applies such a column address to the bank column decoders 370a, 370b, 370c, and 370d. An activated one of the bank column decoders 370a, 370b, 370c, and 370d decodes the column address COL_ADDR from the column address latch 350 for controlling the input/output gating circuit 390 to output data corresponding to the column address COL_ADDR.

The input/output gating circuit 390 includes circuitry for gating input/output data, an input data mask logic, read data latches for storing data from the bank arrays 380a, 380b, 380c, and 380d, and write drivers for writing data to the bank arrays 380a, 380b, 380c, and 380d. Data DQ to be read from one of the bank arrays 380a, 380b, 380c, and 380d is sensed by a respective sense amplifier coupled to that bank array and is stored in the read data latches, and such data DQ is provided to the memory controller via the data input/output buffer 395. Data DQ to be written to one of the bank arrays 380a, 380b, 380c, and 380d is provide from the memory controller to the data input/output buffer 395, and such data DQ is written to that bank array via the write drivers.

The control logic 310 controls operation of the volatile memory device 300 by generating control signals to perform a read or write operation. The control logic 310 includes a command decoder 311 that decodes a command CMD received from the memory controller and a mode register 312 that sets an operation mode of the volatile memory device 300.

For example, the command decoder 311 generates the control signals corresponding to the command CMD by decoding a write enable signal (/WE), a row address strobe signal (/RAS), a column address strobe signal (/CAS), and a chip select signal (/CS). The command decoder 311 further receives a clock signal (CLK) and a clock enable signal (/CKE) for operating the volatile memory device 300 in a synchronous manner. The control logic 310 controls the refresh address generator 400 to perform an auto refresh operation in response to a refresh command (REF) or to perform a self refresh operation in response to a self refresh entry command (SRE), in an example embodiment of the present invention.

The refresh address generator 400 generates a refresh row address and compares the refresh row address with a strong cell row address for changing the refresh row address into a weak cell row address if the refresh row address matches the strong cell row address. Accordingly, the weak cell row address instead of the strong cell row address is applied to the bank row decoders 360a, 360b, 360c, and 360d such that a weak cell row corresponding to the weak cell row address is refreshed instead of a strong cell row corresponding to the strong cell row address in the bank arrays 380a, 380b, 380c, and 380d.

Thus, the weak cell row is refreshed when the strong cell row address is generated as well as when the weak cell row address is generated. That is, the weak cell row is refreshed twice per refresh period. In an alternative embodiment of the present invention, the weak cell row address is applied to only one selected bank when the strong cell row address is generated while the strong cell row address is applied to other banks. In this case, the weak cell row is refreshed instead of the strong cell row only in the selected bank, and the strong cell row is refreshed in the other banks.

In this manner, the volatile memory device 300 decreases a refresh period of the weak cell row without increasing the refresh current and the refresh power consumption. Furthermore in the volatile memory device 300, a redundancy cell array and a redundancy circuit may be reduced in size.

Figure 5:
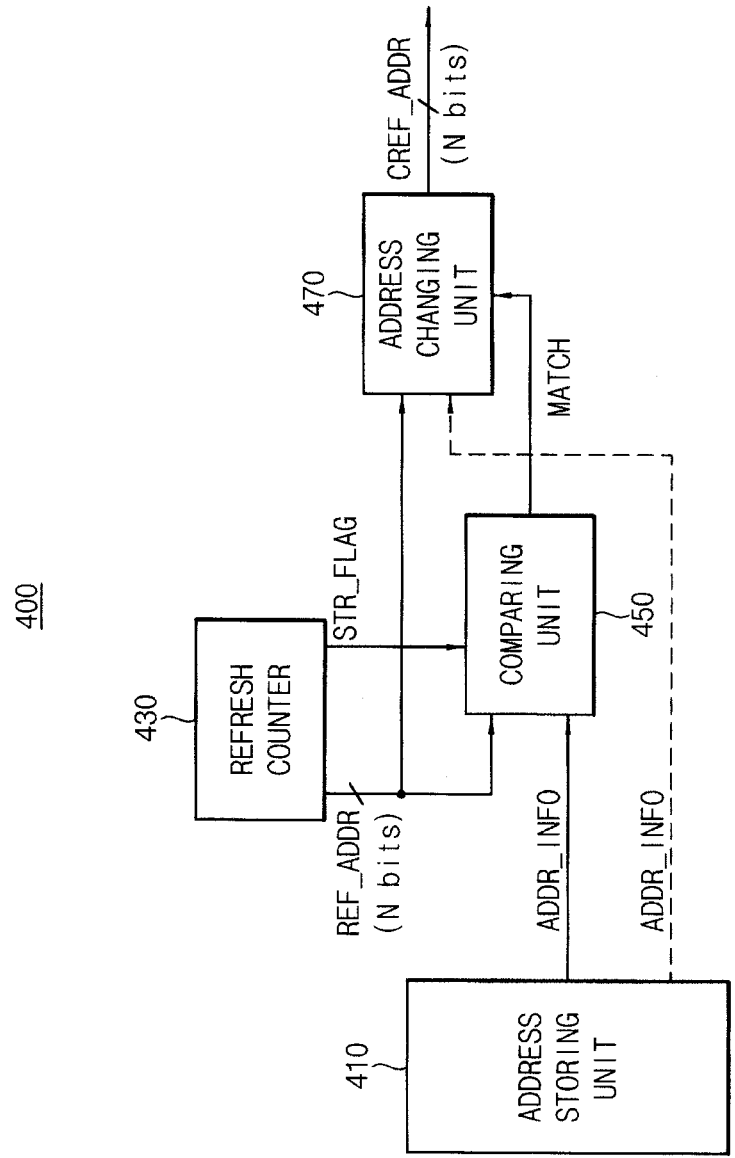
FIG. 5 is a block diagram of a refresh address generator included in the volatile memory device of FIG. 4, according to an example embodiment of the present invention.

FIG. 5 is a block diagram of the refresh address generator 400 in the volatile memory device 300 of FIG. 4, according to an example embodiment of the present invention. Referring to FIG. 5, the refresh address generator 400 includes an address storing unit 410, a refresh counter 430, a comparing unit 450, and an address changing unit 470.

The address storing unit 410 stores address information ADDR_INFO for at least one weak cell row. The amount of the address information ADDR_INFO stored in the address storing unit 410 corresponds to the number of weak cell rows in the memory cell array. For each weak cell row, the address storing unit 410 stores address information ADDR_INFO for at least one of a weak cell row address for the weak cell row and at least two strong cell row addresses related to the weak cell row address. In an example embodiment of the present invention, the address storing unit 410 stores address information ADDR_INFO for only one of the weak cell row address and the strong cell row addresses. The other of the weak cell row address and the strong cell row addresses is determinable from predetermined bit relationships between the weak cell row address and the strong cell row addresses.

In an example embodiment of the present invention, the address information ADDR_INFO is stored in the address storing unit 410 before the volatile memory device is packaged. Alternatively, the address information ADDR_INFO is stored in the address storing unit 410 after the volatile memory device is packaged. The address storing unit 410 may be implemented with an electrically programmable fuse memory, a laser-programmable fuse memory, an anti-fuse memory, a one-time programmable memory, a flash memory, or other types of nonvolatile memories, in an example embodiment of the present invention.

In another embodiment of the present invention, the address information ADDR_INFO includes a result of a predetermined operation (e.g., an XOR operation) performed on the weak cell row address, the first strong cell row address, and/or the second strong cell row address. For example, the predetermined operation is performed by a testing device while weak cell rows are searched during a test procedure, and the result of the predetermined operation is written into the address storing unit 410 by the testing device.

The refresh counter 430 counts to generate an initial refresh row address REF_ADDR that has N bits, with N being an integer greater than 1. For example, the refresh counter 430 increments the refresh row address REF_ADDR and initializes the refresh row address REF_ADDR to a minimum row address (e.g., "0") if the refresh row address REF_ADDR exceed a maximum row address.

The refresh counter 430 further generates a strong cell flag STR_FLAG for controlling refreshes of the strong cell rows. The refresh counter 430 inverts the strong cell flag STR_FLAG each time the refresh row address REF_ADDR is initialized, in an example embodiment of the present invention. For example, the refresh counter 430 is implemented with an N+M bit counter, with M being an integer greater than 0. In this case, the lower N bits generated by the counter 430 are used as the initial refresh row address REF_ADDR, and the upper M bits from the counter 430 are used as the strong cell flag STR_FLAG.

In an example embodiment of the present invention, the refresh counter 430 is implemented with an N+1 bit counter. In this case, the lower N bits from the N+1 bit counter 430 are used as the initial refresh row address REF_ADDR, and the most significant bit (MSB) from the counter 430 is used as the strong cell flag STR_FLAG.

The comparing unit 450 compares the initial refresh row address REF_ADDR from the refresh counter 430 with the address information ADDR_INFO from the address storing unit 410 to generate a match signal MATCH from the comparison and/or the strong cell flag STR_FLAG. For example, the comparing unit 450 generates a first match signal from comparing the refresh row address REF_ADDR with the first strong cell row address.

The comparing unit 450 also generates a second match signal from comparing the refresh row address REF_ADDR with the second strong cell row address and from the strong cell flag STR_FLAG. For example, if the refresh row address REF_ADDR matches the second strong cell row address and the strong cell flag STR_FLAG is at a logic high level, the comparing unit 450 generates the second match signal with a logic high level.

The address changing unit 470 changes the initial refresh row address REF_ADDR in response to the match signal MATCH from the comparing unit 450 to generate a final refresh row address CREF_ADDR. For example, the address changing unit 470 changes the initial refresh row address REF_ADDR into the weak cell row address in response to the first match signal, or changes the initial refresh row address REF_ADDR into the first strong cell row address in response to the second match signal.

In an example embodiment of the present invention, the address changing unit 470 changes the initial refresh row address REF_ADDR based on the address information ADDR_INFO from the address storing unit 410. Alternatively, the address changing unit 470 changes the initial refresh row address REF_ADDR using logic gates that perform a predetermined operation.

The final refresh row address CREF_ADDR is provided to bank row decoders 360a, 360b, 360c, and 360d via the row address multiplexer 340 illustrated in FIG. 4. Accordingly, a memory cell row corresponding to the final refresh row address CREF_ADDR is refreshed in the bank arrays 380a, 380b, 380c, and 380d.

In this manner, the refresh address generator 400 allows a weak cell row to be refreshed instead of a strong cell row by outputting the weak cell row address when the refresh counter 430 generates one of the first and second strong cell row addresses. Accordingly, a refresh period for the weak cell row is decreased without increasing the refresh current and the refresh power consumption.

Figure 6:
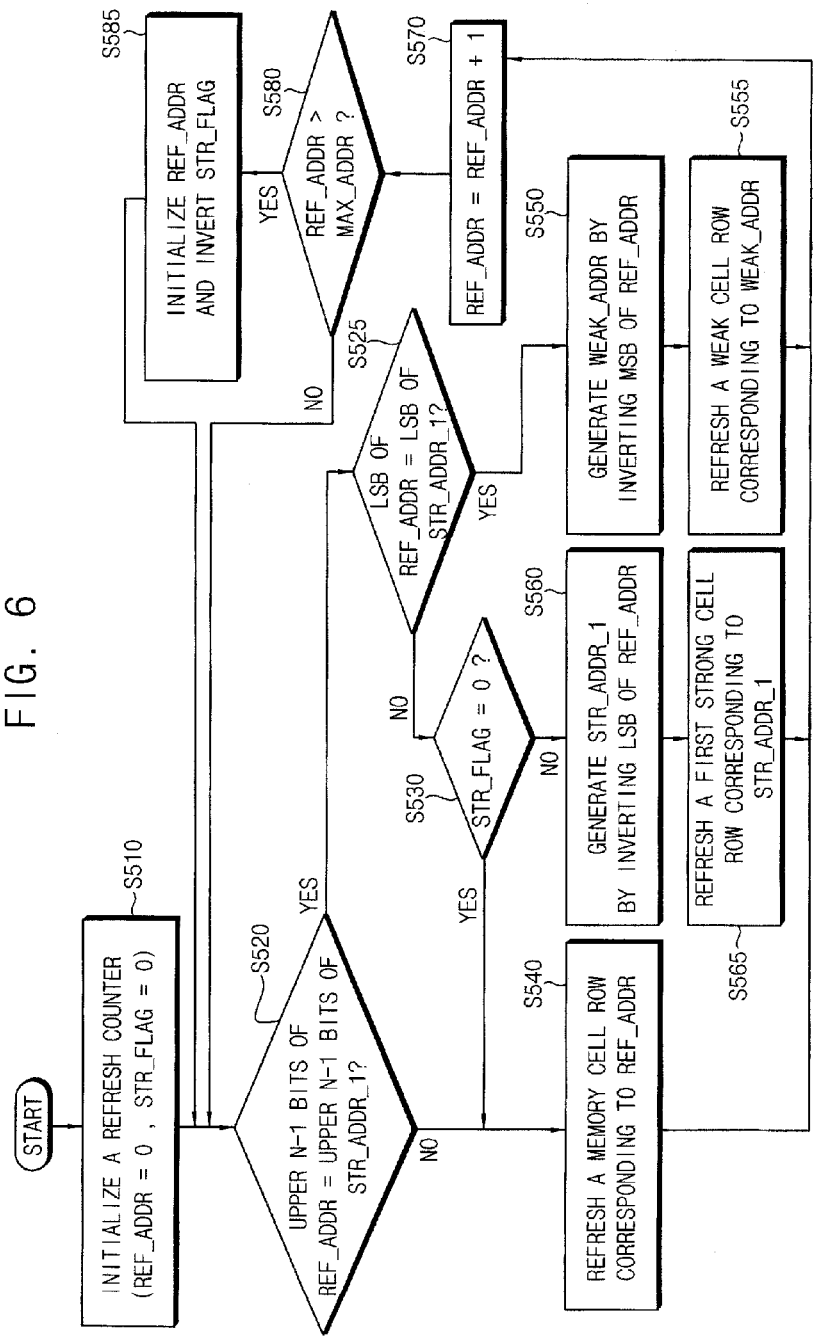
FIG. 6 is a flow chart of steps for refreshing a volatile memory device with refresh leveraging, according to an example embodiment of the present invention.

FIG. 6 is a flow chart of steps for a method of refreshing a volatile memory device with refresh leveraging according to an example embodiment of the present invention. In FIG. 6 when a memory cell row is determined as a weak cell row, a first strong cell row address STR_ADDR_1 is determined by inverting a most significant bit (MSB) of a weak cell row address WEAK_ADDR for the weak cell row. In addition, a second strong cell row address STR_ADDR_2 is determined by inverting a least significant bit (LSB) of the first strong cell row address STR_ADDR_1.

Referring to FIG. 6, when a refresh operation is initiated, a refresh counter is initialized (S510) such as to "0" for example. In that case, the strong cell flag STR_FLAG is initialized to a logic low level. The refresh row address REF_ADDR has N bits with N being an integer greater than 1, according to an example embodiment of the present invention.

In that case, upper N−1 bits of the refresh row address REF_ADDR is compared with upper N−1 bits of the first strong cell row address STR_ADDR_1 (S520). If the upper N−1 bits of the refresh row address REF_ADDR do not match the upper N−1 bits of the first strong cell row address STR_ADDR_1 (S520: NO), a memory cell row corresponding to the initial refresh row address REF_ADDR is refreshed (S540), and thereafter the refresh counter increments the refresh row address REF_ADDR by 1 (S570).

If the upper N−1 bits of the refresh row address REF_ADDR match the upper N−1 bits of the first strong cell row address STR_ADDR_1 (S520: YES), a LSB of the refresh row address REF_ADDR is compared with a LSB of the first strong cell row address STR_ADDR_1 (S525). Such comparisons (S520) and (S525) may be performed substantially at the same time in an example embodiment of the present invention.

If the N-bits of the initial refresh row address REF_ADDR match the N-bits of the first strong cell row address STR_ADDR_1 (S520: YES, S525: YES), the weak cell row address WEAK_ADDR is generated as the final refresh row address CREF_ADDR by inverting the MSB of the initial refresh row address REF_ADDR (S550). In that case, the weak cell row having the weak cell row address WEAK_ADDR is refreshed (S555), and thereafter the refresh counter increments the refresh row address REF_ADDR by 1 (S570).

If the upper N−1 bits of the refresh row address REF_ADDR match the upper N−1 bits of the first strong cell row address STR_ADDR_1 (S520: YES), and the LSB of the refresh row address REF_ADDR does not match the LSB of the first strong cell row address STR_ADDR_1 (S525: NO), the refresh row address REF_ADDR matches the second strong cell row address STR_ADDR_2. In that case, one of the first and second strong cell rows having the first or second strong cell row addresses STR_ADDR_1 or STR_ADDR_2 is selectively refreshed according to the strong cell flag STR_FLAG.

For example, when the refresh row address REF_ADDR matches the second strong cell row address STR_ADDR_2 (S520: YES, S525: NO), a logic level of the strong cell flag STR_FLAG is checked (S530). If the strong cell flag STR_FLAG has a first logic level (e.g., a logic low level) (S530: YES), the second strong cell row corresponding to the refresh row address REF_ADDR (i.e., the second strong cell row address STR_ADDR_2) is refreshed (S540). Thereafter, the refresh counter increments the refresh row address REF_ADDR by 1 (S570).

After each increment of the refresh row address REF_ADDR (S570), the refresh row address REF_ADDR is compared with a maximum row address MAX_ADDR that is the maximum value of row addresses for memory cell rows included in a memory cell array. When the refresh row address REF_ADDR exceeds the maximum row address MAX_ADDR (S580: YES), the refresh row address REF_ADDR is initialized again, and the strong cell flag STR_FLAG is inverted (S585) such that the memory cell rows of the memory cell array are sequentially refreshed again. In this manner, the strong cell flag STR_FLAG is inverted every refresh period RP.

If the refresh row address REF_ADDR matches the second strong cell row address STR_ADDR_2 (S520: YES, S525: NO), and the strong cell flag STR_FLAG has a second logic level (e.g., a logic high level) (S530: NO), the first strong cell row address STR_ADDR_1 is generated by inverting the LSB of the refresh row address REF_ADDR (S560). Accordingly, the first strong cell row having the first strong cell row address STR_ADDR_1 (S565) is refreshed. Thereafter, the refresh row address REF_ADDR is incremented by 1 each time one of memory cell rows is refreshed (S570).

Such steps of the refresh operation are repeated until the volatile memory device is turned off. As illustrated in FIG. 2, most memory cell rows have minimum retention times longer than or equal to double the refresh period RP. Thus, if a memory cell row is determined as a weak cell row, a first memory cell row having a row address determined by inverting the MSB of a row address of the weak cell row would have, with high probability, a minimum retention time longer than or equal to double the refresh period RP such that this first memory cell row may be used as a strong cell row.

Furthermore, a second memory cell row having a row address determined by inverting the LSB of the row address of the first memory cell row would have, with high probability, a minimum retention time longer than or equal to about double the refresh period RP such that this second memory cell row may be used as another strong cell row. In this manner, the weak cell row is refreshed instead of the first strong cell row when the first strong cell row address STR_ADDR_1 is generated. Accordingly, a refresh period of the weak cell row is decreased without increasing the refresh current and the refresh power consumption.

Figure 7:
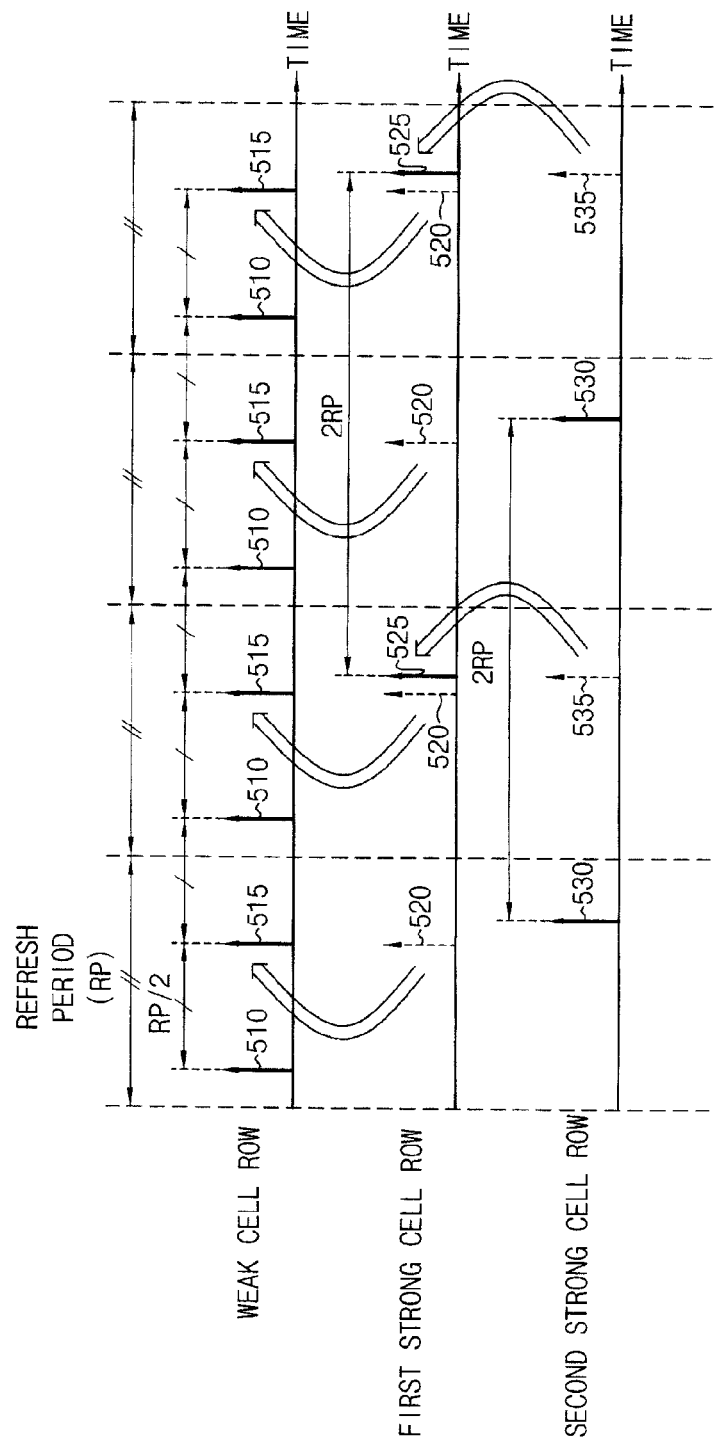
FIG. 7 is a timing diagram of example refreshes of a weak cell row and first and second strong cell rows performed according to FIG. 6, in an example embodiment of the present invention.

FIG. 7 is a timing diagram of example refreshes of a weak cell row, a first strong cell row, and a second strong cell row performed according to the refresh method of FIG. 6. Referring to FIG. 7, the weak cell row is refreshed with a first period (RP/2) that is half a refresh period RP. For example, a refresh 510 for the weak cell row is performed when the row address for the weak cell row is generated, and a further refresh 515 for the weak cell row is performed instead of for the first strong cell row when the row address for the first strong cell row is generated. Thus, the weak cell row is refreshed twice each refresh period RP.

Each of the first and second strong cell rows is refreshed with a second period (2RP) that is double the refresh period RP. The first and second strong cell rows are alternately refreshed each refresh period RP. For example, a refresh 530 for the second strong cell row is performed in each odd-numbered refresh period, and a refresh 525 for the first strong cell row is performed in each even-numbered refresh period such that each of the first and second strong cell rows is refreshed once every two refresh periods RP.

Figure 8:
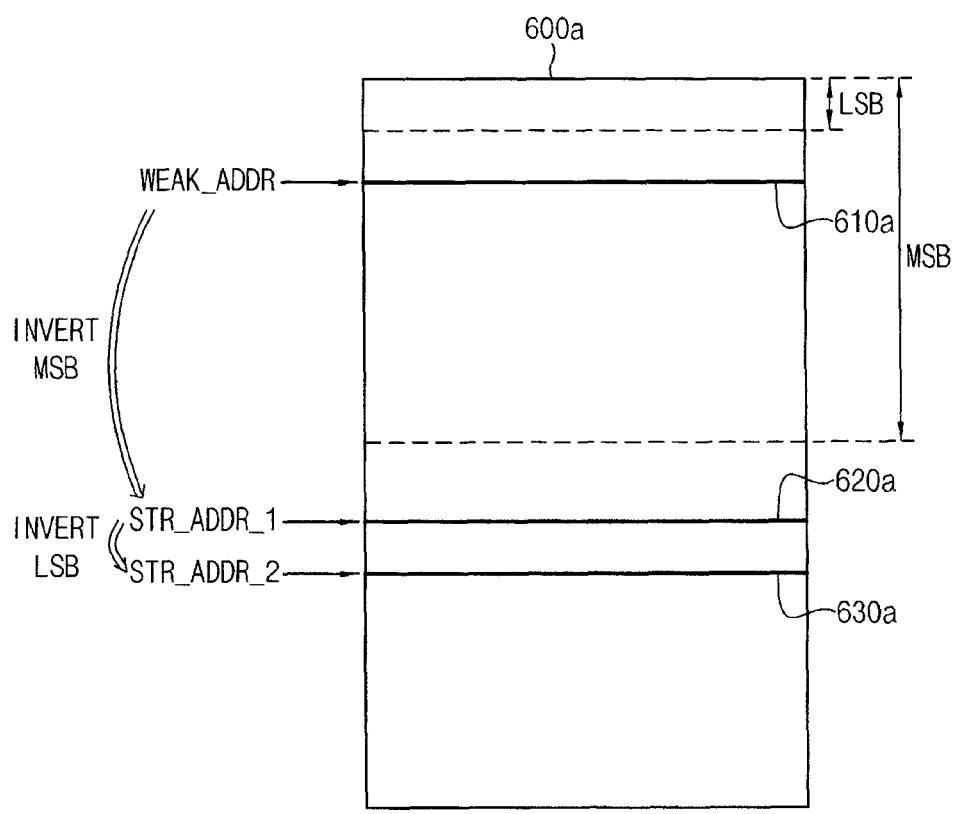
FIG. 8 shows an example memory cell array with a weak cell row and first and second strong cell rows, according to an example embodiment of the present invention.

FIG. 8 shows an example memory cell array with a weak cell row and first and second strong cell rows, according to an example embodiment of the present invention. FIG. 8 shows one bank array 600a of the memory cell array. In FIG. 8, the MSB of a row address defines an upper portion and a lower portion of the bank array 600a, and the LSB of the row address defines two adjacent memory cell rows.

Referring to FIG. 8, after the weak cell row address WEAK_ADDR for the weak cell row 610a is determined from testing of the memory cell array, the first strong cell row address STR_ADDR_1 is determined by inverting the MSB of the weak cell row address WEAK_ADDR. Thus, the memory cell row 620a corresponding to the first strong cell row address STR_ADDR_1 is determined as a first strong cell row. The second strong cell row address STR_ADDR_2 is determined by inverting the LSB of the first strong cell row address STR_ADDR_1. Thus, the memory cell row 630a corresponding to the second strong cell row address STR_ADDR_2 is determined as a second strong cell row.

As illustrated in FIG. 2, most memory cell rows have minimum retention times longer than or equal to double the refresh period RP. Accordingly, although the first and second strong cell row addresses STR_ADDR_1 and STR_ADDR_2 are determined without testing of the memory cell rows, the memory cell rows 620a and 630a would have, with high probability, minimum retention times longer than or equal to double the refresh period RP.

Figure 9:
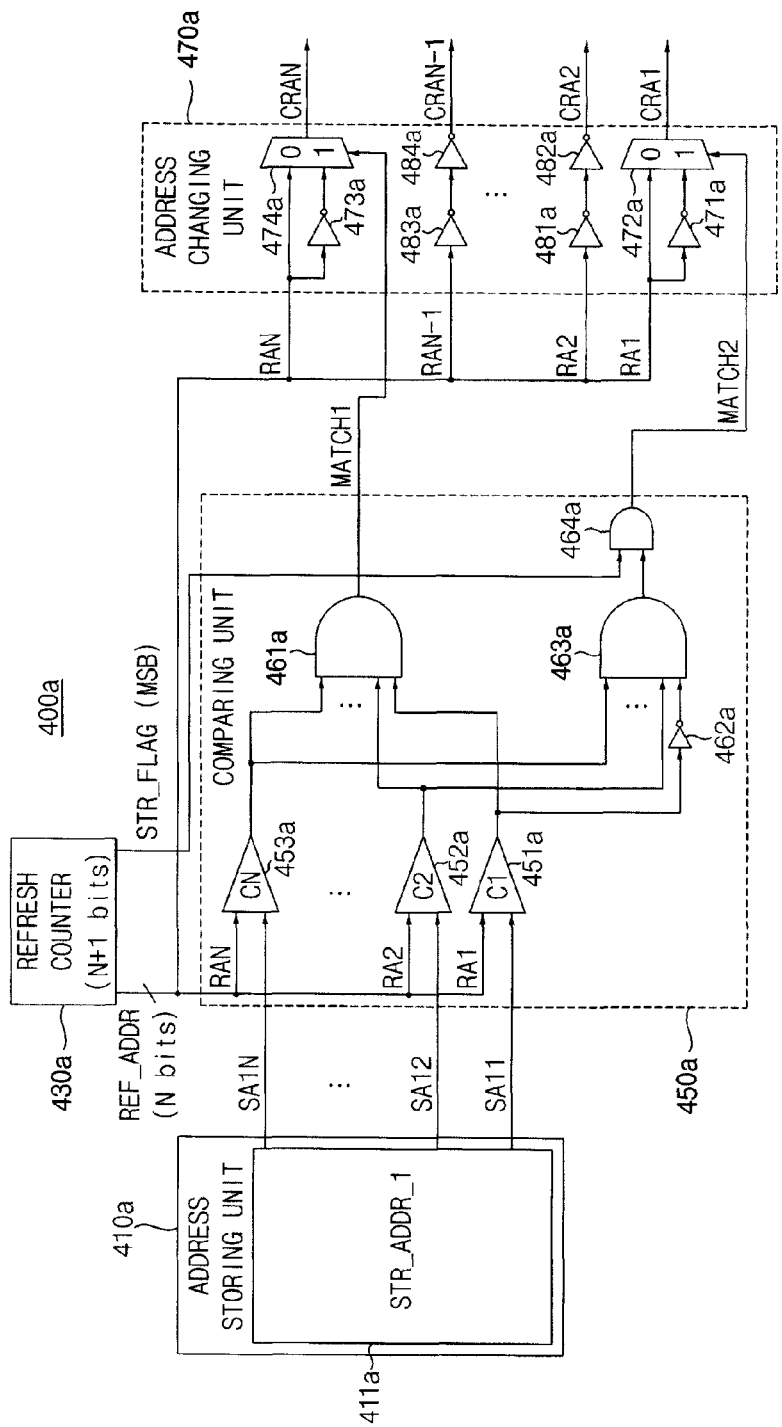
FIG. 9 is a block diagram of a refresh address generator for performing the refresh method of FIG. 6, according to an example embodiment of the present invention.

FIG. 9 is a block diagram of a refresh address generator 400a for performing the refresh method of FIG. 6, according to an example embodiment of the present invention. The refresh address generator 400a includes an address storing unit 410a, a refresh counter 430a, a comparing unit 450a, and an address changing unit 470a. The address storing unit 410a includes a first storing region 411a that stores a first strong cell row address STR_ADDR_1. Alternatively, the address storing unit 410a stores a weak cell row address WEAK_ADDR or a second strong cell row address STR_ADDR_2 instead of the first strong cell row address STR_ADDR_1.

The address storing unit 410a provides N-bits SA11, SA12 and SA1N of the first strong cell row address STR_ADDR_1 to the comparing unit 450a. The address storing unit 410a is implemented with an electrically programmable fuse memory, a laser-programmable fuse memory, an anti-fuse memory, a one-time programmable memory, a flash memory, or other types of nonvolatile memories, in an example embodiment of the present invention. Although FIG. 9 illustrates the address storing unit 410a storing one first strong cell row address STR_ADDR_1 related to one weak cell row address WEAK_ADDR, the address storing unit 410a may store more first strong cell row addresses related to more weak cell row addresses.

The refresh counter 430a generates an initial refresh row address REF_ADDR and a strong cell flag STR_FLAG by counting. The refresh counter 430a is an N+1 bit counter in an example embodiment of the present invention. In this case, the N+1-th bit (i.e., the MSB) from the counter 430a is the strong cell flag STR_FLAG, and the lower N bits from the counter 430a form the initial refresh row address REF_ADDR.

The comparing unit 450a compares the refresh row address REF_ADDR from the refresh counter 430a and the first strong cell row address STR_ADDR_1 from the address storing unit 410a to generate a first match signal MATCH1 from such a comparison. The comparing unit 450a generates a second match signal MATCH2 from comparing the refresh row address REF_ADDR with the second strong cell row address STR_ADDR_2 and from the strong cell flag STR_FLAG.

The first match signal MATCH1 is generated with a logic high level when the refresh row address REF_ADDR matches the first strong cell row address STR_ADDR_1. The second match signal MATCH2 is generated with a logic high level when the refresh row address REF_ADDR matches the second strong cell row address STR_ADDR_2 and the strong cell flag STR_FLAG is at a logic high level.

The comparing unit 450a includes a plurality of comparators 451a, 452a, and 453a and a plurality of logic gates 461a, 462a, 463a, and 464a. A respective comparator compares a respective bit of the refresh row address REF_ADDR with a respective bit of the first strong cell row address STR_ADDR_1. For example, a first comparator 451a compares a first bit RA1 (i.e., the LSB) of the refresh row address REF_ADDR with the first bit SA11 (i.e., the LSB) of the first strong cell row address STR_ADDR_1. A second comparator 452a compares a second bit RA2 of the refresh row address REF_ADDR with the second bit SA12 of the first strong cell row address STR_ADDR_1. An N-th comparator 453a compares an N-th bit RAN (i.e., the MSB) of the refresh row address REF_ADDR with the N-th bit SA1N (i.e., the MSB) of the first strong cell row address STR_ADDR_1.

The first AND gate 461a generates the first match signal MATCH1 by performing an AND operation on output signals of the first through N-th comparators 451a, 452a, and 453a. When the N-bits RA1, RA2, and RAN of the refresh row address REF_ADDR respectively match the N-bits SA11, SA12, and SA1N of the first strong cell row address STR_ADDR_1, the first AND gate 461a generates the first match signal MATCH1 with a logic high level.

An inverter 462a inverts an output signal of the first comparator 451a. The second AND gate 463a performs an AND operation on an output signal of the inverter 462a and the outputs signals of the second through N-th comparators 452a and 453a. When the first bit RA1 of the refresh row address REF_ADDR does not match the first bit SA11 of the first strong cell row address STR_ADDR_1, and the second through N-th bits RA2 and RAN of the refresh row address REF_ADDR match the second through N-th bits SA12 and SA1N of the first strong cell row address STR_ADDR_1, the second AND gate 463a generates an output signal with a logic high level.

That is, when the refresh row address REF_ADDR matches a row address of which only the LSB is different from the first strong cell row address STR_ADDR_1 (i.e., when the refresh row address REF_ADDR matches the second strong cell row address STR_ADDR_2), the second AND gate 463a generates the output signal with a logic high level. The third AND gate 464a generates the second match signal MATCH2 by performing an AND operation on the strong cell flag STR_FLAG and the output signal of the second AND gate 463a. When the refresh row address REF_ADDR matches the second strong cell row address STR_ADDR_2 and the strong cell flag STR_FLAG is at the logic high level, the third AND gate 464a generates the second match signal MATCH2 with a logic high level.

FIG. 9 illustrates the comparing unit 450a having one set of the comparators 451a, 452a, and 453a and the logic gates 461a, 462a, 463a, and 464a for one weak cell row address WEAK_ADDR. However, the present invention may also be practiced with the comparing unit 450a having more sets of comparators and logic gates corresponding to more weak cell row addresses.

The address changing unit 470a receives the initial refresh row address REF_ADDR from the refresh counter 430a and the first and second match signals MATCH1 and MATCH2 from the comparing unit 450a. When the first and second match signals MATCH1 and MATCH2 each have a logic low level, the address changing unit 470a outputs the initial refresh row address REF_ADDR as the final refresh row address CREF_ADDR.

When the first match signal MATCH1 is at a logic high level, the address changing unit 470a outputs the weak cell row address WEAK_ADDR as the final refresh row address CREF_ADDR instead of the initial refresh row address REF_ADDR. When the second match signal MATCH2 is at a logic high level, the address changing unit 470a outputs the first strong cell row address STR_ADDR_1 as the final refresh row address CREF_ADDR instead of the initial refresh row address REF_ADDR.

The address changing unit 470a includes a first inverter 471a and a first multiplexer 472a for generating the first bit CRA1 of the final refresh row address CREF_ADDR from the first bit RA1 of the refresh row address REF_ADDR and the second match signal MATCH2. The address changing unit 470a includes a second inverter 473a and a second multiplexer 474a for generating the N-th bit CRAN of the final refresh row address CREF_ADDR from the N-th bit RAN of the refresh row address REF_ADDR and the first match signal MATCH1.

The second inverter 473a inverts the N-th bit RAN of the refresh row address REF_ADDR. The second multiplexer 474a selectively outputs the N-th bit RAN or an inversion thereof as the N-th bit CRAN of the final refresh row address CREF_ADDR in response to the first match signal MATCH1. For example when the first match signal MATCH1 is at a logic high level, the refresh changing unit 470a generates the weak cell row address WEAK_ADDR as the final refresh row address CREF_ADDR by inverting the N-th bit RAN (i.e., the MSB) of the initial refresh row address REF_ADDR.

The first inverter 471a inverts the first bit RA1 of the refresh row address REF_ADDR. The first multiplexer 472a selectively outputs the first bit RA1 or an inversion thereof as the first bit CRA1 of the final refresh row address CREF_ADDR in response to the second match signal MATCH2. For example when the second match signal MATCH2 is at a logic high level, the refresh changing unit 470a generates the first strong cell row address STR_ADDR_1 as the final refresh row address CREF_ADDR by inverting the first bit RA1 (i.e., the LSB) of the initial refresh row address REF_ADDR.

The address changing unit 470a further includes a plurality of inverters 481a, 482a, 483a, and 484a for generating the second through N−1-th bits (CRA2 through CRAN−1) of the final refresh row address CREF_ADDR by delaying the second through N−1-th bits (RA2 through RAN−1) of the initial refresh row address REF_ADDR.

In this manner, the refresh address generator 400a outputs the weak cell row address WEAK_ADDR when the refresh counter 430a generates the first strong cell row address STR_ADDR_1. In addition, the refresh address generator 400a alternately outputs one of the first and second strong cell row addresses STR_ADDR_1 and STR_ADDR_2 each refresh period RP when the refresh counter 430a generates the second strong cell row address STR_ADDR_2. Thus, a weak cell row is refreshed instead of a first strong cell row to decrease a refresh period of the weak cell row without increasing the refresh current and the refresh power consumption.

Furthermore, the first and second strong cell row addresses STR_ADDR_1 and STR_ADDR_2 are determined from predetermined bit relationships with the weak cell row address WEAK_ADDR. For example, the first strong cell row address STR_ADDR_1 is determined by inverting the MSB of the weak cell row address WEAK_ADDR, and the second strong cell row address STR_ADDR_2 is determined by inverting the LSB of the first strong cell row address STR_ADDR_1. Thus, the refresh address generator 400a may be reduced in size and complexity according to this aspect of the present invention.

Figure 10:
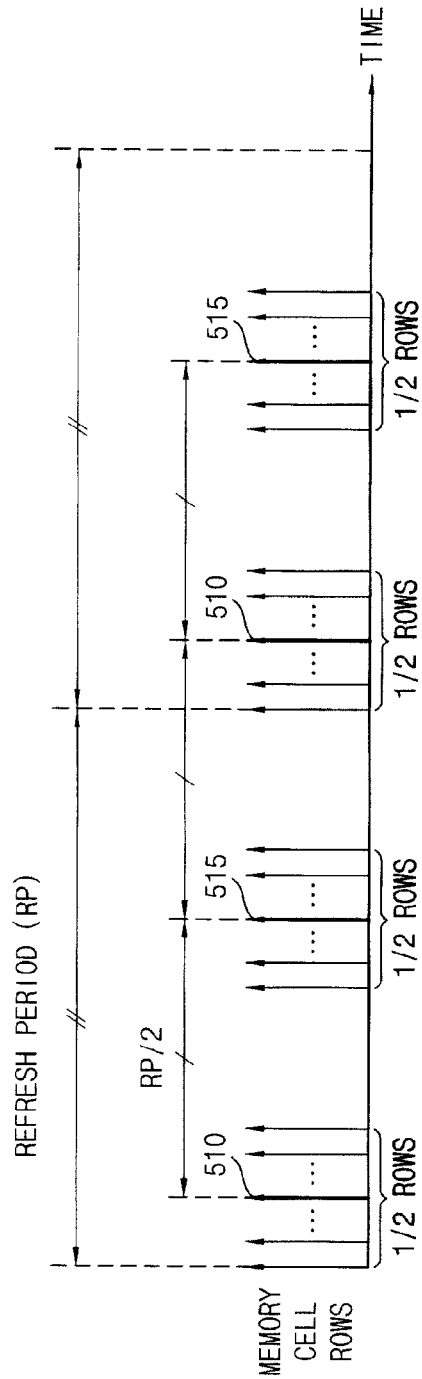
FIG. 10 is a timing diagram of example refreshes performed in a burst mode, according to an example embodiment of the present invention.

FIG. 10 is a timing diagram of example refreshes performed in a burst refresh mode, according to an example embodiment of the present invention. For example, a first half of memory cell rows in a memory cell array are consecutively refreshed in half a refresh period RP, and a second half of the memory cell rows are consecutively refreshed in half a refresh period RP after the first half of the memory cell rows are refreshed. In this case, a first refresh 510 for a weak cell row is performed when the first half of the memory cell rows are refreshed, and a second refresh 515 for the weak cell row is performed when the second half of the memory cell rows are refreshed. Accordingly even in a burst refresh mode, the weak cell row is refreshed with a period (RP/2) that is half the refresh period RP.

Figure 11:
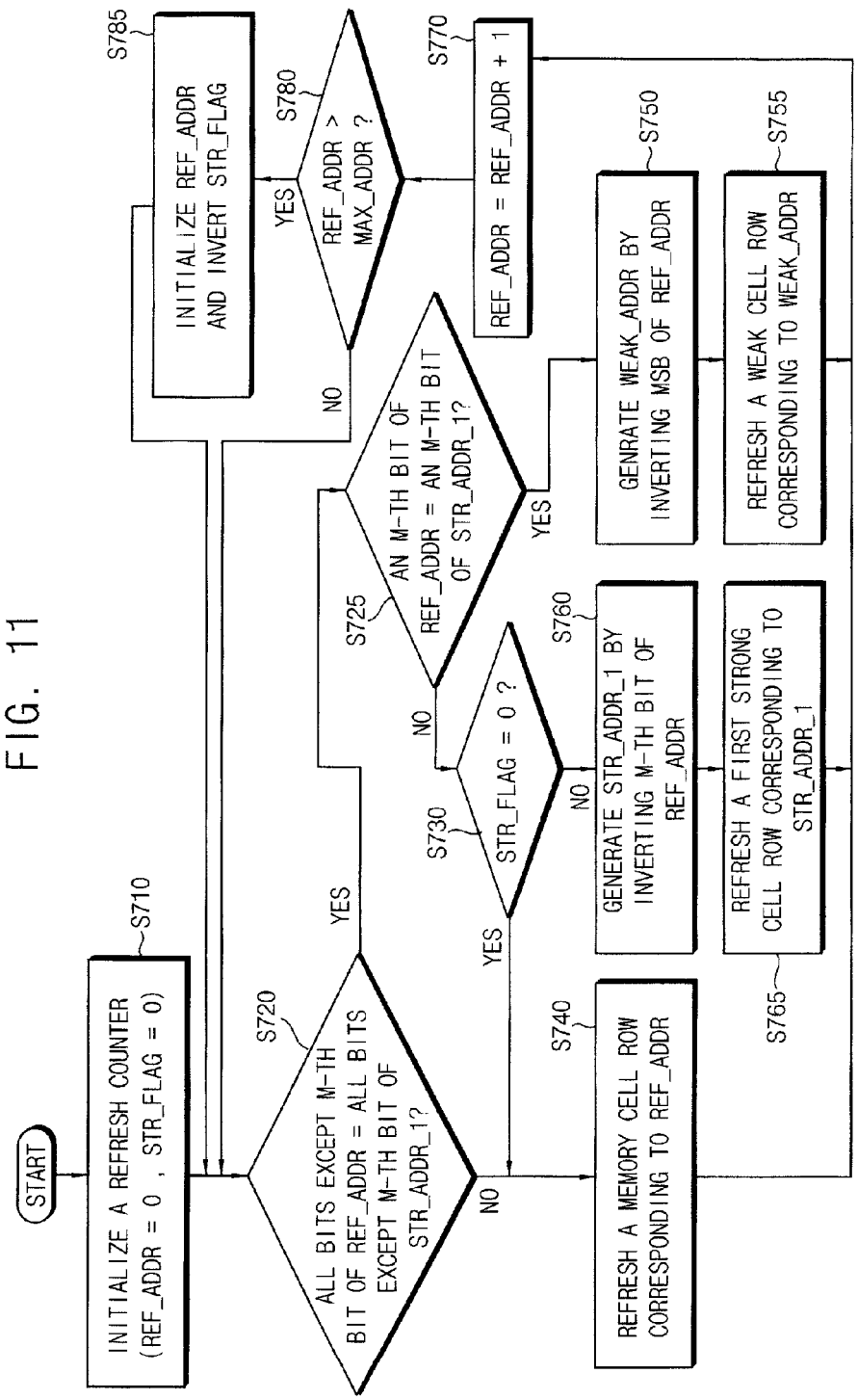
FIG. 11 is a flow chart of steps for refreshing a volatile memory device with refresh leveraging according to another example embodiment of the present invention.

FIG. 11 is a flow chart of steps for refreshing a volatile memory device with refresh leveraging according to another example embodiment of the present invention. In FIG. 11, a first strong cell row address STR_ADDR_1 is determined by inverting a most significant bit (MSB) of a weak cell row address WEAK_ADDR. In addition, a second strong cell row address STR_ADDR_2 is determined by inverting an M-th bit of the first strong cell row address STR_ADDR_1, where M is an integer greater than 0 and less than N.

The refresh method of FIG. 11 is substantially similar to the refresh method of FIG. 6 except that the second strong cell row address STR_ADDR_2 is determined by inverting the M-th bit of the first strong cell row address STR_ADDR_1. Referring to FIG. 11 when a refresh operation is initiated, the refresh counter is initialized (S710) to "0", and a strong cell flag STR_FLAG is also initialized into a logic low level, in an example embodiment of the present invention.

All bits except M-th bits of the refresh row address REF_ADDR and the first strong cell row address STR_ADDR_1 are compared (S720). In addition, the M-th bits of the refresh row address REF_ADDR and the first strong cell row address STR_ADDR_1 are compared (S725). In an example embodiment of the present invention, such comparisons (S720) and (S725) may be performed substantially at the same time.

If all bits except the M-th bits of the refresh row address REF_ADDR and the first strong cell row address STR_ADDR_1 do not match (S720: NO), a memory cell row corresponding to the initial refresh row address REF_ADDR is refreshed (S740). If all bits of the refresh row address REF_ADDR and the first strong cell row address STR_ADDR_1 match (S720: YES) and (S725: YES), the weak cell row address WEAK_ADDR is generated as the final refresh row address by inverting the MSB of the initial refresh row address REF_ADDR (S750). In that case, the weak cell row having the weak cell row address WEAK_ADDR is refreshed (S755).

If the refresh row address REF_ADDR matches the second strong cell row address STR_ADDR_2 (S720: YES) and (S725: NO), one of first and second strong cell rows corresponding to the first and second strong cell row addresses STR_ADDR_1 and STR_ADDR_2 is selectively refreshed according to the strong cell flag STR_FLAG. If the strong cell flag STR_FLAG is at a logic low level (S730: YES), the second strong cell row corresponding to the initial refresh row address REF_ADDR (i.e., the second strong cell row address STR_ADDR_2) is refreshed (S740).

The refresh row address REF_ADDR is incremented by 1 each time one of memory cell rows is refreshed (S770). If the refresh row address REF_ADDR exceeds the maximum row address MAX_ADDR (S780: YES), the refresh row address REF_ADDR is initialized again, and the strong cell flag STR_FLAG is inverted (S785). That is, the strong cell flag STR_FLAG is inverted every refresh period RP.

If the refresh row address REF_ADDR matches the second strong cell row address STR_ADDR_2 (S720: YES, S725: NO), and the strong cell flag STR_FLAG is at a logic high level (S730: NO), the first strong cell row address STR_ADDR_1 is generated as the final refresh row address CREF_ADDR by inverting the M-th bit of the initial refresh row address REF_ADDR (S760). In this case, the first strong cell row having the first strong cell row address STR_ADDR_1 is refreshed (S765).

In this manner, when the first strong cell row address STR_ADDR_1 is generated by the refresh counter, the weak cell row is refreshed instead of the first strong cell row. Accordingly, a refresh period of the weak cell row is decreased without increasing the refresh current and the refresh power consumption.

Figure 12:
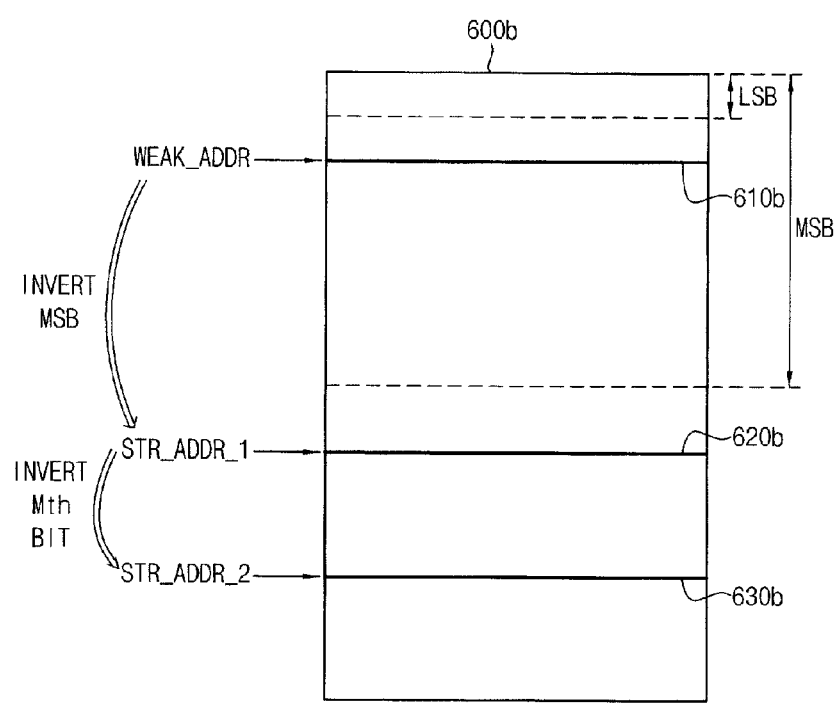
FIG. 12 is another example memory cell array with a weak cell row and first and second strong cell rows, according to an example embodiment of the present invention.

FIG. 12 illustrates an example of first and second strong cell rows selected for a weak cell row in one bank array 600b of a memory cell array according to the steps of FIG. 11. Referring to FIG. 12, a weak cell row address WEAK_ADDR for a weak cell row 610b is determined from testing of the memory cell array. A first strong cell row address STR_ADDR_1 of a first strong memory cell row 620b for the weak cell row 610b is determined by inverting a MSB of the weak cell row address WEAK_ADDR. A second strong cell row address STR_ADDR_2 of a second memory cell row 630b for the weak cell row 610b is determined by inverting an M-th bit of the first strong cell row address STR_ADDR_1.

Figure 13:
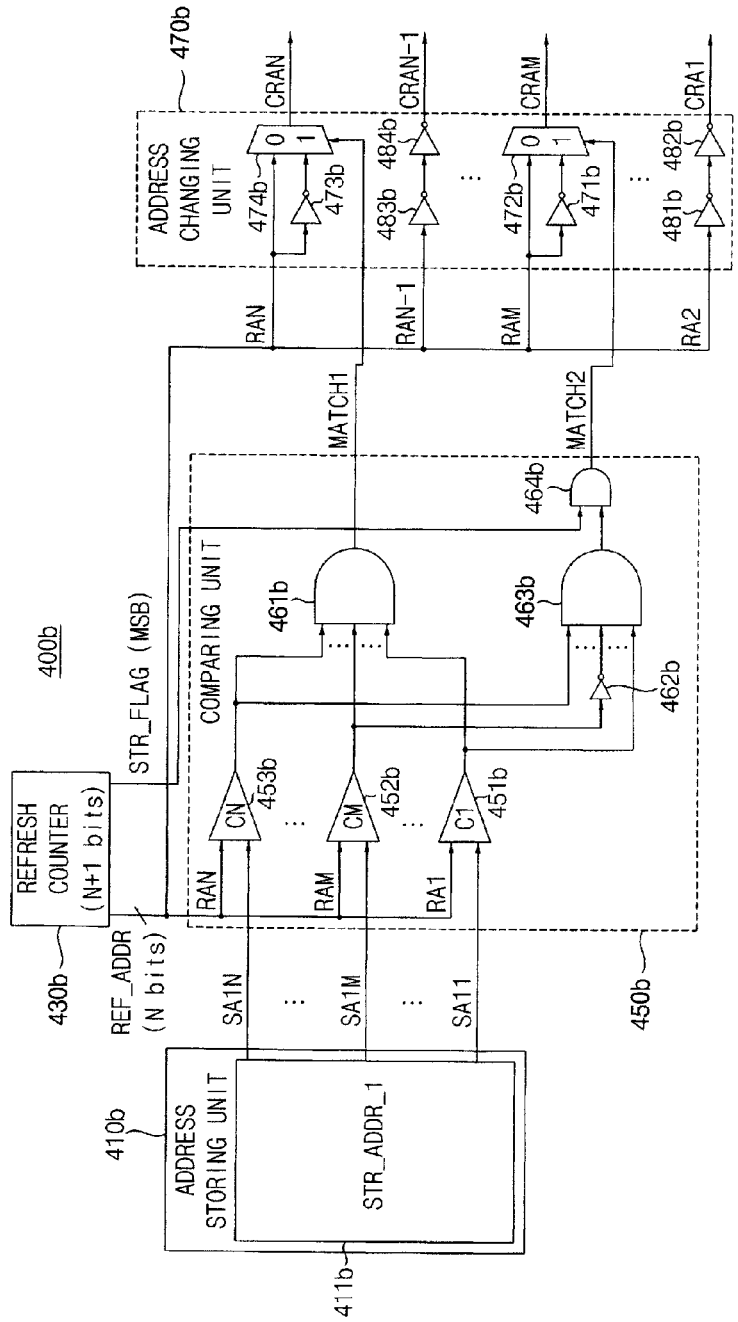
FIG. 13 is a block diagram of a refresh address generator for performing the refresh method of FIG. 11, according to an example embodiment of the present invention.

FIG. 13 is a block diagram of a refresh address generator 400b for performing the refresh method of FIG. 11, according to an example embodiment of the present invention. Referring to FIG. 13, the refresh address generator 400b includes an address storing unit 410b, a refresh counter 430b, a comparing unit 450b, and an address changing unit 470b. The refresh address generator 400b of FIG. 13 is substantially similar to the refresh address generator 400a of FIG. 9 except that the first strong cell row address STR_ADDR_1 is generated by inverting an M-th bit of the second strong cell row address STR_ADDR_2 in FIG. 13.

The address storing unit 410b includes a first storing region 411b for storing the first strong cell row address STR_ADDR_1. The refresh counter 430b generates a refresh row address REF_ADDR and a strong cell flag STR_FLAG by counting. The address storing unit 410b of FIG. 13 stores one first strong cell row address STR_ADDR_1 related to one weak cell row address WEAK_ADDR. However, the present invention may also be practiced with the address storing unit 410b storing more first strong cell row addresses related to more weak cell row addresses.

The comparing unit 450b generates a first match signal MATCH1 by comparing the refresh row address REF_ADDR with the first strong cell row address STR_ADDR_1. The comparing unit 450b also generates a second match signal MATCH2 based on the strong cell flag STR_FLAG and from comparing the refresh row address REF_ADDR with the second strong cell row address STR_ADDR_2. The comparing unit 450b includes a plurality of comparators 451b, 452b, and 453b and a plurality of logic gates 461b, 462b, 463b, and 464b.

FIG. 13 shows the comparing unit 450b with a set of the comparators 451b, 452b, and 453b and the logic gates 461b, 462b, 463b, and 464b for comparing the refresh row address REF_ADDR with the first and second strong cell row addresses STR_ADDR_1 and STR_ADDR_2. However, the present invention may also be practiced with the comparing unit 450b including more sets of comparators and logic gates for comparing the refresh row address REF_ADDR with respective first and second strong cell row addresses for more weak cell row addresses.

When the first match signal MATCH1 is at a logic high level, the address changing unit 470b outputs the weak cell row address WEAK_ADDR as the final refresh row address CREF_ADDR by inverting an N-th bit RAN of the initial refresh row address REF_ADDR. When the second match signal MATCH2 is at a logic high level, the address changing unit 470b outputs the first strong cell row address STR_ADDR_1 as the final refresh row address CREF_ADDR by inverting an M-th bit RAM of the initial refresh row address REF_ADDR.

The address changing unit 470b includes a first inverter 471b and a first multiplexer 472b for changing the M-th bit RAM of the initial refresh row address REF_ADDR. The address changing unit 470b also includes a second inverter 473b and a second multiplexer 474b for changing the N-th bit RAN of the initial refresh row address REF_ADDR. The address changing unit 470b further includes a plurality of inverters 481b, 482b, 483b, and 484b for outputting the remaining bits CRA1 and CRAN−1 of the final refresh row address CREF_ADDR by delaying corresponding bits RA1 and RAN−1 of the initial refresh row address REF_ADDR.

In this manner, the refresh address generator 400b outputs the weak cell row address WEAK_ADDR when the refresh counter 430b generates the first strong cell row address STR_ADDR_1. In addition, the refresh address generator 400b alternately outputs the first and second strong cell row addresses STR_ADDR_1 and STR_ADDR_2 each refresh period RP when the refresh counter 430b generates the second strong cell row address STR_ADDR_2. Therefore, the weak cell row is refreshed instead of the first strong cell row each refresh period RP for decreasing a refresh period of the weak cell row without increasing the refresh current and the refresh power consumption.

Figure 14:
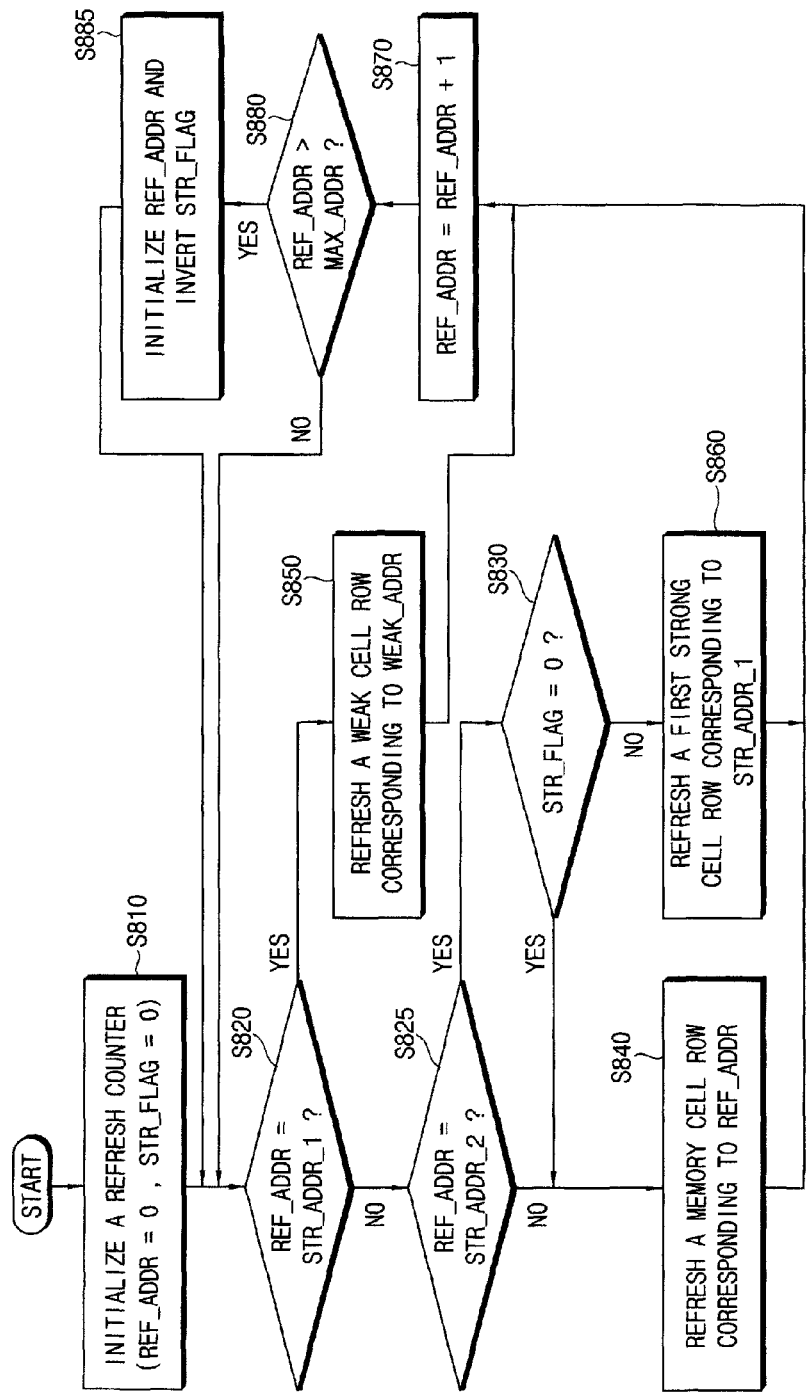
FIG. 14 is a flow chart of steps for refreshing a volatile memory device with refresh leveraging, according to another example embodiment of the present invention.

FIG. 14 is a flow chart of steps for refreshing a volatile memory device with refresh leveraging, according to another example embodiment of the present invention. In FIG. 14, a weak cell row address WEAK_ADDR is determined according to a minimum retention time of a corresponding memory cell row, and any two other row addresses of the memory cell array are determined as first and second strong cell row addresses STR_ADDR_1 and STR_ADDR_2.

In FIG. 14 when a refresh operation is initiated, a refresh counter is initialized (S810) to "0" for example, and a strong cell flag STR_FLAG is initialized to a logic low level. The refresh row address REF_ADDR is compared with the first strong cell row address STR_ADDR_1 (S820) and with the second strong cell row address STR_ADDR_2 (S825). The refresh row address REF_ADDR may be compared with the first and second strong cell row addresses STR_ADDR_1 and STR_ADDR_2 (S820) and (S825) substantially at the same time.

If the refresh row address REF_ADDR does not match the first and second strong cell row addresses STR_ADDR_1 and STR_ADDR_2 (S820: NO) and (S825: NO), a memory cell row corresponding to the refresh row address REF_ADDR is refreshed (S840). If the refresh row address REF_ADDR matches the first strong cell row address STR_ADDR_1 (S820: YES), a weak cell row corresponding to the weak cell row address WEAK_ADDR is refreshed (S850).

If the refresh row address REF_ADDR matches the second strong cell row address STR_ADDR_2 (S825: YES), one of the first and second strong cell rows corresponding to the first and second strong cell row addresses STR_ADDR_1 and STR_ADDR_2 is selectively refreshed according to the strong cell flag STR_FLAG. For example in that case, if the strong cell flag STR_FLAG is at a logic low level (S830: YES), the second strong cell row is refreshed (S840). If the refresh row address REF_ADDR matches the second strong cell row address STR_ADDR_2 (S825: YES) and the strong cell flag STR_FLAG is at a logic high level (S830: NO), the first strong cell row corresponding to the first strong cell row address STR_ADDR_1 is refreshed (S865).

The refresh row address REF_ADDR is incremented by 1 each time a memory cell row is refreshed (S870). If the refresh row address REF_ADDR exceeds the maximum row address MAX_ADDR (S880: YES), the refresh row address REF_ADDR is initialized, and the strong cell flag STR_FLAG is inverted (S885) such as every refresh period RP for example.

In this manner, the weak cell row is refreshed instead of the first strong cell row when the first strong cell row address STR_ADDR_1 is generated. Accordingly, a refresh period of the weak cell row is decreased without increasing the refresh current and the refresh power consumption.

Figure 15:
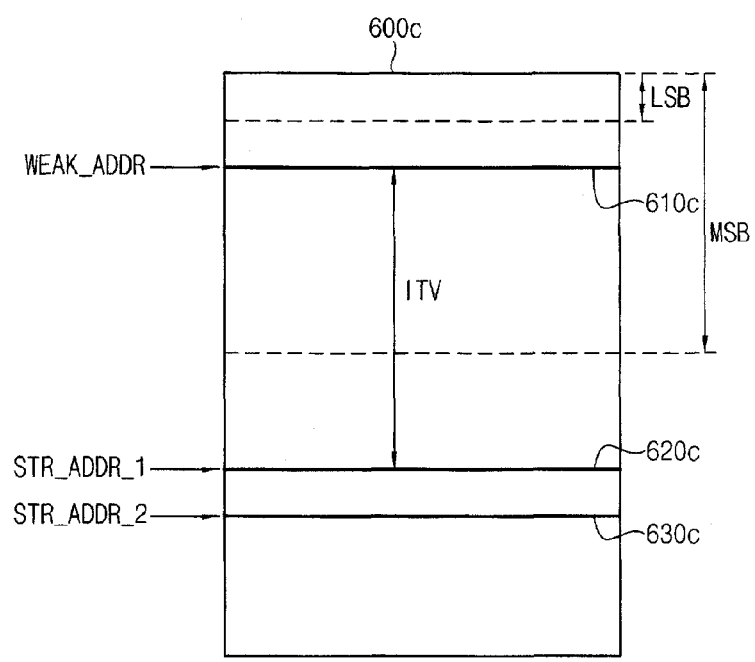
FIG. 15 is another example memory cell array with a weak cell row and first and second strong cell rows, according to an example embodiment of the present invention.

FIG. 15 is another example bank array 600c of a memory cell array with a weak cell row and first and second strong cell rows, according to another example embodiment of the present invention. Referring to FIG. 15, a weak cell row address WEAK_ADDR for a weak cell row 610c is determined from testing of the memory cell array. A first strong cell row address STR_ADDR_1 is selected to be spaced apart from the weak cell row 610c by at least a predetermined interval ITV.

The predetermined interval ITV is determined according to a minimum retention time of the weak cell row 610c. For example, if the bank array 600c includes X memory cell rows and the minimum retention time of the weak cell row 610c is three quarters of a refresh period RP, the first strong cell row address STR_ADDR_1 and the weak cell row 610c have an interval corresponding to counting through at least X/4 memory cell rows.

In this case, if the first strong cell row 620c is spaced apart from the weak cell row 610c by X/3 memory cell rows, the weak cell row 610c is refreshed with time intervals of one-third and two-thirds of the refresh period RP. That is, the maximum time interval between two adjacent refreshes for the weak cell row 610c is two-thirds of the refresh period RP which is shorter than the minimum retention time of the weak cell row 610c that is three quarters of the refresh period RP.

In this manner, the first strong cell row 620c is selected to be spaced from the weak cell row 610c by the predetermined interval ITV such that the weak cell row 610c is repeatedly refreshed before the minimum retention time. Also in FIG. 15, any row address aside from the weak cell row address WEAK_ADDR and the first strong cell row address STR_ADDR_1 may be selected as the second strong cell row STR_ADDR_2.

Figure 16:
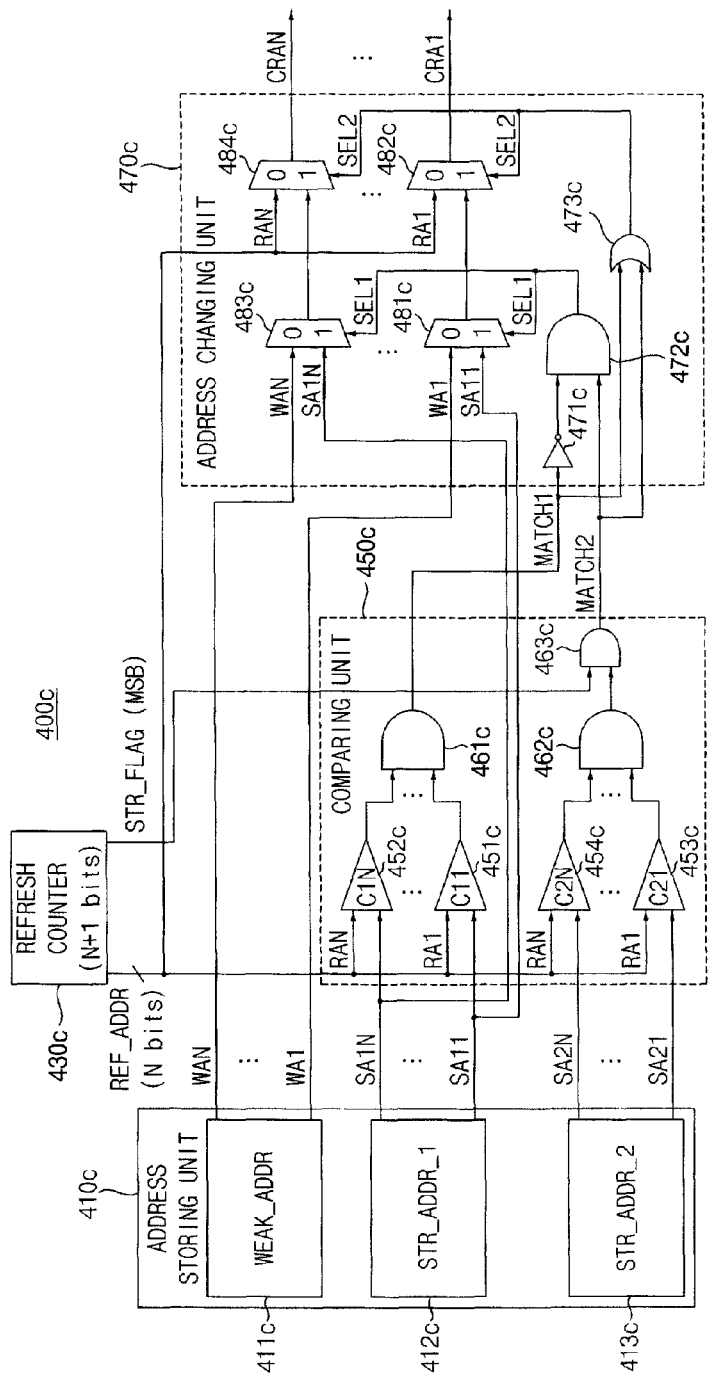
FIG. 16 is a block diagram of a refresh address generator for performing a refresh method of FIG. 14, according to an example embodiment of the present invention.

FIG. 16 is a block diagram of a refresh address generator 400c for performing a refresh method of FIG. 14, according to an example embodiment of the present invention. Referring to FIG. 16, the refresh address generator 400c includes an address storing unit 410c, a refresh counter 430c, a comparing unit 450c, and an address changing unit 470c.

The address storing unit 410c includes a first storing region 411c for storing a weak cell row address WEAK_ADDR, a second storing region 412c for storing a first strong cell row address STR_ADDR_1, and a third storing region 413c for storing a second strong cell row address STR_ADDR_2. FIG. 16 illustrates the address storing unit 410c storing one weak cell row address WEAK_ADDR, one first strong cell row address STR_ADDR_1, and one second strong cell row address STR_ADDR_2. However, the present invention may be practiced with the address storing unit 410c storing more weak cell row addresses and more respective first and second strong cell row addresses.

The refresh counter 430c generates a refresh row address REF_ADDR and a strong cell flag STR_FLAG by counting. The comparing unit 450c generates a first match signal MATCH1 by comparing the refresh row address REF_ADDR with the first strong cell row address STR_ADDR_1. The comparing unit 450c also generates a second match signal MATCH2 from comparing the refresh row address REF_ADDR with the second strong cell row address STR_ADDR_2 and based on the strong cell flag STR_FLAG.

The comparing unit 450c includes a plurality of first comparators 451c and 452c, a plurality of second comparators 453c and 454c, and a plurality of logic gates 461c, 462c, and 463c. The first comparators 451c and 452c compare the initial refresh row address REF_ADDR with the first strong cell row address STR_ADDR_1. A first AND gate 461c generates the first match signal MATCH1 by performing an AND operation on output signals of the first comparators 451c and 452c. When the refresh row address REF_ADDR matches the first strong cell row address STR_ADDR_1, the first AND gate 461c outputs the first match signal MATCH1 with a logic high level.

The second comparators 453c and 454c compare the refresh row address REF_ADDR with the second strong cell row address STR_ADDR_2. A second AND gate 462c performs an AND operation on output signals of the second comparators 453c and 454c. When the refresh row address REF_ADDR matches the second strong cell row address STR_ADDR_2, the second AND gate 462c generates an output signal with a logic high level.

A third AND gate 463c generates the second match signal MATCH2 by performing an AND operation on the strong cell flag STR_FLAG and the output signal of the second AND gate 462c. When the refresh row address REF_ADDR matches the second strong cell row address STR_ADDR_2 and the strong cell flag STR_FLAG is at a logic high level, the third AND gate 461c outputs the second match signal MATCH2 with a logic high level.

FIG. 16 shows the comparing unit 450c with a set of the first comparators 451c and 452c, the second comparators 453c and 454c, and the logic gates 461c, 462c, and 463c for comparing the refresh row address REF_ADDR with the first and second strong cell row addresses STR_ADDR_1 and STR_ADDR_2 related to one weak cell row address WEAK_ADDR. However, the present invention may also be practiced with the comparing unit 450c having more sets of first comparators, second comparators, and logic gates for comparing the refresh row address REF_ADDR with respective first and second strong cell row addresses corresponding to more weak cell row addresses.

The address changing unit 470c outputs the weak cell row address WEAK_ADDR as the final refresh row address CREF_ADDR when the first match signal MATCH1 is at a logic high level. Alternatively, the address changing unit 470c outputs the first strong cell row address STR_ADDR_1 as the final refresh row address CREF_ADDR when the second match signal MATCH2 is at a logic high level.

The address changing unit 470c includes a plurality of logic gates 471c, 472c, and 473c, a plurality of first multiplexers 481c and 483c, and a plurality of second multiplexers 482c and 484c. An inverter 471c inverts the first match signal MATCH1, and a fourth AND gate 472c generates a first selection signal SEL1 by performing an AND operation on the second match signal MATCH2 and the inversion of the first match signal MATCH1.

The fourth AND gate 472c outputs the first selection signal SEL1 at a logic low level when the first match signal MATCH1 is at a logic high level, and outputs the first selection signal SEL1 with a logic high level when the second match signal MATCH2 has a logic high level with the first match signal MATCH1 being at a logic low level. The first multiplexers 481c and 483c selectively output bits WA1 through WAN of the weak cell row address WEAK_ADDR when the first match signal MATCH1 is at a logic high level, and selectively output bits SA11 through SA1N of the first strong cell row address STR_ADDR_1 when the second match signal MATCH2 is at a logic high level.

An OR gate 473c generates a second selection signal SEL2 by performing an OR operation on the first match signal MATCH1 and the second match signal MATCH2. When the first or second match signal MATCH1 or MATCH2 is at a logic high level, the OR gate 473c outputs the second selection signal SEL2 with a logic high level.

The second multiplexers 482c and 484c selectively output the initial refresh row address REF_ADDR or a row address from the first multiplexers 481c and 483c in response to the second selection signal SEL2. When the first and second match signals MATCH1 and MATCH2 have logic low levels, the second multiplexers 482c and 484c output the initial refresh row address REF_ADDR as the final refresh row address CREF_ADDR.

The second multiplexers 482c and 484c output the weak cell row address WEAK_ADDR as the final refresh row address CREF_ADDR when the first match signal MATCH1 is at a logic high level, and outputs the first strong cell row address STR_ADDR_1 as the final refresh row address CREF_ADDR when the second match signal MATCH2 is at a logic high level.

In this manner, the refresh address generator 400c outputs the weak cell row address WEAK_ADDR when the refresh counter 430c generates the first strong cell row address STR_ADDR_1. The refresh address generator 400c also alternately outputs one of the first and second strong cell row addresses STR_ADDR_1 and STR_ADDR_2 each refresh period RP when the refresh counter 430c generates the second strong cell row address STR_ADDR_2. Thus, the refresh address generator 400c allows the weak cell row to be refreshed instead of the first strong cell row to decrease a refresh period of the weak cell row without increasing the refresh current and the refresh power consumption.

Figure 17:
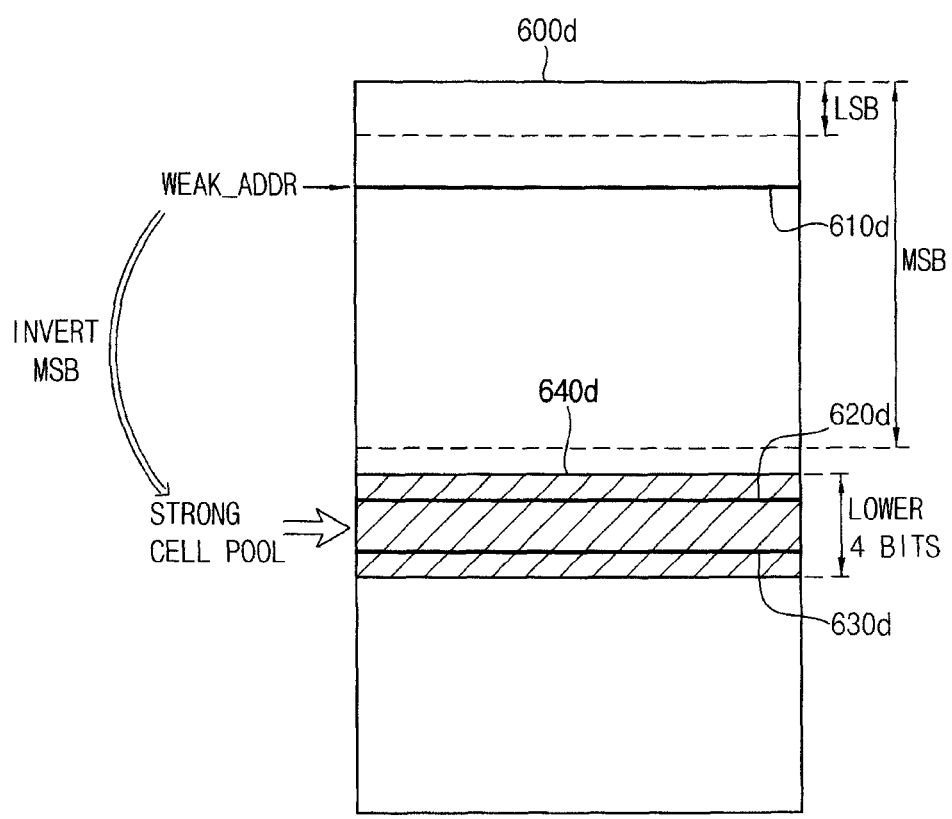
FIG. 17 is another example memory cell array with a weak cell row and first and second strong cell rows, according to an example embodiment of the present invention.

FIG. 17 shows a bank array 600d of a memory cell array with a weak cell row and first and second strong cell rows selected from a pool of possible strong memory cells, according to an example embodiment of the present invention. Referring to FIG. 17, a weak cell row address WEAK_ADDR for a weak cell row 610d is determined from testing of the memory cell array. In addition, a strong cell pool from which first and second strong cell row addresses STR_ADDR_1 and STR_ADDR_2 are selected is determined by inverting the MSB of the weak cell row address WEAK_ADDR.

The strong cell pool includes $2^M$ row addresses of which least significant M bits are different from each other, with M being an integer greater than 1. For example, when each row address has N bits, the $2^M$ row addresses forming the strong cell pool have the same upper N-M bits, and have different least significant M bits. Furthermore, the upper N-M bits except the MSB (i.e., M+1-th through N-1-th bits) of the $2^M$ row addresses are the same as that of the weak cell row address WEAK_ADDR, in an example embodiment of the present invention.

For example, in a case where a row address has 13 bits and a strong cell pool includes row addresses of which the least significant 4 bits are different from each other, the strong cell pool includes 16 row addresses. Each of such row addresses in the strong cell pool has the MSB that is different from that of the weak cell row WEAK_ADDR and has fifth through twelfth bits that are the same as those of the weak cell row WEAK_ADDR. Two memory cell rows having minimum retention times longer than or equal to about double a refresh period RP is selected as the first and second strong cell rows 620d and 630d among the 16 memory cell rows having the 16 row addresses of the strong cell pool.

Figure 18:
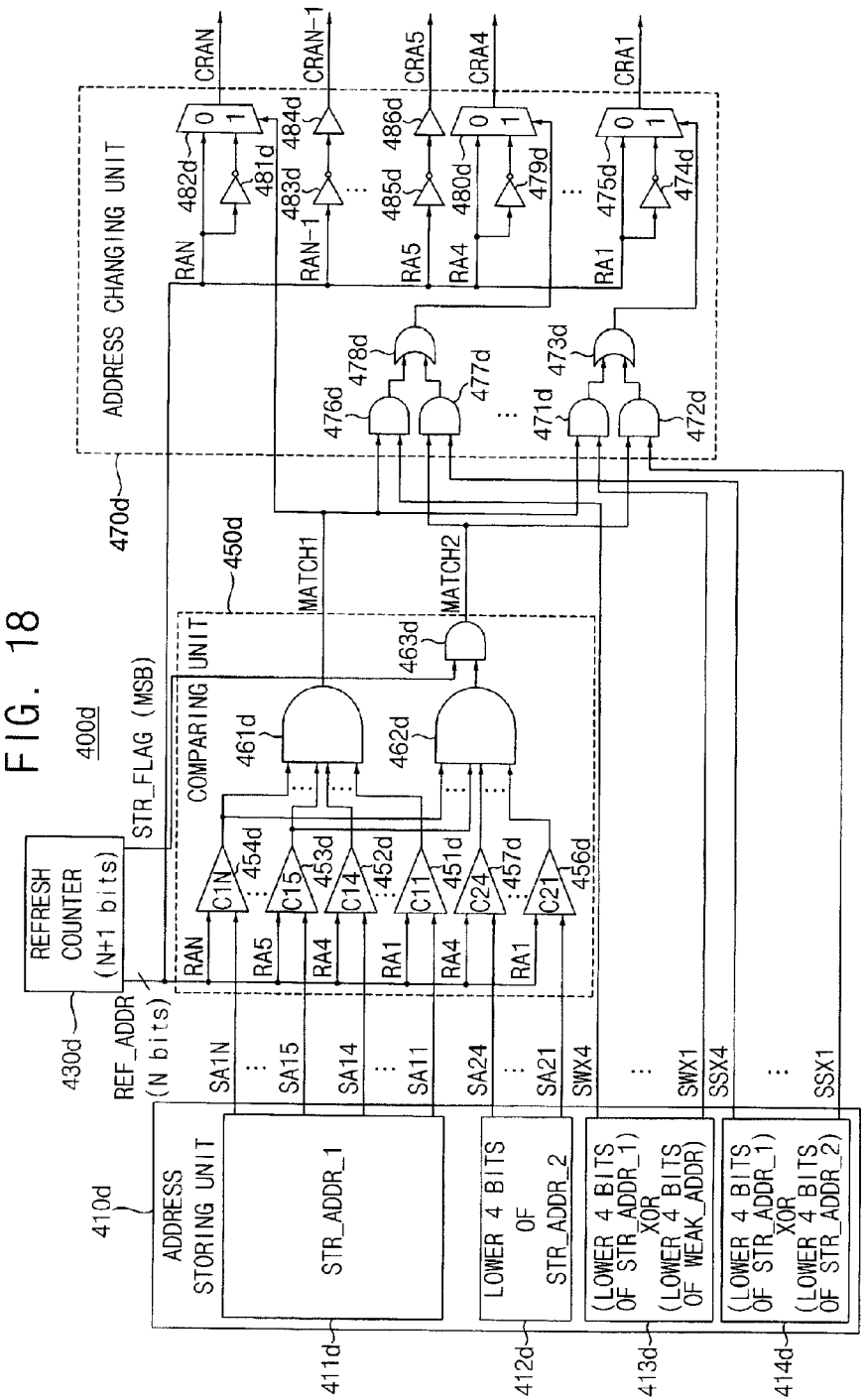
FIG. 18 is a block diagram of a refresh address generator for performing the refresh method of FIG. 14, according to another example embodiment of the present invention.

FIG. 18 is a block diagram of a refresh address generator 400d for performing the refresh method of FIG. 14, according to another example embodiment of the present invention. FIG. 18 illustrates an example of the first and second strong cell row addresses STR_ADDR_1 and STR_ADDR_2 being selected from 16 row addresses of a strong cell pool as illustrated in FIG. 17.

Referring to FIG. 18, the refresh address generator 400d includes an address storing unit 410d, a refresh counter 430d, a comparing unit 450d, and an address changing unit 470d. The address storing unit 410d includes a first storing region 411d for storing a first strong cell row address STR_ADDR_1 and a second storing region 412d for storing the least significant 4 bits of a second strong cell row address STR_ADDR_2.

The address storing unit 410d also includes a third storing region 413d for storing a result of a first XOR operation on the least significant 4 bits of the first strong cell row address STR_ADDR_1 and of a weak cell row address WEAK_ADDR. The address storing unit 410d further includes a fourth storing region 414d for storing a result of a second XOR operation on the least significant 4 bits of the first strong cell row address STR_ADDR_1 and of the second strong cell row address STR_ADDR_2.

FIG. 18 shows the address storing unit 410d storing the first strong cell row address STR_ADDR_1, the least significant 4 bits of the second strong cell row address STR_ADDR_2, and the results of the first and second XOR operations for one weak cell row address WEAK_ADDR. However, the present invention may also be practiced with the address storing unit 410d storing similar address information corresponding to more weak cell row addresses.

The refresh counter 430d generates a refresh row address REF_ADDR and a strong cell flag STR_FLAG by counting. The comparing unit 450d generates a first match signal MATCH1 by comparing the refresh row address REF_ADDR with the first strong cell row address STR_ADDR_1. The comparing unit 450d generates a second match signal MATCH2 by comparing the refresh row address REF_ADDR with the second strong cell row address STR_ADDR_2 and based on the strong cell flag STR_FLAG.

The comparing unit 450d includes first N comparators 451d, 452d, 453d, and 454d, second four comparators 456d through 457d, and a plurality of logic gates 461d, 462d, and 463d. The first comparators 451d, 452d, 453d, and 454d compare the refresh row address REF_ADDR with the first strong cell row address STR_ADDR_1. A first AND gate 461d generates the first match signal MATCH1 by performing an AND operation on output signals of the first comparators 451d, 452d, 453d, and 454d. When the initial refresh row address REF_ADDR matches the first strong cell row address STR_ADDR_1, the first AND gate 461d outputs the first match signal MATCH1 with a logic high level.

The second comparators 456d through 457d compare the least significant four bits of the refresh row address REF_ADDR with the least significant four bits of the second strong cell row address STR_ADDR_2. A second AND gate 462d performs an AND operation on output signals of the second comparators 456d through 457d and N-4 output signals of the N-4 comparators 453d and 454d corresponding to most significant N-4 bits (i.e., fifth through N-th bits) of the refresh row address REF_ADDR.

When the refresh row address REF_ADDR matches the second strong cell row address STR_ADDR_2, the second AND gate 462d generates an output signal with a logic high level. A third AND gate 463d generates the second match signal MATCH2 by performing an AND operation on the strong cell flag STR_FLAG and the output signal of the second AND gate 462d. When the refresh row address REF_ADDR matches the second strong cell row address STR_ADDR_2 and the strong cell flag STR_FLAG is at a logic high level, the third AND gate 463d outputs the second match signal MATCH2 with a logic high level.

FIG. 18 shows the comparing unit 450d including a set of the first comparators 451d, 452d, 453d, and 454d, the second comparators 456d through 457d, and the logic gates 461d, 462d, and 463d for comparing the refresh row address REF_ADDR with the first and second strong cell row addresses STR_ADDR$_1$1 and STR_ADDR_2 related to one weak cell row address WEAK_ADDR. However, the present invention may also be practiced with the comparing unit 450d including more sets of first comparators, second comparators, and logic gates for comparing the refresh row address REF_ADDR with first and second strong cell row addresses corresponding to more weak cell row addresses.

The address changing unit 470d outputs the weak cell row address WEAK_ADDR as the final refresh row address CREF_ADDR when the first match signal MATCH1 is at a logic high level. Alternatively, the address changing unit 470d outputs the first strong cell row address STR_ADDR_1 as the final refresh row address CREF_ADDR when the second match signal MATCH2 is at a logic high level.

The address changing unit 470d includes a respective first AND gate 471d or 476d that performs an AND operation of the first match signal MATCH1 and each of the bits stored in the third storing region 413d. The address changing unit 470d also includes a respective second AND gate 472d or 477d that performs an AND operation of the second match signal MATCH2 and each of the bits stored in the fourth storing region 414d.

The address changing unit 470d further includes a respective OR gate 473d or 478d that performs an OR operation of outputs of respective AND gates inputting bits of same bit significance from the third and fourth storing regions 413d and 414d. Thus, the OR gates 473d and 478d output the bits stored in the third storing region 413d when the first match signal MATCH1 is at a logic high level, and output the bits stored in the fourth storing region 414d when the second match signal MATCH2 is at a logic high level.

Each of the outputs of the OR gates 473d and 478d is applied at a control terminal of a respective multiplexer 475d or 480d. A respective inverter 474d or 479d inverts a respective one RA1 or RA4 of the four least significant bits of the initial refresh row address REF_ADDR. The inverter 481d inverts the N-th bit RAN of the refresh row address REF_ADDR.

A multiplexer 482d selectively outputs one of the N-th bit RAN of the initial refresh row address REF_ADDR or an inversion thereof as an N-th bit CRAN of the final refresh row address CREF_ADDR in response to the first match signal MATCH1. Each of the multiplexers 475d and 480d selectively outputs one of the respective bits RA1 or RA4 of the initial refresh row address REF_ADDR or an inversion thereof as a respective bit CRA1 or CRA4 of the final refresh row address CREF_ADDR in response to a respective output signal from the respective OR gate 473d or 478d. The address changing unit 470d further includes inverters 483d, 484d, 485d, and 486d for delaying fifth through N−1-th bits RA5 through RAN−1 of the initial refresh row address REF_ADDR to generate the final refresh row address CREF_ADDR.

Accordingly, when the first match signal MATCH1 is at a logic high level (i.e., when the initial refresh row address REF_ADDR matches the first strong cell row address STR_ADDR_1), the address changing unit 470d inverts the N-th bit RAN of the initial refresh row address REF_ADDR. In addition in that case, the address changing unit 470d inverts any bit of the four least significant bits RA1 through RA4 of the initial refresh row address REF_ADDR that is different from corresponding bits of the weak cell row address WEAK_ADDR.

That is, the address changing unit 470d outputs the weak cell row address WEAK_ADDR as the final refresh row address CREF_ADDR when the refresh row address REF_ADDR matches the first strong cell row address STR_ADDR_1. Furthermore, when the second match signal MATCH2 is at a logic high level (i.e., when the refresh row address REF_ADDR matches the second strong cell row address STR_ADDR_2 and the strong cell flag STR_FLAG is at a logic high level), the address changing unit 470d inverts any bit of the four least significant bits RA1 through RA4 of the initial refresh row address REF_ADDR that is different from corresponding bits of the first strong cell row address STR_ADDR_1 among the first through fourth bits RA1 and RA4 of the initial refresh row address REF_ADDR. Thus, the address changing unit 470d outputs the first strong cell row address STR_ADDR_1 as the final refresh row address CREF_ADDR when the refresh row address REF_ADDR matches the second strong cell row address STR_ADDR_2 and the strong cell flag STR_FLAG is at a logic high level.

In this manner, the refresh address generator 400d outputs the weak cell row address WEAK_ADDR when the refresh counter 430d generates the first strong cell row address STR_ADDR_1. In addition, the refresh address generator 400d alternately outputs the first and second strong cell row addresses STR_ADDR_1 and STR_ADDR_2 each refresh period RP when the refresh counter 430d generates the second strong cell row address STR_ADDR_2.

Thus, the refresh address generator 400d allows the weak cell row to be refreshed instead of the first strong cell row to decrease a refresh period of the weak cell row without increasing the refresh current and the refresh power consumption. Furthermore, the second strong cell row address STR_ADDR_2 is selected from a pool of addresses having a range defined by at least two least significant bits of the weak cell row address WEAK_ADDR and/or the first strong cell row address STR_ADDR_1.

Figure 19:
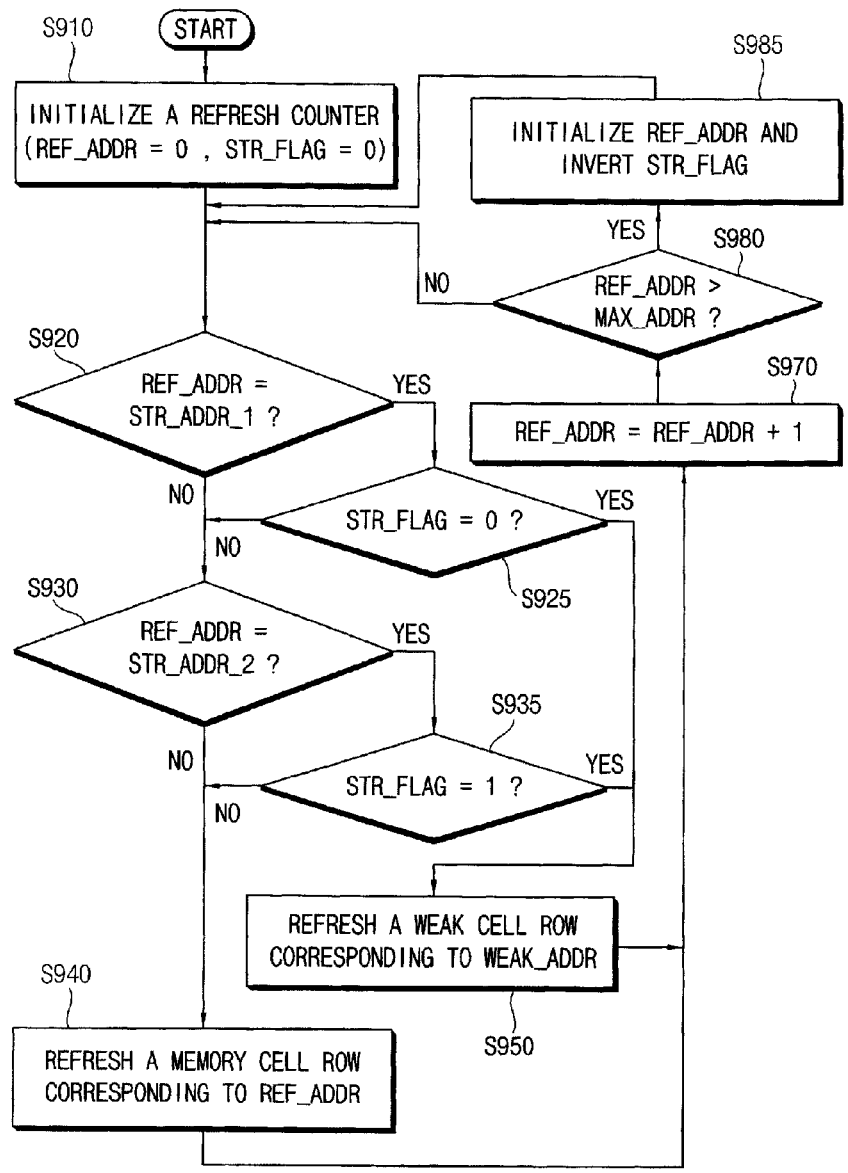
FIG. 19 is a flow chart of steps for refreshing a volatile memory device depending on a strong cell flag, according to another example embodiment of the present invention.

FIG. 19 is a flow chart of steps for refreshing a volatile memory device depending on a strong cell flag, according to another example embodiment of the present invention. In FIG. 19, a weak cell row is refreshed instead of a first strong cell row in an odd-numbered refresh period, and the weak cell row is refreshed instead of a second strong cell row in an even-numbered refresh period.

In FIG. 19 when a refresh operation is initiated, a refresh counter is initialized (S910) to "0" for example, and a strong cell flag STR_FLAG is initialized to a logic low level. The initial refresh row address REF_ADDR is compared with a first strong cell row address STR_ADDR_1 (S920) and with a second strong cell row address STR_ADDR_2 (S930). In an example embodiment of the present invention, comparisons of the refresh row address REF_ADDR with the first and second strong cell row addresses STR_ADDR_1 and STR_ADDR_2 (S920) and (S930) are performed substantially at the same time. If the refresh row address REF_ADDR does not match any of the first and second strong cell row addresses STR_ADDR_1 and STR_ADDR_2 (S920: NO)

and (S930: NO), a memory cell row corresponding to the initial refresh row address REF_ADDR is refreshed (S940).

If the refresh row address REF_ADDR matches the first strong cell row address STR_ADDR_1 (S920: YES), a first strong cell row corresponding to the first strong cell row address STR_ADDR_1 or a weak cell row corresponding to a weak cell row address WEAK_ADDR is selectively refreshed according to the strong cell flag STR_FLAG (S925, S940, S950). For example in this case, when the strong cell flag STR_FLAG is at a first logic level (e.g., a logic high level) (S925: NO), the first strong cell row corresponding to the first strong cell row address STR_ADDR_1 is refreshed (S940). Alternatively in this case, when the strong cell flag STR_FLAG is at a second logic level (e.g., a logic low level) (S925: YES), the weak cell row corresponding to the weak cell row address WEAK_ADDR is refreshed (S950).

If the refresh row address REF_ADDR matches the second strong cell row address STR_ADDR_2 (S930: YES), a second strong cell row corresponding to the second strong cell row address STR_ADDR_2 or the weak cell row corresponding to the weak cell row address WEAK_ADDR is selectively refreshed according to the strong cell flag STR_FLAG (S935, S940, S950). For example in this case, when the strong cell flag STR_FLAG has the second logic level (S935: NO), the second strong cell row corresponding to the second strong cell row address STR_ADDR_2 is refreshed (S940). Alternatively in this case, when the strong cell flag STR_FLAG has the first logic level (S935: YES), the weak cell row corresponding to the weak cell row address WEAK_ADDR is refreshed (S950).

The refresh row address REF_ADDR is incremented by 1 each time a memory cell row is refreshed (S970). If the refresh row address REF_ADDR exceeds the maximum row address MAX_ADDR (S980: YES), the refresh row address REF_ADDR is initialized, and the strong cell flag STR_FLAG is inverted (S985) such that the strong cell flag STR_FLAG is inverted every refresh period RP.

In this manner, the weak cell row is refreshed instead of the second strong cell row when the strong cell flag STR_FLG is at the first logic level. In addition, the weak cell row is refreshed instead of the first strong cell row when the strong cell flag STR_FLG is at the second logic level. Accordingly, a refresh period of the weak cell row is decreased without increasing the refresh current and the refresh power consumption.

Figure 20:
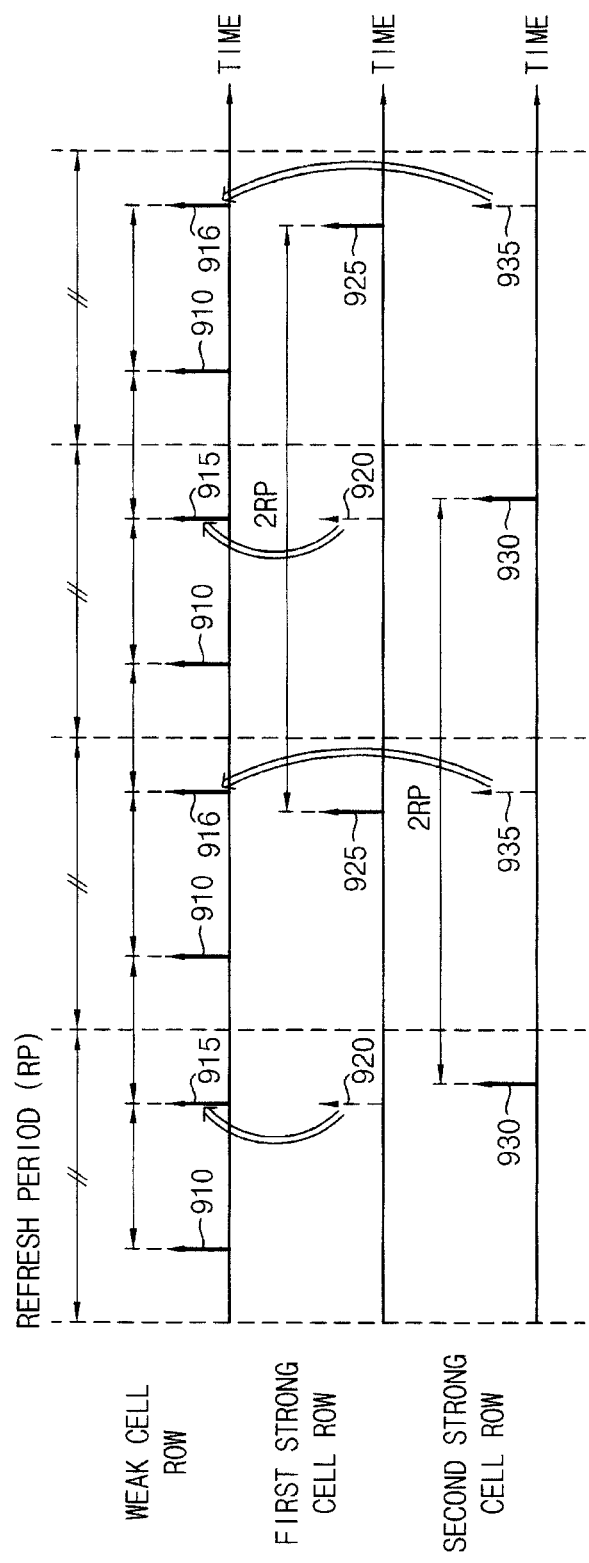
FIG. 20 is a timing diagram of example refreshes of a weak cell row and first and second strong cell rows performed according to FIG. 19, in an example embodiment of the present invention.

FIG. 20 is a timing diagram of example refreshes of a weak cell row and first and second strong cell rows performed according to FIG. 19, in an example embodiment of the present invention. Referring to FIG. 20, a weak cell row is refreshed twice per refresh period RP. For example during an odd-numbered refresh period, a refresh 910 is performed for the weak cell row when a row address for the weak cell row is generated, and an additional refresh 915 is performed for the weak cell row when a row address for a first strong cell row is generated.

Alternatively during an even-numbered refresh period, a refresh 910 is performed for the weak cell row when a row address for the weak cell row is generated, and an additional refresh 916 is performed for the weak cell row when a row address for a second strong cell row is generated. The weak cell row is repeatedly refreshed before the minimum retention time by selecting each of the first and second strong cell rows to be spaced from the weak cell row by at least a predetermined interval. For example, the row address for the first strong cell row is determined by inverting the MSB of the row address for the weak cell row, and the row address for the second strong cell row is determined by inverting the MSB and the LSB of the row address for the weak cell row. In this case, a refresh period of the weak cell row is half the refresh period RP defined in the standard of the memory device.

Each of the first and second strong cell rows is refreshed with a period 2RP that is double the refresh period RP. For example, the first strong cell row is refreshed in even-numbered refresh periods, and the second strong cell row is refreshed in odd-numbered refresh periods. That is, each of the first and second strong cell rows is refreshed once every two refresh periods RP.

Figure 21:
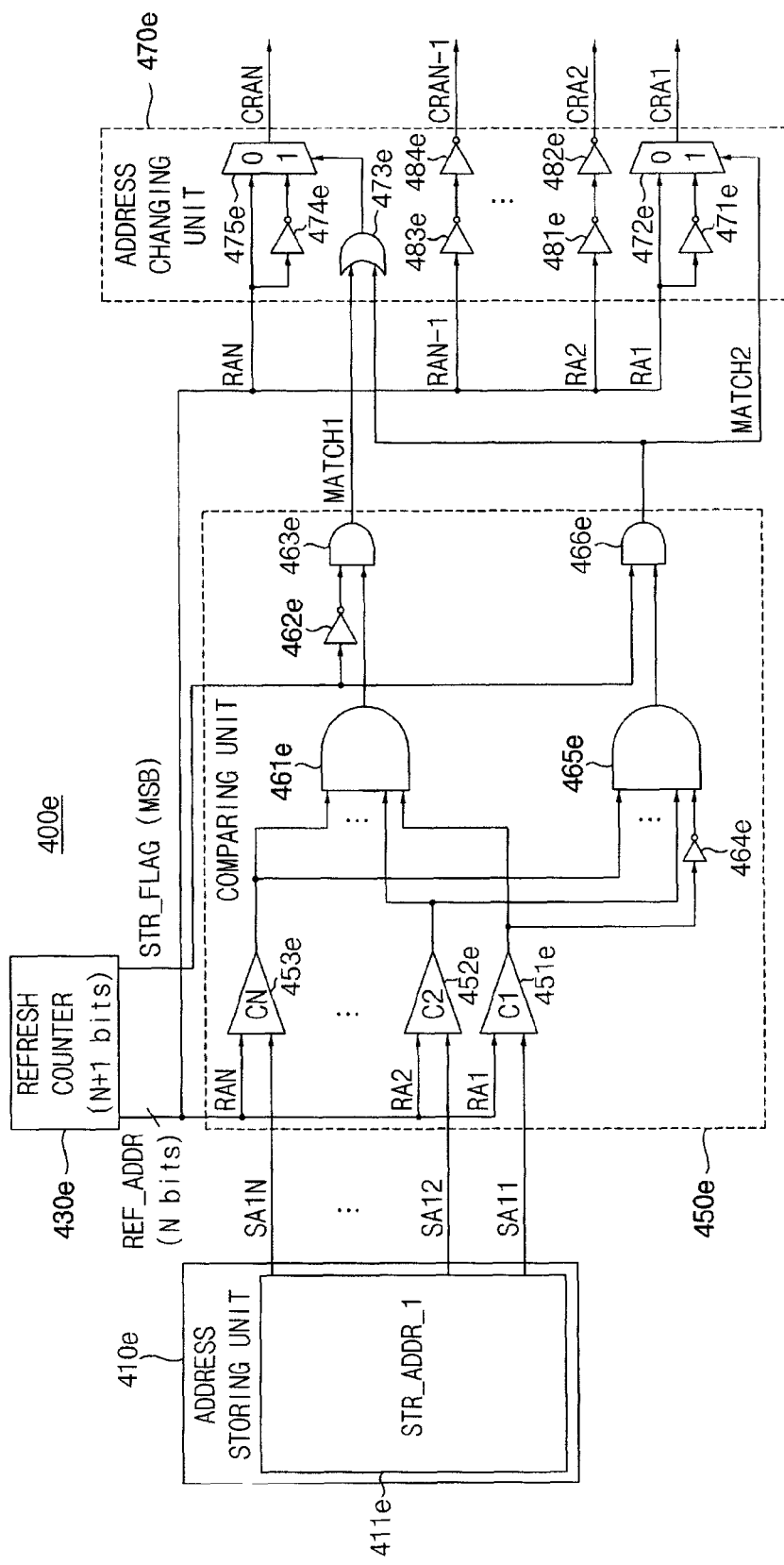
FIG. 21 is a block diagram of a refresh address generator for performing the refresh method of FIG. 19, according to an example embodiment of the present invention.

FIG. 21 is a block diagram of a refresh address generator 400e for performing the refresh method of FIG. 19, according to an example embodiment of the present invention. FIG. 21 illustrates an example where the first strong cell row address STR_ADDR_1 is determined by inverting the MSB of a weak cell row address WEAK_ADDR, and a second strong cell row address STR_ADDR_2 is determined by inverting the LSB of the first strong cell row address STR_ADDR_1.

Referring to FIG. 21, the refresh address generator 400e includes an address storing unit 410e, a refresh counter 430e, a comparing unit 450e, and an address changing unit 470e. The refresh address generator 400e is substantially similar to the refresh address generator 400a of FIG. 9 except that the refresh address generator 400e includes additional logic gates 462e, 463e, and 473e.

The address storing unit 410e includes a first storing region 411e for storing the first strong cell row address STR_ADDR_1. FIG. 21 illustrates the address storing unit 410e storing one first strong cell row address STR_ADDR_1 for one weak cell row address WEAK_ADDR. However, the present invention may also be practiced with the address storing unit 410e storing more first strong cell row addresses corresponding to more weak cell row addresses.

The refresh counter 430e generate an initial refresh row address REF_ADDR and a strong cell flag STR_FLAG by counting. The comparing unit 450e generates a first match signal MATCH1 from the strong cell flag STR_FLAG and a comparison of the initial refresh row address REF_ADDR with the first strong cell row address STR_ADDR_1. The comparing unit 450e also generates a second match signal MATCH2 from the strong cell flag STR_FLAG and a comparison of the initial refresh row address REF_ADDR with the second strong cell row address STR_ADDR_2.

The comparing unit 450e includes N comparators 451e, 452e, and 453e and a plurality of logic gates 461e, 462e, 463e, 464e, 465e, and 466e. The N comparators 451e, 452e, and 453e compare respective bits of the initial refresh row address REF_ADDR and the first strong cell row address STR_ADDR_1. A first AND gate 461e performs an AND operation on output signals of the N comparators 451e, 452e, and 453e.

A first inverter 462e inverts the strong cell flag STR_FLAG. The second AND gate 463e generates the first match signal MATCH1 by performing an AND operation on an output of the first AND gate 461e and an inversion of the strong cell flag STR_FLAG. Accordingly, the comparing unit 450e generates the first match signal MATCH1 with a logic high level when the refresh row address REF_ADDR matches the first strong cell row address STR_ADDR_1 and the strong cell flag STR_FLAG is at a logic low level.

A second inverter 464e inverts the output of the first comparator 461e. A third AND gate 465e performs an AND operation on the outputs of the N−1 comparators 452e and 453e and an output of the second inverter 464e. The third AND gate 465e generates an output signal with a logic high level when the refresh row address REF_ADDR is same as the first strong cell row STR_ADDR_1 except for the LSB (i.e., when the refresh row address REF_ADDR matches the second strong cell row STR_ADDR_2). A fourth AND gate 466e generates the second match signal MATCH2 by performing an AND operation on the output signal of the third AND gate 465e and the strong cell flag STR_FLAG. Accordingly, the comparing unit 450e generates the second match signal MATCH2 with a logic high level when the refresh row address REF_ADDR matches the second strong cell row address STR_ADDR_2 and the strong cell flag STR_FLAG is at a logic high level.

FIG. 21 illustrates the comparing unit 450e including a set of the comparators 451e, 452e, and 453e and the logic gates 461e, 462e, 463e, 464e, 465e, and 466e for one weak cell row address WEAK_ADDR. However, the present invention may also be practiced with the comparing unit 450e having more sets of comparators and logic gates for more weak cell row addresses.

When the first match signal MATCH1 is at a logic high level, the address changing unit 470e outputs the weak cell row address WEAK_ADDR as a final refresh row address CREF_ADDR by inverting an N-th bit RAN of the initial refresh row address REF_ADDR. When the second match signal MATCH2 is at a logic high level, the address changing unit 470e outputs the weak cell row address WEAK_ADDR as the final refresh row address CREF_ADDR by inverting a first bit RA1 and the N-th bit RAN of the initial refresh row address REF_ADDR.

The address changing unit 470e includes a first inverter 471e and a first multiplexer 472e for changing a first bit RA1 of the refresh row address REF_ADDR. The address changing unit 470e also includes an OR gate 473e, a second inverter 474e, and a second multiplexer 475e for changing a second bit RAN of the refresh row address REF_ADDR.

The first inverter 471e and the first multiplexer 472e may invert the first bit RA1 of the initial refresh row address REF_ADDR to generate the first bit CRA1 of the final refresh row address CREF_ADDR in response to the second match signal MATCH2. The OR gate 473e, the second inverter 474e, and a second multiplexer 475e may invert the N-th bit RAN of the refresh row address REF_ADDR to generate the N-th bit CRAN of the final refresh row address CREF_ADDR in response to the first match signal MATCH1 or the second match signal MATCH2. The address changing unit 470e further includes inverters 481e, 482e, 483e, and 484e for delaying second through N−1-th bits RA2 and RAN−1 of the initial refresh row address REF_ADDR to generate corresponding bits CRA2 and CRAN−1 of the final refresh row address CREF_ADDR.

In this manner, the refresh address generator 400e outputs the weak cell row address WEAK_ADDR instead of one of the first and second strong cell row addresses STR_ADDR_1 and STR_ADDR_2 in each refresh period RP. Therefore, the refresh address generator 400e allows the weak cell row to be refreshed instead of one of the first and second strong cell rows to decrease a refresh period of the weak cell row without increasing the refresh current and the refresh power consumption.

Figure 22:
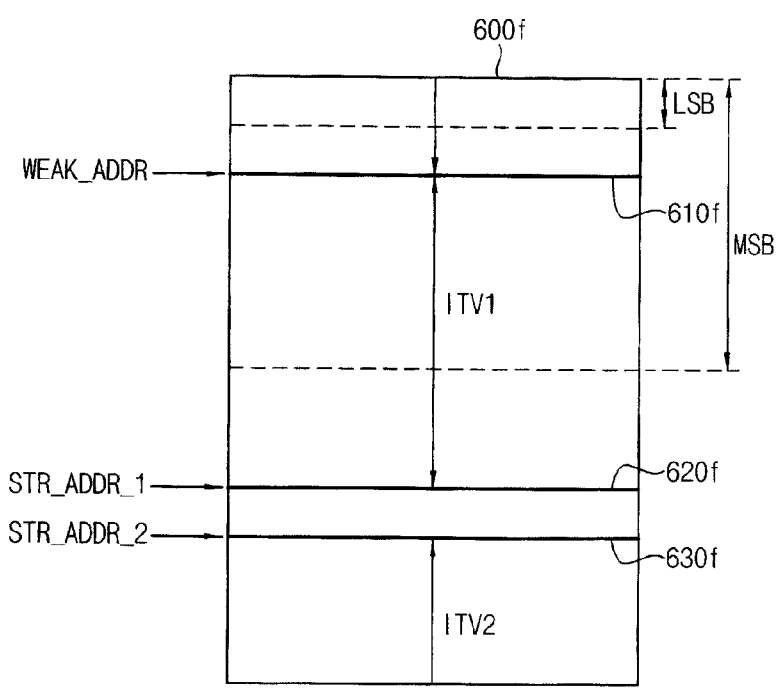
FIG. 22 is another example memory cell array with a weak cell row and first and second strong cell rows, according to an example embodiment of the present invention.

FIG. 22 is an example bank array 600f of a memory device with a weak cell row and first and second strong cell rows, according to an example embodiment of the present invention. Referring to FIG. 22, a weak cell row address WEAK_ADDR for a weak cell row 610f is determined from testing of the memory device.

A first strong cell row address STR_ADDR_1 of a first strong cell row 620f is selected such that a time interval of counting between the first strong cell row address STR_ADDR_1 and the weak cell row address WEAK_ADDR is at least a first predetermined interval ITV1. In addition, a second strong cell row address STR_ADDR_2 of a second strong cell row 630f is selected such that a time interval of counting between the second strong cell row address STR_ADDR_2 and the weak cell row address WEAK_ADDR is at least a second predetermined interval ITV2.

The first and second predetermined intervals ITV1 and ITV2 are determined according to a minimum retention time of the weak cell row 610f. For example in a case where the bank array 600f includes X memory cell rows and the minimum retention time of the weak cell row 610f is three quarters of a refresh period RP, each of the first and second strong cell row addresses STR_ADDR_1 and STR_ADDR_2 is selected such that the first and second predetermined intervals ITV1 and ITV2 are at least X/4 in either direction.

For example, if each of the strong cell rows 620f and 630f is spaced apart from the weak cell row 610f by an interval corresponding to about N/3 memory cell rows, refreshes for the weak cell row 610f may have intervals of time that are about one-third or two-thirds of the refresh period RP. In that case, the maximum interval of time between two adjacent refreshes for the weak cell row 610f is two-thirds of the refresh period RP which is shorter than the minimum retention time of the weak cell row 610f that is three quarters of the refresh period RP.

Figure 23:
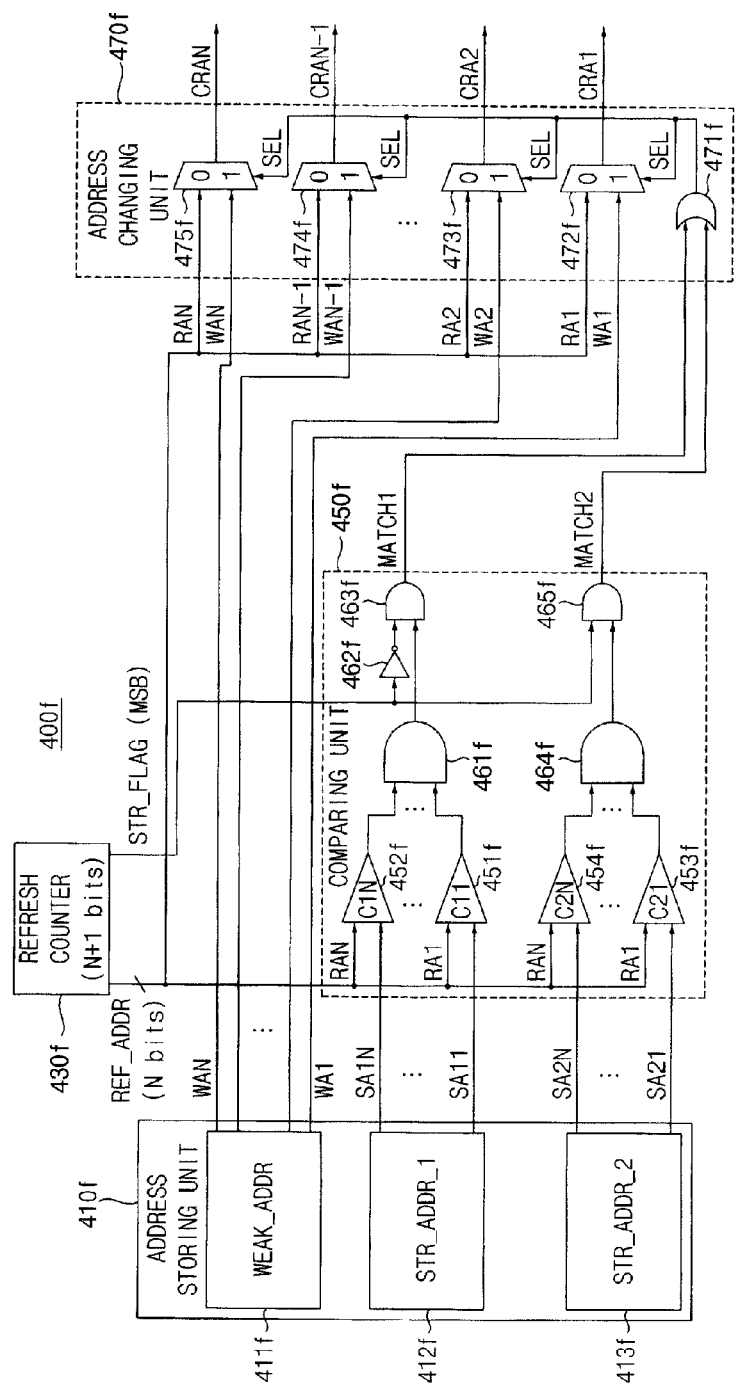
FIG. 23 is a block diagram of a refresh address generator for performing the refresh method of FIG. 19, according to another example embodiment of the present invention.

FIG. 23 is a block diagram of a refresh address generator 400f for performing the refresh method of FIG. 19, according to an example embodiment of the present invention. FIG. 23 illustrates an example where first and second strong cell row addresses STR_ADDR_1 and STR_ADDR_2 are arbitrarily determined.

Referring to FIG. 23, the refresh address generator 400f includes an address storing unit 410f, a refresh counter 430f, a comparing unit 450f, and an address changing unit 470f. The address storing unit 410f includes a first storing region 411f for storing a weak cell row address WEAK_ADDR, a second storing region 412f for storing a first strong cell row address STR_ADDR_1, and a third storing region 413f for storing a second strong cell row address STR_ADDR_2.

FIG. 23 illustrates the address storing unit 410f storing one weak cell row address WEAK_ADDR, one first strong cell row address STR_ADDR_1, and one second strong cell row address STR_ADDR_2. However, the present invention may also be practiced when the address storing unit 410f stores more weak cell row addresses, more first strong cell row addresses, and more second strong cell row addresses.

The refresh counter 430e generates an initial refresh row address REF_ADDR and a strong cell flag STR_FLAG by counting. The comparing unit 450f generates a first match signal MATCH1 based on the strong cell flag STR_FLAG and from a comparison of the refresh row address REF_ADDR with the first strong cell row address STR_ADDR_1. The comparing unit 450f also generates a second match signal MATCH2 based on the strong cell flag STR_FLAG and from a comparison of the refresh row address REF_ADDR with the second strong cell row address STR_ADDR_2.

The comparing unit 450f includes a plurality of N first comparators 451f and 452f, a plurality of second N comparators 453f and 454f, and a plurality of logic gates 461f, 462f, 463f, 464f, and 465f. The first comparators 451f and 452f, a first AND gate 461f, an inverter 462f, and a second AND gate 463f are configured to generate the first match signal MATCH1 with a logic high level when the refresh row address REF_ADDR matches the first strong cell row address STR_ADDR_1 and the strong cell flag STR_FLAG is at a logic low level. The second comparators 453f and 454f, a third AND gate 464f, and a fourth AND gate 465f are configured to generate the second match signal MATCH2 with a logic high level when the refresh row address REF_ADDR matches the second strong cell row address STR_ADDR_2 and the strong cell flag STR_FLAG is at a logic high level.

FIG. 23 shows the comparing unit 450f including a set of the first comparators 451f and 452f, the second comparators 453f and 454f, and the logic gates 461f, 462f, 463f, 464f, and 465f for one weak cell row address WEAK_ADDR. However, the present invention may also be practiced with the comparing unit 450f having more sets of first comparators, second comparators, and logic gates for more weak cell row addresses.

The address changing unit 470f generates the weak cell row address WEAK_ADDR as a final refresh row address CREF_ADDR when one of the first and second match signals MATCH1 and MATCH2 is at a logic high level. The address changing unit 470f includes an OR gate 471f and a plurality of multiplexers 472f, 473f, 474f, and 475f. The OR gate 471f generates a selection signal SEL by performing an OR operation on the first and second match signals MATCH1 and MATCH2.

The multiplexers 472f, 473f, 474f, and 475f receive the refresh row address REF_ADDR from the refresh counter 4730f and the weak cell row address WEAK_ADDR from the address storing unit 410f. The multiplexers 472f, 473f, 474f, and 475f selectively output the refresh row address REF_ADDR or the weak cell row address WEAK_ADDR as the final refresh row address CREF_ADDR in response to the selection signal SEL.

In this manner, the refresh address generator 400f outputs the weak cell row address WEAK_ADDR instead of one of the first and second strong cell row addresses STR_ADDR_1 and STR_ADDR_2 in each refresh period RP. Therefore, the refresh address generator 400f allows the weak cell row to be refreshed instead of one of the first and second strong cell rows to decrease a refresh period of the weak cell row without increasing the refresh current and the refresh power consumption.

Figure 24:
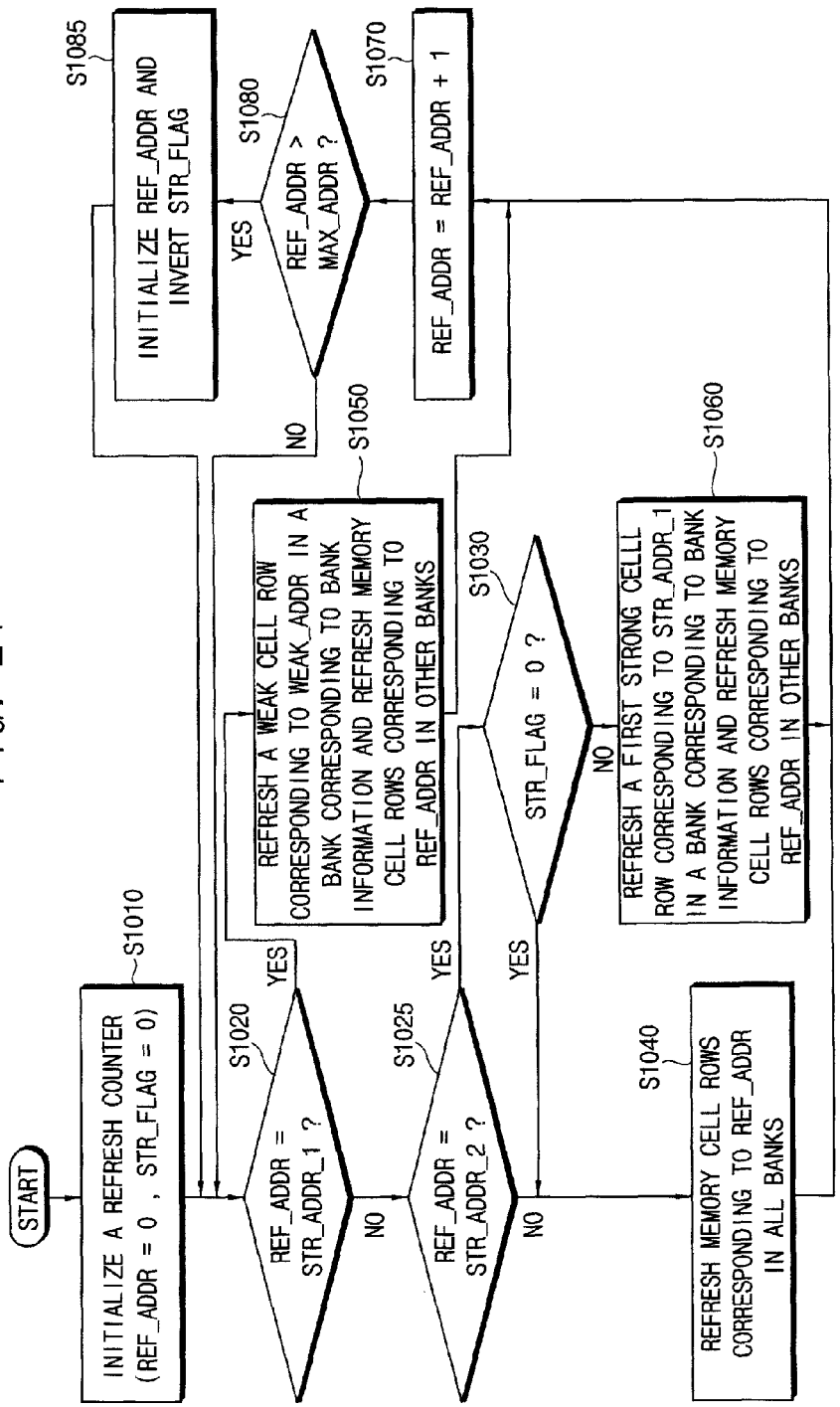
FIG. 24 is a flow chart of steps for refreshing a volatile memory device according to a selected memory bank, according to an example embodiment of the present invention.

FIG. 24 is a flow chart of steps for refreshing a volatile memory device according to a selected memory bank, according to an example embodiment of the present invention. In FIG. 24, a weak cell row address WEAK_ADDR, a first strong cell row address STR_ADDR_1, and a second strong cell row address STR_ADDR_2 are determined on a memory bank basis such that refresh leveraging is performed on a memory bank basis.

In FIG. 24 when a refresh operation is initiated, a refresh counter is initialized (S1010) to "0" for example, and a strong cell flag STR_FLAG is initialized to a logic low level. The refresh row address REF_ADDR is compared with the first and second strong cell row addresses STR_ADDR_1 and STR_ADDR_2 (S1020) and (S1025). In an example embodiment of the present invention, such comparisons (S1020) and (S1025) are performed substantially at the same time.

If the refresh row address REF_ADDR does not match the first and second strong cell row addresses STR_ADDR_1 and STR_ADDR_2 (S1020: NO) and (S1025: NO), the memory cell rows corresponding to the initial refresh row address REF_ADDR in all banks are refreshed (S1040). If the initial refresh row address REF_ADDR matches the first strong cell row address STR_ADDR_1 (S1020: YES), a weak cell row corresponding to the weak cell row address WEAK_ADDR is refreshed in at least one bank (i.e., selected memory bank) indicated by bank information, and memory cell rows corresponding to the initial refresh row address REF_ADDR is refreshed in the other banks (i.e., non-selected memory banks) (S1050).

In an example embodiment of the present invention, the bank information includes a bank address stored in an address storing unit. Alternatively, the bank information includes bank flags stored in the address storing unit for respective banks.

If the refresh row address REF_ADDR matches the second strong cell row address STR_ADDR_2 (S1025:YES) and the strong cell flag STR_FLAG is at a logic low level (S1030: YES), memory cell rows corresponding to the initial refresh row address REF_ADDR in all banks are refreshed (S1040). The refresh row address REF_ADDR is incremented by 1 each time a respective memory cell row in the memory banks is refreshed (S1070). If the refresh row address REF_ADDR exceeds the maximum row address MAX_ADDR (S1080: YES), the refresh row address REF_ADDR is initialized, and the strong cell flag STR_FLAG is inverted (S1085) every refresh period RP.

If the refresh row address REF_ADDR matches the second strong cell row address STR_ADDR_2 (S1025: YES), and the strong cell flag STR_FLAG is at a logic high level (S1030: NO), a first strong cell row corresponding to the first strong cell row address STR_ADDR_1 is refreshed in the bank corresponding to the bank information, and memory cell rows corresponding to the initial refresh row address REF_ADDR are refreshed in the other banks (S1060). In this manner, the weak cell row is refreshed instead of the first strong cell row only in the selected bank as indicated by the bank information.

Figure 25:
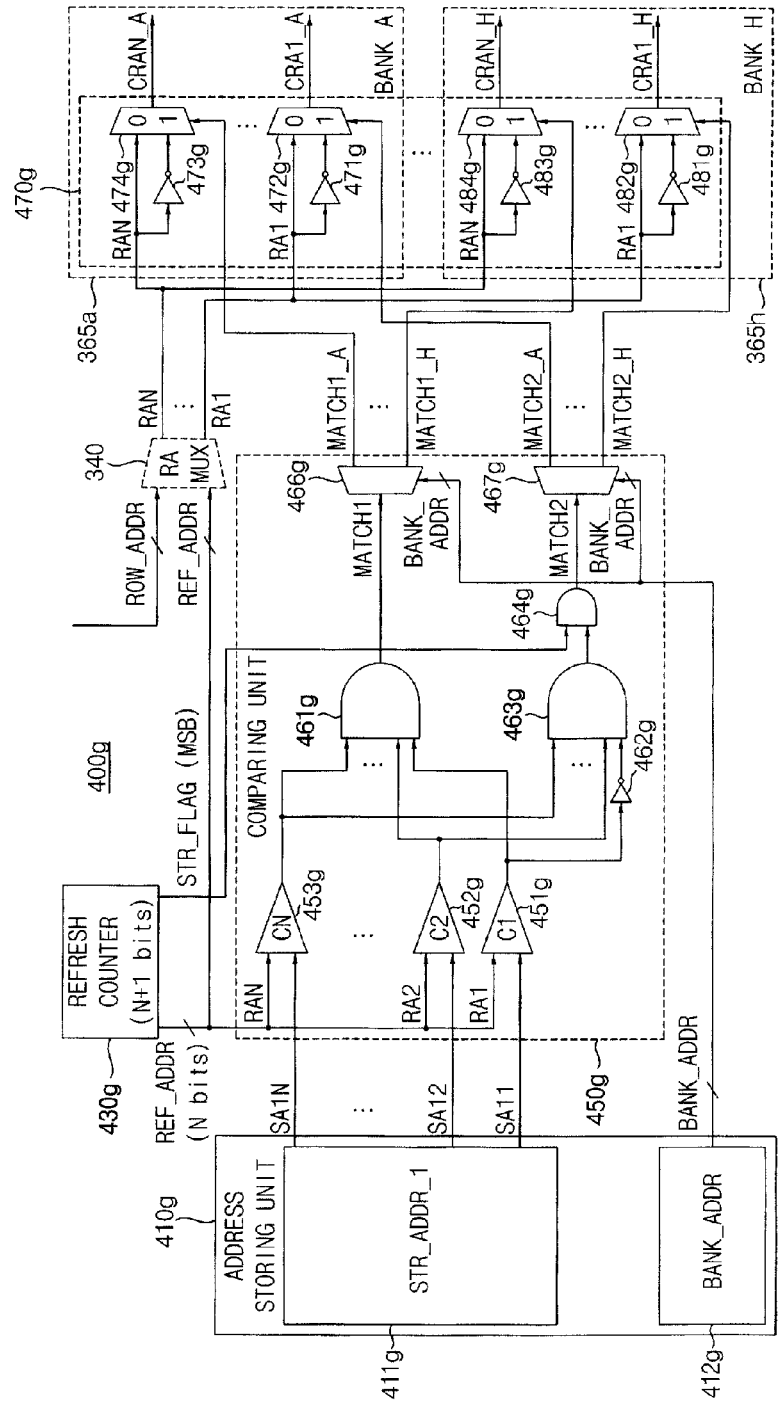
FIG. 25 is a block diagram of a refresh address generator for performing the refresh method of FIG. 24, according to an example embodiment of the present invention.

FIG. 25 is a block diagram of a refresh address generator 400g for performing the refresh method of FIG. 24, according to an example embodiment of the present invention. FIG. 25 includes refresh leveraging on a bank basis using a bank address BANK_ADDR. In addition in FIG. 25, a first strong cell row address STR_ADDR_1 is determined by inverting the MSB of a weak cell row address WEAK_ADDR, and a second strong cell row address STR_ADDR_2 is determined by inverting the LSB of the first strong cell row address STR_ADDR_1.

Referring to FIG. 25, the refresh address generator 400g includes an address storing unit 410g, a refresh counter 430g, a comparing unit 450g, and an address changing unit 470g. The address storing unit 410g includes a first storing region 411g for storing the first strong cell row address STR_ADDR$_1$1 and a second storing region 412g for storing the bank address BANK_ADDR.

FIG. 25 shows the address storing unit 410g storing one first strong cell row address STR_ADDR_1 and one bank address BANK_ADDR related to one weak cell row address WEAK_ADDR. However, the present invention may also be practiced with the address storing unit 410g storing more first strong cell row addresses and more bank addresses related to more weak cell row addresses.

The refresh counter 430g generate an initial refresh row address REF_ADDR and a strong cell flag STR_FLAG by counting. The comparing unit 450g generates a first match signal MATCH1 from a comparison of the refresh row address REF_ADDR with the first strong cell row address STR_ADDR_1. The comparing unit 450g also generates a second match signal MATCH2 based on the strong cell flag STR_FLAG and from a comparison of the refresh row address REF_ADDR with the second strong cell row address STR_ADDR_2.

The comparing unit 450g provides the first and second match signals MATCH1 and MATCH2 to a bank corresponding to the bank address BANK_ADDR among a plurality of banks 365a and 365h. The comparing unit 450g includes a plurality of comparators 451g, 452g and 453g, a plurality of logic gates 461g, 462g, 463g, and 464g, a first demultiplexer 466g, and a second demultiplexer 467g. The comparators 451g, 452g, and 453g and a first AND gate 461g are configured to generate the first match signal MATCH1 with a logic high level when the refresh row address REF_ADDR matches the first strong cell row address STR_ADDR_1.

The comparators 451g, 452g, and 453g, an inverter 462g, a second AND gate 463g, and a third AND gate 464g are configured to generate the second match signal MATCH2 with a logic high level when the refresh row address REF_ADDR matches the second strong cell row address STR_ADDR_2 and the strong cell flag STR_FLAG is at a logic high level. The first demultiplexer 466g transfers the first match signal MATCH1 as one of a plurality of first bank match signals MATCH1_A and MATCH1_H in response to the bank address BANK_ADDR.

The second demultiplexer 467g transfers the second match signal MATCH2 as one of a plurality of second bank match signals MATCH2_A and MATCH2_H in response to the bank address BANK_ADDR. Accordingly, the first and second match signals MATCH1 and MATCH2 are applied to the bank corresponding to the bank address BANK_ADDR among the plurality of banks 365a and 365h.

FIG. 25 shows the comparing unit 450g with a set of the comparators 451g, 452g, and 453g, the logic gates 461g, 462g, 463g, and 464f, and the demultiplexers 466g and 467g for one weak cell row address WEAK_ADDR. However, the present invention may also be practiced with the comparing unit 450g having more sets of comparators, logic gates, and demultiplexers for more weak cell row addresses. The refresh row address REF_ADDR from the refresh counter 430g is applied to respective banks 365a and 365h via the row address multiplexer 340 of FIG. 4.

The banks 365a and 365h receive the refresh row address REF_ADDR, the first bank match signals MATCH1_A and MATCH1_H, and the second match signals MATCH2_A and MATCH2_H, respectively. The address changing unit 470g is located at the banks 365a and 365h. For example, the address changing unit 470g includes first inverters 471g and 481g, first multiplexers 472g and 482g, second inverters 473g and 483g, and second multiplexers 474g and 484g in the banks 365a and 365h, respectively.

The first inverters 471g and 481g invert a first bit RA1 of the initial refresh row address REF_ADDR. The first multiplexers 472g and 482g selectively output one of the first bit RA1 and the inversion thereof of the refresh row address REF_ADDR as first bits CRA1_A and CRA1_H of the respective final refresh row addresses CREF_ADDR in response to the first bank match signals MATCH1_A and MATCH1_H, respectively.

The second inverters 473g and 483g invert an N-th bit RAN of the initial refresh row address REF_ADDR. The second multiplexers 474g and 484g selectively output the N-th bit RAN and the inversion thereof of the refresh row address REF_ADDR as N-th bits CRAN_A and CRAN_H of the respective final refresh row addresses CREF_ADDR in response to the second bank match signals MATCH2_A and MATCH2_H.

Only one of the first bank match signals MATCH1_A and MATCH1_H and only one of the second bank match signals MATCH2_A and MATCH2_H indicated by the bank address BANK_ADDR are activated. Accordingly, the address changing unit 470g changes the initial refresh row address REF_ADDR only for the bank indicated by the bank address BANK_ADDR. The respective final refresh row addresses CREF_ADDR from the address changing unit 470g are applied to bank row decoders 360a, 360b, 360c, and 360d illustrated in FIG. 4, respectively.

In this manner, the refresh address generator 400g allows a weak cell row to be refreshed instead of a first strong cell row only in a selected memory bank corresponding to a banks address BANK_ADDR. Accordingly, refresh leveraging is performed on a bank basis, and a refresh period of the weak cell row is decreased without increasing the refresh current and the refresh power consumption.

Figure 26:
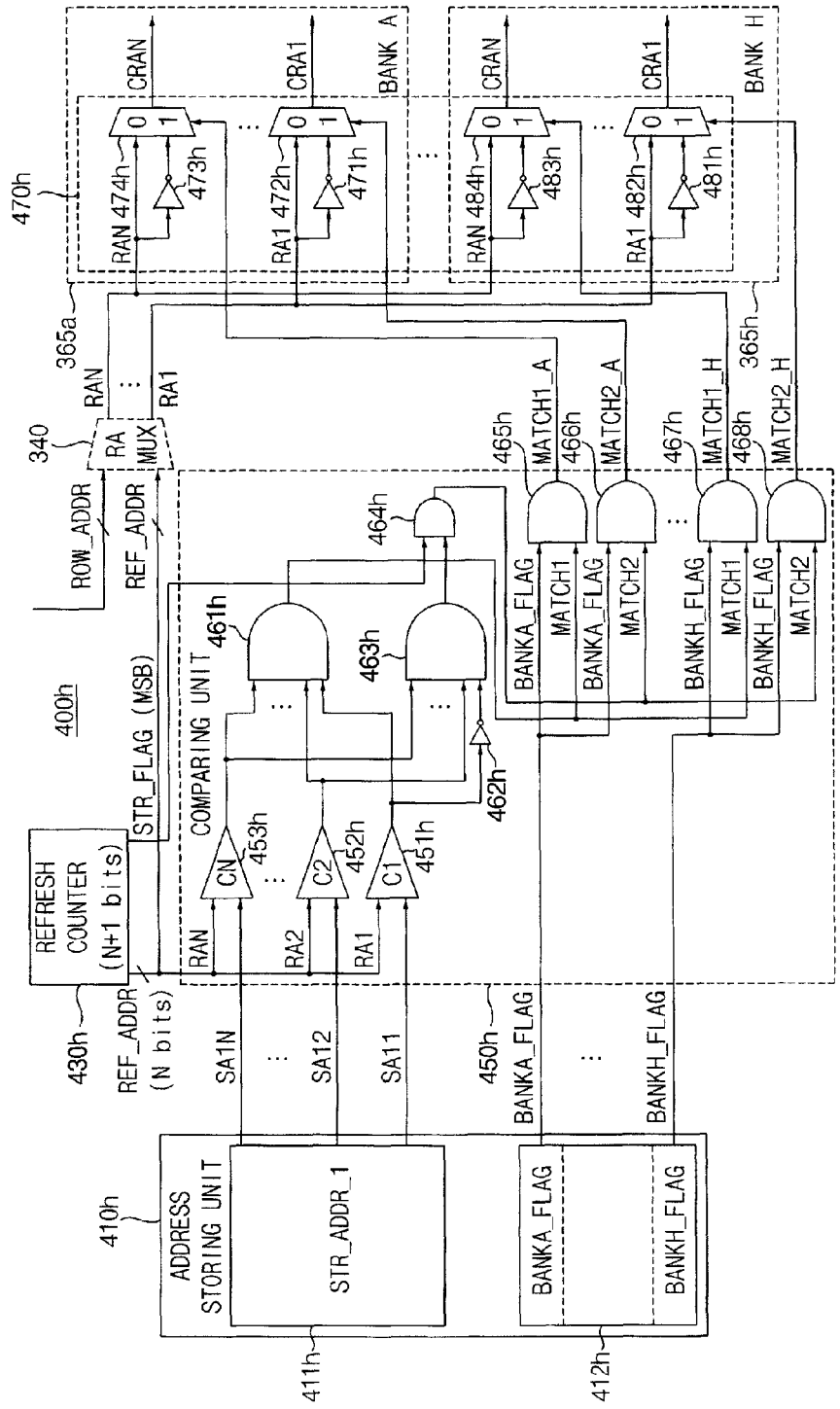
FIG. 26 is a block diagram of a refresh address generator for performing the refresh method of FIG. 24, according to another example embodiment of the present invention.

FIG. 26 is a block diagram of a refresh address generator 400h for performing the refresh method of FIG. 24 with refresh leveraging on a bank basis using bank flags BANKA_FLAG and BANKH_FLAG, according to another example embodiment of the present invention. In addition in FIG. 26, a first strong cell row address STR_ADDR_1 is determined by inverting the MSB of a weak cell row address WEAK_ADDR, and a second strong cell row address STR_ADDR_2 is determined by inverting the LSB of the first strong cell row address STR_ADDR_1.

Referring to FIG. 26, the refresh address generator 400h includes an address storing unit 410h, a refresh counter 430h, a comparing unit 450h, and an address changing unit 470h. The refresh address generator 400h is substantially similar to the refresh address generator 400g of FIG. 25 except that the bank flags BANKA_FLAG and BANKH_FLAG are used.

The address storing unit 410h includes a first storing region 411h for storing the first strong cell row address STR_ADDR_1 and a second storing region 412h for storing the bank flags BANKA_FLAG and BANKH_FLAG. Each of the bank flags BANKA_FLAG and BANKH_FLAG may be one bit data that represents whether refresh leveraging is to be performed in a respective one of the banks 365a and 365h.

FIG. 26 illustrates the address storing unit 410h storing one first strong cell row address $STR\_ADDR_1 1$ and bank flags BANKA_FLAG and BANKH_FLAG related to one weak cell row address WEAK_ADDR. However, the present invention may be practiced with the address storing unit 410h storing more first strong cell row addresses and bank flags related to more weak cell row addresses.

The refresh counter 430h generates a refresh row address REF_ADDR and a strong cell flag STR_FLAG by counting. The comparing unit 450h generates a first match signal MATCH1 from a comparison of the refresh row address REF_ADDR with the first strong cell row address STR_ADDR_1. The comparing unit 450h also generates a second match signal MATCH2 based on the strong cell flag STR_FLAG and from a comparison of the refresh row address REF_ADDR with the second strong cell row address STR_ADDR_2.

The comparing unit 450g selectively provides the first and second match signals MATCH1 and MATCH2 to a plurality of banks 365a and 365h according to the bank flags BANKA_FLAG and BANKH_FLAG. The comparing unit 450h includes a plurality of comparators 451h, 452h, and 453h and a plurality of logic gates 461h, 462h, 463h, 464h, 465h, 466h, 467h, and 468h.

The comparators 451h, 452h, and 453h and a first AND gate 461h are configured to generate the first match signal MATCH1 with a logic high level when the refresh row address REF_ADDR matches the first strong cell row address STR_ADDR_1. The comparators 451h, 452h, and 453h, an inverter 462h, a second AND gate 463h, and a third AND gate 464h are configured to generate the second match signal MATCH2 with a logic high level when the refresh row address REF_ADDR matches the second strong cell row address STR_ADDR_2 and the strong cell flag STR_FLAG is at a logic high level.

Fourth AND gates 465h and 467h are configured to generate a plurality of first bank match signals MATCH1_A and MATCH1_H by performing an AND operation on the first match signal MATCH1 and the bank flags BANKA_FLAG and BANKH_FLAG Fifth AND gates 466h and 468h are configured to generate a plurality of second bank match signals MATCH2_A and MATCH2_H by performing an AND operation on the second match signal MATCH2 and the bank flags BANKA_FLAG and BANKH_FLAG. Thus, the comparing unit 450h transfers the first and second match signals MATCH1 and MATCH2 to at least one bank with a corresponding bank flag set to a logic high level.

FIG. 26 shows the comparing unit 450h with a set of the comparators 451h, 452h, and 453h and the logic gates 461h, 462h, 463h, 464h, 465h, 466h, 467h, and 468h for one weak cell row address WEAK_ADDR. However, the present invention may also be practiced with the comparing unit 450h having more sets of comparators and logic gates for more weak cell row addresses.

The initial refresh row address REF_ADDR generated by the refresh counter 430h is applied to respective banks 365a and 365h via the row address multiplexer 340 of FIG. 4. The banks 365a and 365h receive the refresh row address REF_ADDR, the first bank match signals MATCH1_A and MATCH1_H, and the second match signals MATCH2_A and MATCH2_H, respectively.

At least one of the first bank match signals MATCH1_A and MATCH1_H and at least one of the second bank match signals MATCH2_A and MATCH2_H are activated according to the bank flags BANKA_FLAG and BANKH_FLAG. Thus, the address changing unit 470h changes the initial refresh row address REF_ADDR only in at least one selected memory bank where the refresh leveraging is to be performed as indicated by the bank flags BANKA_FLAG and BANKH_FLAG.

The address changing unit 470h is located at the banks 365a and 365h. For example, the address changing unit 470h includes first inverters 471h and 481h, first multiplexers 472h and 482h, second inverters 473h and 483h, and second multiplexers 474h and 484h in the banks 365a and 365h, respectively. The respective final refresh row addresses CREF_ADDR from the address changing unit 470h is applied to the bank row decoders 360a, 360b, 360c, and 360d of FIG. 4, respectively.

In this manner, the refresh address generator 400h allows a weak cell row to be refreshed instead of a first strong cell row only in at least one bank where the refresh leveraging is to be performed as indicated by the bank flags BANKA_FLAG and BANKH_FLAG. Thus, refresh leveraging is performed on a bank basis, and a refresh period of the weak cell row is decreased without increasing the refresh current and the refresh power consumption.

Figure 27:
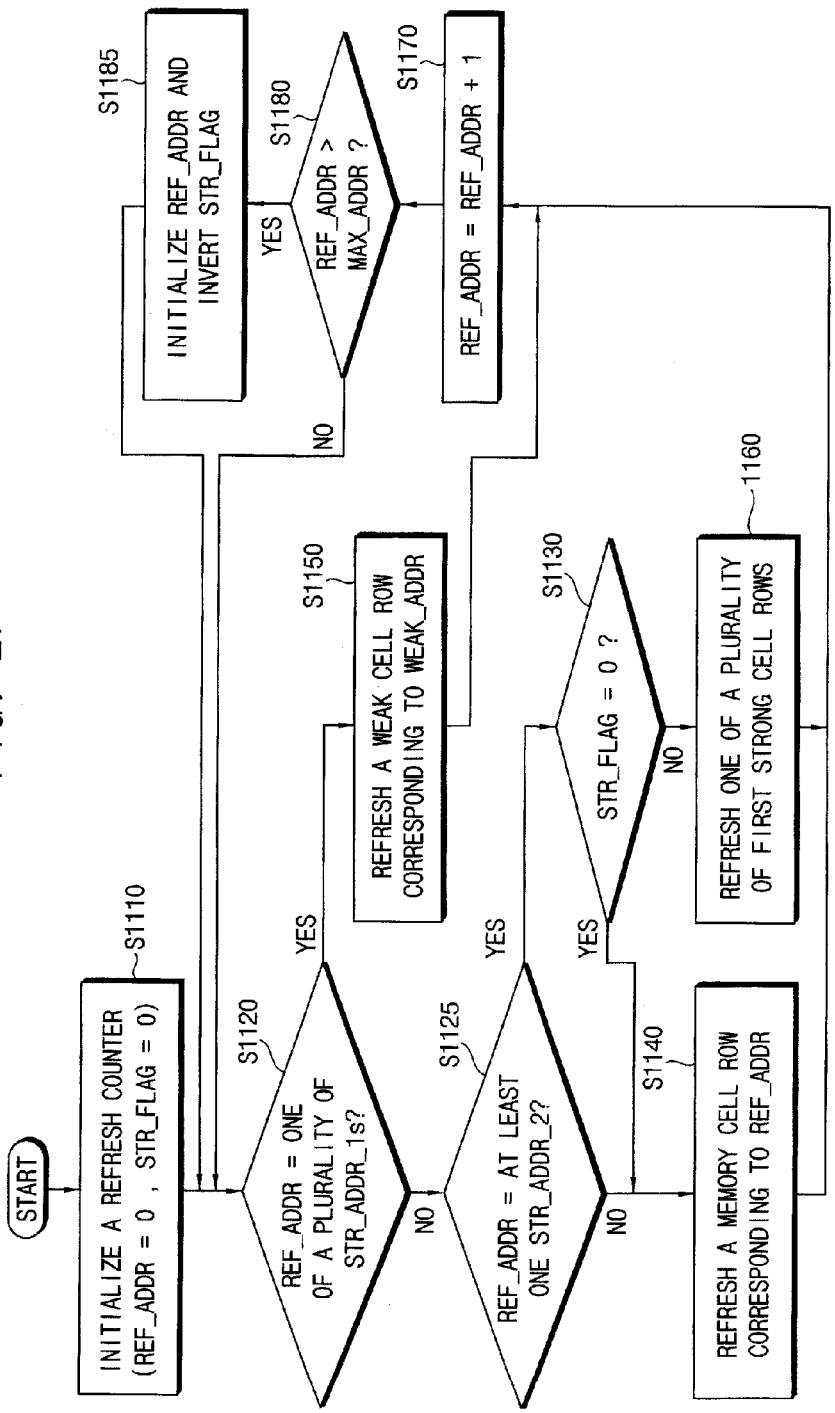
FIG. 27 is a flow chart of steps for refreshing a volatile memory device with refresh leveraging using a plurality of strong cell rows, according to an example embodiment of the present invention.

FIG. 27 is a flow chart of steps for refreshing a volatile memory device with refresh leveraging using a plurality of strong cell rows, according to an example embodiment of the present invention. In FIG. 27, a minimum retention time of each weak cell row is shorter than "refresh period(RP)/(L−1)" and longer than or equal to "refresh period(RP)/L", where L is an integer greater than 1. Furthermore, L−1 first strong cell row addresses STR_ADDR_1s and at least one second strong cell row address STR_ADDR_2 are selected for each weak cell row address WEAK_ADDR.

In FIG. 27 when a refresh operation is initiated, a refresh counter is initialized (S1110) to "0" for example, and a strong cell flag STR_FLAG is initialized to a logic low level. The initial refresh row address REF_ADDR is compared with the L−1 first strong cell row addresses STR_ADDR_1s (S1120) and the at least one second strong cell row address STR_ADDR_2 (S1125). In an example embodiment of the present invention, such comparisons (S1120) and (S1125) are performed substantially at the same time.

If the initial refresh row address REF_ADDR does not match any of the first strong cell row addresses STR_ADDR_1s (S1120: NO) and the second strong cell row address STR_ADDR_2 (S1125: NO), a memory cell row corresponding to the initial refresh row address REF_ADDR is refreshed (S1140). If the refresh row address REF_ADDR matches one of the first strong cell row addresses STR_ADDR_1s (S1120: YES), a weak cell row corresponding to the weak cell row address WEAK_ADDR is refreshed (S1150).

If the initial refresh row address REF_ADDR matches the second strong cell row address STR_ADDR_2 (S1125: YES) and the strong cell flag STR_FLAG is at a logic low level (S1130: YES), a memory cell row corresponding to the initial refresh row address REF_ADDR is refreshed (S1140). If the initial refresh row address REF_ADDR matches the second strong cell row address STR_ADDR_2 (S1125: YES) and the strong cell flag STR_FLAG is at a logic high level (S1130: NO), a first strong cell row corresponding to one of the first strong cell row addresses STR_ADDR_1s is refreshed (S1160).

The refresh row address REF_ADDR is incremented by 1 each time a memory cell row is refreshed (S1170). If the refresh row address REF_ADDR exceeds the maximum row address MAX_ADDR (S1180: YES), the refresh row address REF_ADDR is initialized, and the strong cell flag STR_FLAG is inverted (S1185) every refresh period RP.

In this manner, a weak cell row is refreshed instead of the plurality of first strong cell rows. Accordingly, even if a minimum retention time of the weak cell row is shorter than half the refresh period RP, the weak cell row is repeatedly refreshed before the minimum retention time, and the weak cell row need not be replaced with a row of redundancy cells. Furthermore, a refresh period of the weak cell row is decreased without increasing the refresh current and the refresh power consumption.

Figure 28:
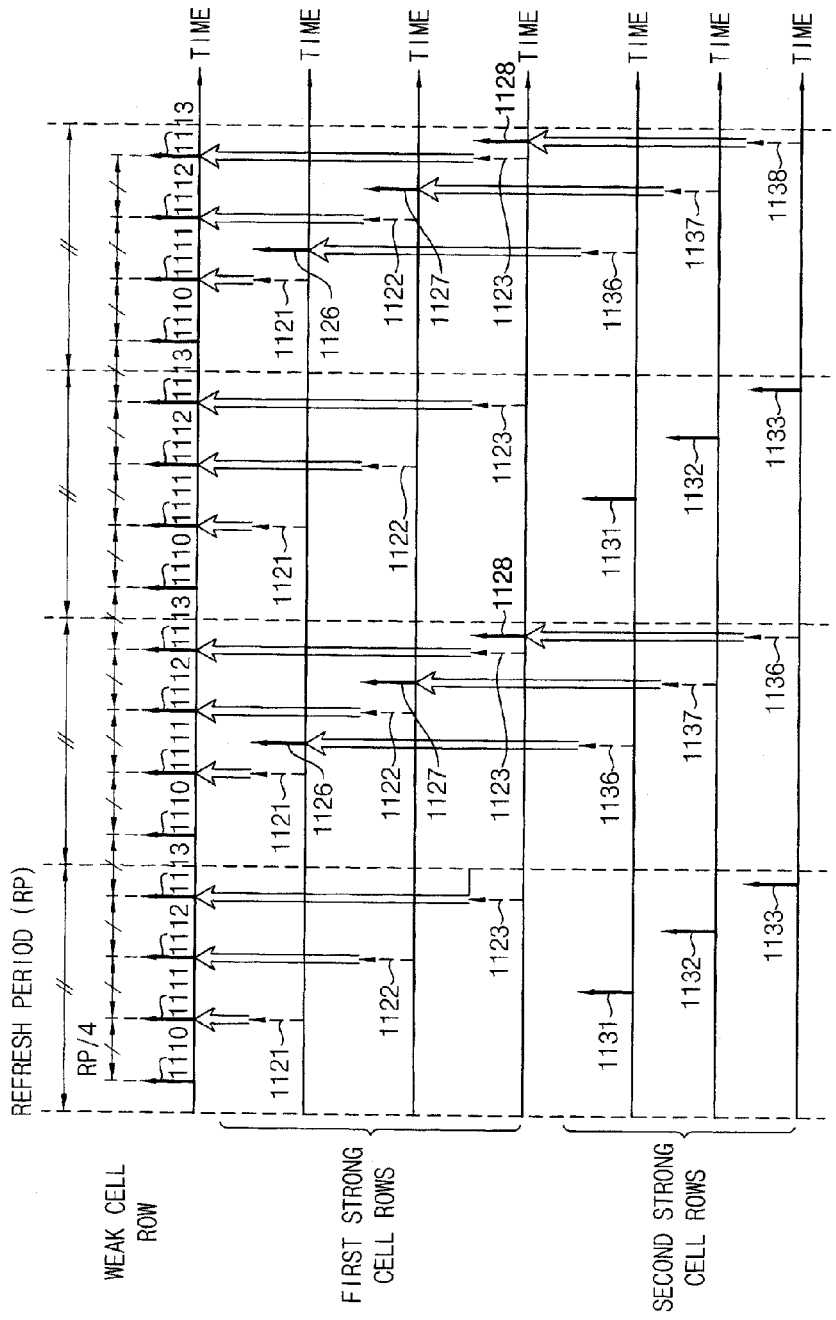
FIG. 28 is a timing diagram of example refreshes of a weak cell row and multiple first and second strong cell rows performed according to the refresh method of FIG. 27, according to an example embodiment of the present invention.

FIG. 28 is a timing diagram of example refreshes of a weak cell row and multiple first and second strong cell rows performed according to the refresh method of FIG. 27, in an example embodiment of the present invention. FIG. 28 illustrates an example of a weak cell row being refreshed instead of three first strong cell rows and with the three first strong cell rows and three second strong cell rows being alternately refreshed each refresh period RP.

Referring to FIG. 28, the weak cell row is refreshed four times per refresh period RP. For example in each refresh period RP, a refresh 1110 for the weak cell row is performed when a row address for the weak cell row is generated. In addition, refreshes 1111, 1112 and 1113 for the weak cell row are further performed instead of refreshes 1121, 1122 and 1123 for the first strong cell rows when row addresses for the first strong cell rows are generated.

Each of the first strong cell rows and the second strong cell rows are refreshed with a period 2RP that is double the refresh period RP. For example, refreshes 1131, 1132 and 1133 for the second strong cell rows are performed in odd-numbered refresh periods, and refreshes 1126, 1127 and 1128 for the first strong cell rows are performed instead of refreshes 1136, 1137 and 1138 for the second strong cell row in even-numbered refresh periods.

Figure 29:
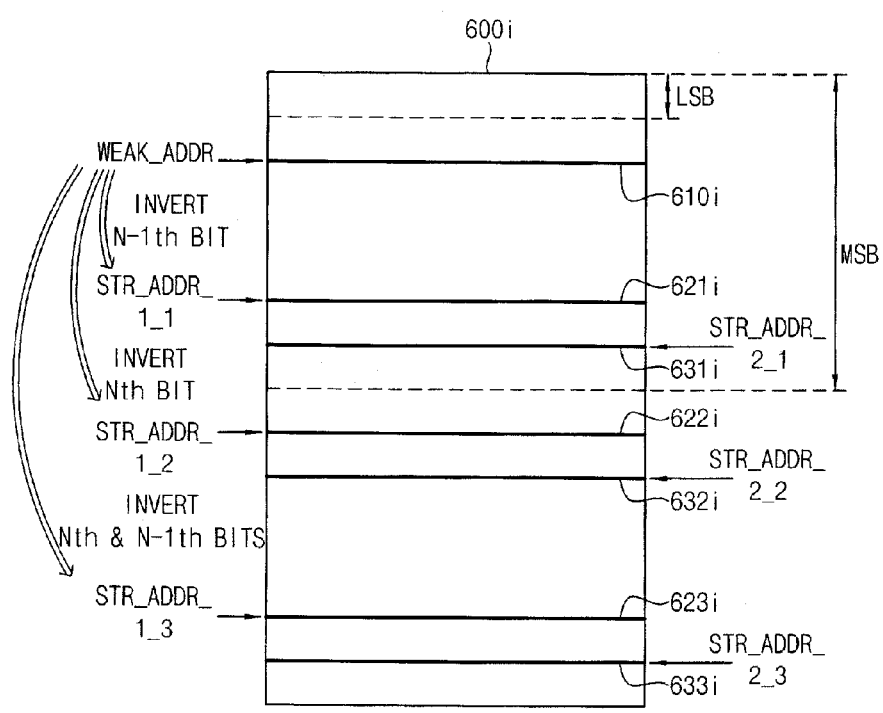
FIG. 29 is another example memory cell array with a weak cell row and multiple first and second strong cell rows, according to an example embodiment of the present invention.

FIG. 29 illustrates one bank array 600*i* of a memory device with a weak cell row and multiple first and second strong cell rows, according to an example embodiment of the present invention. FIG. 29 illustrates an example where a minimum retention time of a weak cell row 610*i* is shorter than "refresh period (RP)/3" and longer than or equal to "refresh period (RP)/4". FIG. 29 also illustrates three first strong cell rows 621*i*, 622*i* and 623*i* and three second strong cell rows 631*i*, 632*i* and 633*i* that are selected for the weak cell row 610*i*.

Referring to FIG. 29, one weak cell row address WEAK_ADDR for one weak cell row 610*i* is determined from testing the memory cell array. One STR_ADDR_1_1 of three strong cell row addresses for the first strong cell rows 621*i*, 622*i*, and 623*i* is determined by inverting an N−1-th bit of a weak cell row address WEAK_ADDR for the weak cell row 610*i*. Another one STR_ADDR_1_2 of the three strong cell row addresses is determined by inverting an N-th bit (i.e., the MSB) of the weak cell row address WEAK_ADDR. The other one STR_ADDR_1_3 of the three strong cell row addresses is determined by inverting the N-th bit and the N−1-th bit of the weak cell row address WEAK_ADDR.

The weak cell row 610*i* is refreshed instead of the three first strong cell rows 621*i*, 622*i*, and 623*i* corresponding to the three first strong cell row addresses STR_ADDR_1_1, STR_ADDR_1_2, and STR_ADDR_1_3. Thus, the weak cell row 610*i* is refreshed with a period of one quarter of the refresh period RP.

Any three memory cell rows having minimum retention times longer than or equal to double the refresh period RP may be selected as the three second strong cell rows 631*i*, 632*i*, and 633*i*. For example, three second strong cell row addresses STR_ADDR_2_1, STR_ADDR_2_2, and STR_ADDR_2_3 for the three second strong cell rows 631*i*, 632*i*, and 633*i* are determined by inverting LSBs of the three first strong cell row addresses STR_ADDR_1_1, STR_ADDR_1_2, and STR_ADDR_1_3.

Figure 31:
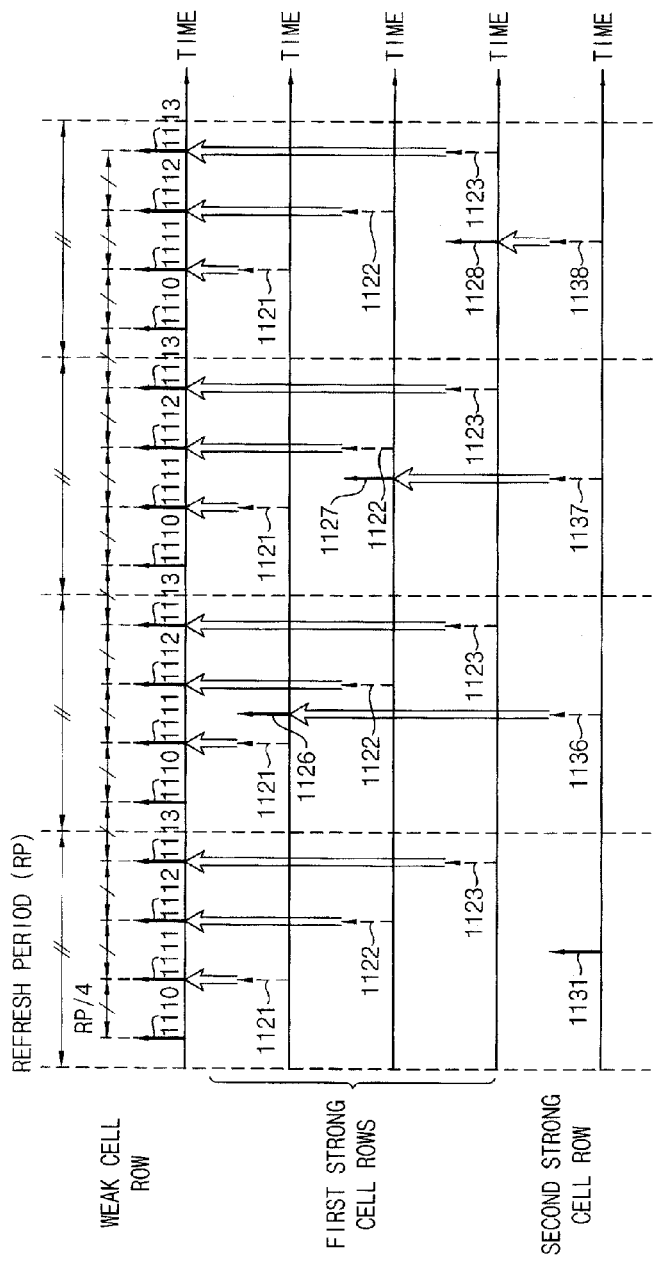
FIG. 31 is a timing diagram of example refreshes of a weak cell row, multiple first strong cell rows, and a second strong cell row performed according to the refresh method of FIG. 27, in an example embodiment of the present invention.

The method of determining the first and second strong cell rows 621*i*, 622*i*, 623*i*, 631*i*, 632*i*, and 633*i* of FIG. 29 may be applied to a case where the first and second strong cell rows 621*i*, 622*i*, 623*i*, 631*i*, 632*i*, and 633*i* have minimum retention times longer than or equal to double the refresh period RP. In an alternative embodiment of the present invention when strong cell rows have minimum retention times longer than or equal to four times the refresh period RP, three first strong cell rows and one second strong cell row may be selected for each weak cell row as illustrated in FIG. 31.

Figure 30:
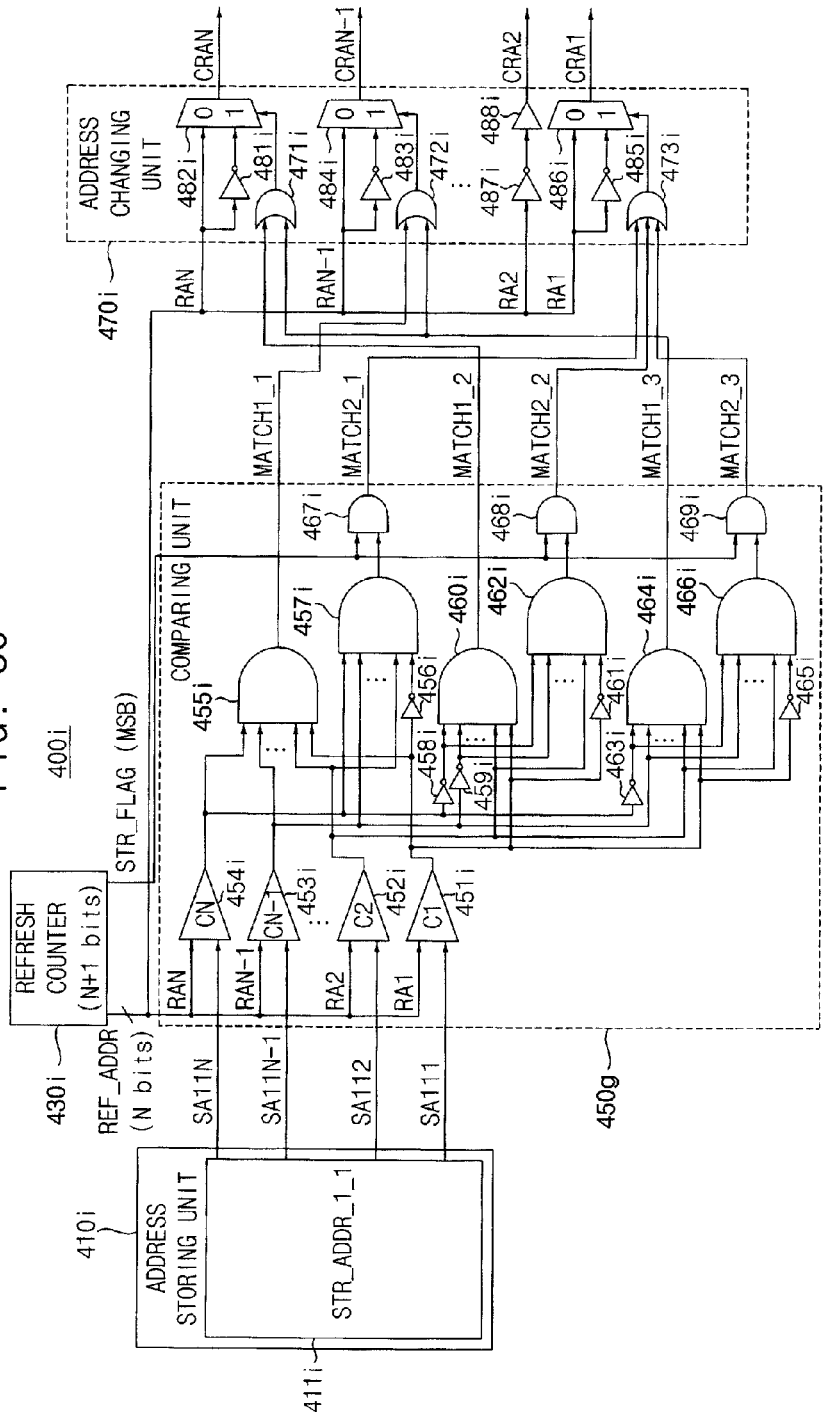
FIG. 30 is a block diagram of a refresh address generator for performing the refresh method of FIG. 27, according to an example embodiment of the present invention.

FIG. 30 is a block diagram of a refresh address generator 400*i* for performing the refresh method of FIG. 27, according to an example embodiment of the present invention. In FIG. 30, first and second strong cell row addresses STR_ADDR_1_1, STR_ADDR_1_2, STR_ADDR_1_3, STR_ADDR_2_1, STR_ADDR_2_2, and STR_ADDR_2_3 are determined as illustrated in FIG. 29.

The refresh address generator 400*i* includes an address storing unit 410*i*, a refresh counter 430*i*, a comparing unit 450*i*, and an address changing unit 470*i*. The address storing unit 410*i* includes a first storing region 411*i* for storing one of the first strong cell row addresses STR_ADDR_1_1, STR_ADDR_1_2, and STR_ADDR_1_3.

FIG. 30 illustrates the address storing unit 410*i* storing one first strong cell row address STR_ADDR_1_1 related to one weak cell row address WEAK_ADDR. However, the present invention may also be practiced with the address storing unit 410*i* storing more first strong cell row addresses for more weak cell row addresses.

The refresh counter 430*i* generates a refresh row address REF_ADDR and a strong cell flag STR_FLAG by counting.

The comparing unit 450*i* generates first match signals MATCH1_1, MATCH1_2, and MATCH1_3 from a comparison of the refresh row address REF_ADDR with the first strong cell row addresses STR_ADDR_1_1, STR_ADDR_1_2, and STR_ADDR_1_3, respectively. In addition, the comparing unit 450*i* generates second match signals MATCH2_1, MATCH2_2, and MATCH2_3 based on the strong cell flag STR_FLAG and from a comparison of the refresh row address REF_ADDR with the second strong cell row addresses STR_ADDR_2_1, STR_ADDR_2_2, and STR_ADDR_2_3, respectively.

The comparing unit 450*i* includes a plurality of comparators 451*i*, 452*i*, 453*i*, and 454*i*, and a plurality of logic gates 455*i*, 456*i*, 457*i*, 458*i*, 459*i*, 460*i*, 461*i*, 462*i*, 463*i*, 464*i*, 465*i*, 466*i*, 467*i*, 468*i* and 469*i*. The comparators 451*i*, 452*i*, 453*i*, and 454*i*, first inverters 458*i*, 459*i*, and 463*i*, and first AND gates 455*i*, 460*i*, and 464*i* are configured to activate one of the first match signals MATCH1_1, MATCH1_2, and MATCH1_3 when the refresh row address REF_ADDR matches a corresponding one of the first strong cell row addresses STR_ADDR_1_1, STR_ADDR_1_2, and STR_ADDR_1_3.

The comparators 451*i*, 452*i*, 453*i*, and 454*i*, second inverters 456*i*, 461*i*, and 465*i*, second AND gates 457*i*, 462*i*, and 466*i*, and third AND gates 467*i*, 468*i*, and 469*i* are configured to activate one of the second match signals MATCH2_1, MATCH2_2, and MATCH2_3 when the refresh row address REF_ADDR matches a corresponding one of the second strong cell row addresses STR_ADDR2_1, STR_ADDR_2_2, and STR_ADDR_2_3 and the strong cell flag STR_FLAG is at a logic high level.

FIG. 30 shows the comparing unit 450*i* including a set of the comparators 451*i*, 452*i*, 453*i*, and 454*i* and the logic gates 455*i*, 456*i*, 457*i*, 458*i*, 459*i*, 460*i*, 461*i*, 462*i*, 463*i*, 464*i*, 465*i*, 466*i*, 467*i*, 468*i*, and 469*i* for one weak cell row address WEAK_ADDR. However, the present invention may also be practiced with the comparing unit 450*i* having more corresponding sets of comparators and logic gates for more weak cell row addresses.

The address changing unit 470*i* includes a plurality of OR gates 471*i*, 472*i* and 473*i*, a plurality of inverters 481*i*, 483*i*, 485*i*, 487*i* and 488*i*, and a plurality of multiplexers 482*i*, 484*i*, and 486*i*. Such components of the address changing unit 470*i* are configured to output the weak cell row address WEAK_ADDR as a final refresh row address CREF_ADDR when one of the first match signals MATCH1_1, MATCH1_2, and MATCH1_3 is at a logic high level. The address changing unit 470*i* outputs a respective one of the first strong cell row addresses STR_ADDR_1_1, STR_ADDR_1_2, and STR_ADDR_1_3 as the final refresh row address CREF_ADDR when a corresponding one of the second match signals MATCH1_1, MATCH1_2, and MATCH1_3 is at a logic high level.

In this manner, the refresh address generator 400*i* outputs the weak cell row address WEAK_ADDR when the refresh counter 430*i* generates one of the first strong cell row addresses STR_ADDR_1_1, STR_ADDR_1_2, and STR_ADDR_1_3. Accordingly even if a minimum retention time of the weak cell row is shorter than half a refresh period RP, the weak cell row is repeatedly refreshed before the minimum retention time, and the weak cell row need not be replaced with a row of redundancy cells. Furthermore, a refresh period of the weak cell row is decreased without increasing the refresh current and the refresh power consumption.

FIG. 31 is a timing diagram of example refreshes of a weak cell row, multiple first strong cell rows, and a second strong cell row performed according to the refresh method of FIG. 27, in an example embodiment of the present invention. In FIG. 31, a weak cell row is refreshed instead of three first strong cell rows, and the three first strong cell rows and one second strong cell row are alternately refreshed with a period corresponding to about four times a refresh period RP.

Referring to FIG. 31, a weak cell row is refreshed four times per refresh period RP. For example during each refresh period RP, a refresh 1110 for the weak cell row is performed when a row address for the weak cell row is generated, and further refreshes 1111, 1112 and 1113 for the weak cell row are performed instead of refreshes 1121, 1122 and 1123 for the first strong cell rows when row addresses for the first strong cell rows are generated.

Each of the first strong cell rows and the second strong cell row is refreshed with a period corresponding to four times the refresh period RP. For example, a refresh 1131 for the second strong cell row is performed in 4I+1-th refresh periods, where I is an integer greater than or equal to 0. In addition, a refresh 1126 for one of the first strong cell rows is performed instead of a refresh 1136 for the second strong cell row in 4I+2-th refresh periods. A refresh 1127 for another one of the first strong cell rows is performed instead of a refresh 1137 for the second strong cell row in 4I+3-th refresh periods. A refresh 1128 for the other one of the first strong cell rows is performed instead of a refresh 1138 for the second strong cell row in 4I+4-th refresh periods.

In this example, an N+2 bit refresh counter may be used to alternately refresh the first strong cell rows and the second strong cell row with a period of four times the refresh period RP. In this case, upper 2 bits of count generated by the N+2 bit counter is used as a strong cell flag of 2 bits for selecting one of the three first strong cell rows and the one second strong cell row. The first strong cell rows and the second strong cell row refreshed as illustrated in FIG. 31 may have minimum retention times longer than or equal to four times the refresh period RP.

Figure 32:
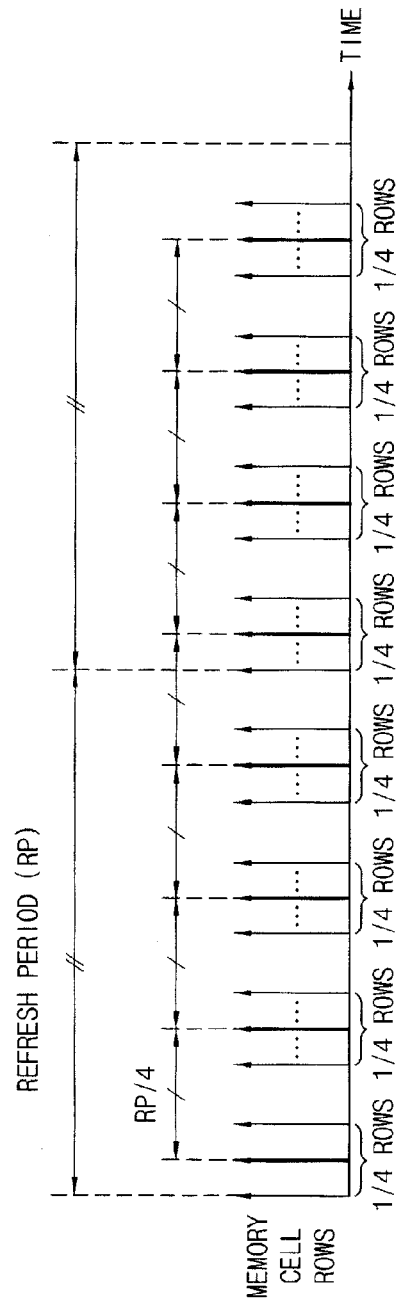
FIG. 32 is a timing diagram illustrating example refreshes performed in a burst mode for every quarter of rows of a memory array, according to an example embodiment of the present invention.

FIG. 32 is a timing diagram illustrating example refreshes performed in a burst mode for every quarter of rows of a memory array, according to an example embodiment of the present invention. For example, a quarter of memory cell rows of a memory cell array are consecutively refreshed. In this case, four refreshes for a weak cell row are performed when the four quarters of the memory cell rows are refreshed, respectively. Accordingly, even in a burst refresh mode, the weak cell row is refreshed with a period RP/4 that is a quarter of the refresh period RP.

Figure 33:
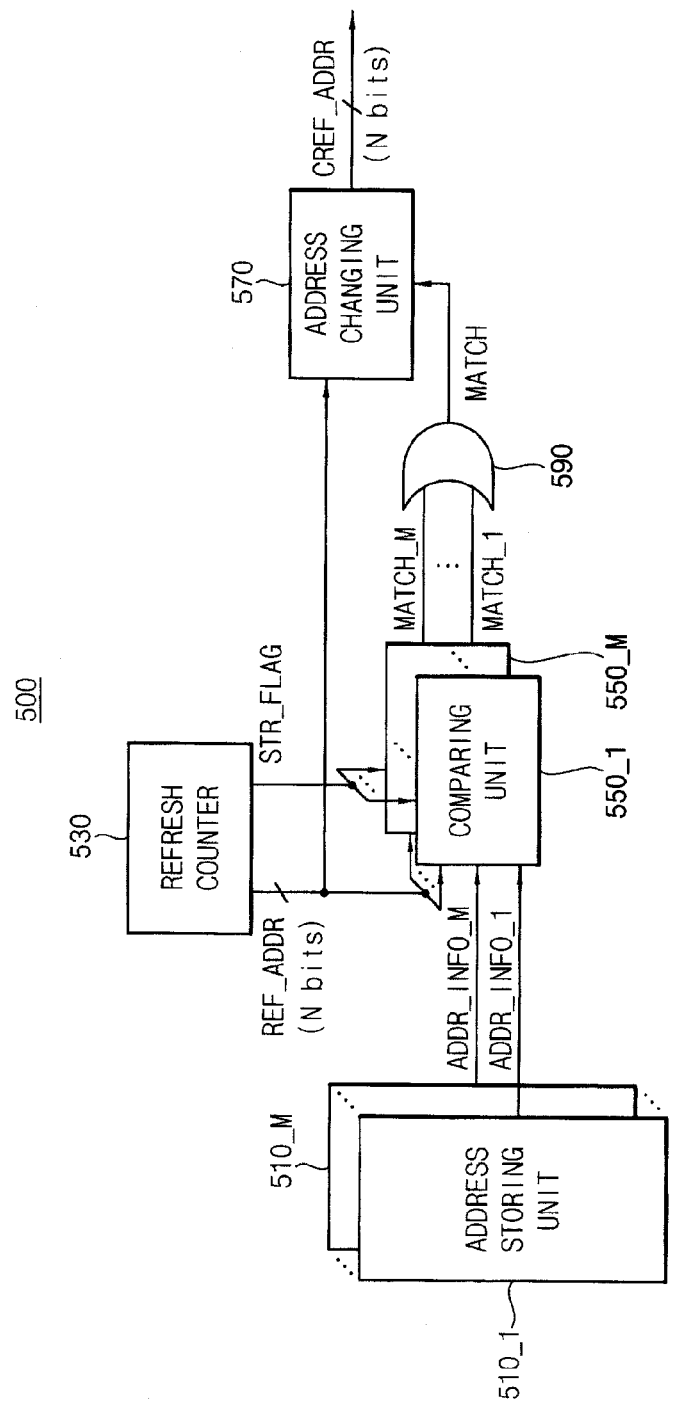
FIG. 33 is a block diagram of a refresh address generator included in the volatile memory device of FIG. 4 with multiple comparing units, according to another example embodiment of the present invention.

FIG. 33 is a block diagram of a refresh address generator 500 included in the volatile memory device of FIG. 4 with multiple comparing units, according to another example embodiment of the present invention. The refresh address generator 500 includes a plurality of address storing units 510_1 and 510_M, a refresh counter 530, a plurality of comparing units 550_1 and 550_M, an OR operating unit 590, and an address changing unit 570.

The plurality of address storing units 510_1 and 510_M store a plurality of address information ADDR_INFO_1 and ADDR_INFO_M for a plurality of weak cell rows, respectively. In an example embodiment of the present invention, each of the address information ADDR_INFO_1 and ADDR_INFO_M includes at least one respective weak cell row address and strong cell row addresses related to the weak cell row address. Alternatively, each of the address information ADDR_INFO_1 and ADDR_INFO_M includes a result of a predetermined operation (e.g., an XOR operation) performed on the weak cell row address and/or the strong cell row addresses.

In one embodiment of the present invention, the plurality of address storing units 510_1 and 510_M is implemented with one storage device. Alternatively, the plurality of address storing units 510_1 and 510_M is implemented with a plurality of storage devices. For example, each storage device may be an electrically programmable fuse memory, a laser-programmable fuse memory, an anti-fuse memory, a one-time programmable memory, a flash memory, or other types of nonvolatile memories.

The refresh counter 530 counts to generate an initial refresh row address REF_ADDR having N bits, where N is an integer greater than 1. The refresh counter 530 further generates a strong cell flag STR_FLAG for controlling refreshes of strong cell rows. In an example embodiment of the present invention, the refresh counter 530 is an N+M bit counter, where M is an integer greater than 0.

The comparing units 550_1 and 550_M are coupled to the address storing units 510_1 and 510_M, respectively. The comparing units 550_1 and 550_M compare the refresh row address REF_ADDR from the refresh counter 530 with the respective address information ADDR_INFO_1 and ADDR_INFO_M read from the respective address storing units 510_1 and 510_M to generate respective match signals MATCH_i and MATCH_M based the strong cell flag STR_FLAG. The OR operating unit 590 generates a match signal MATCH by performing an OR operation on the match signals MATCH_1 and MATCH_M.

The address changing unit 570 may change the initial refresh row address REF_ADDR in response to the match signal MATCH. For example, the address changing unit 570 changes the initial refresh row address REF_ADDR into a weak cell row address or a first strong cell row address.

In this manner, the refresh address generator 500 stores the address information ADDR_INFO_1 and ADDR_INFO_M for the plurality of weak cell rows to allow the weak memory cell rows to be refreshed instead of the strong cell rows. Accordingly, refresh periods of the weak cell rows is decreased without increasing the refresh current and the refresh power consumption.

Figure 34:
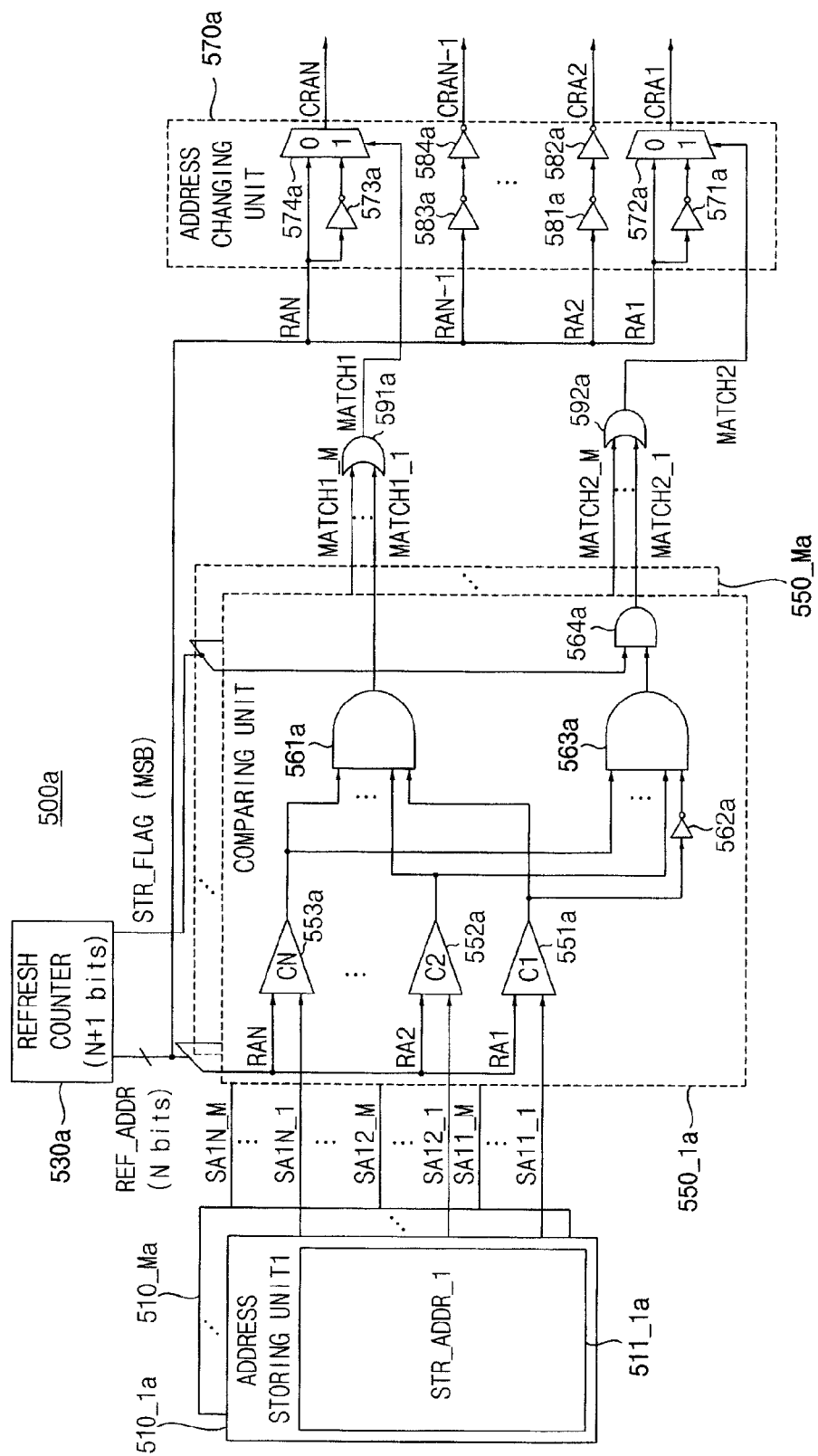
FIG. 34 is a block diagram of an example refresh address generator with multiple comparing units, according to another example embodiment of the present invention.

FIG. 34 is a block diagram of an example refresh address generator 500a with multiple comparing units, according to another example embodiment of the present invention. In FIG. 34, first strong cell row addresses STR_ADDR_1 are determined by inverting MSBs of weak cell row addresses, and second strong cell row addresses are determined by inverting LSBs of the first strong cell row addresses STR_ADDR_1.

The refresh address generator 500a includes a plurality of address storing units 510_1a and 510_Ma, a refresh counter 530a, a plurality of comparing units 550_1a and 550_Ma, OR operation units 591a and 592a, and an address changing unit 570a.

The address storing units 510_1a and 510_Ma each include a respective storing region 511_1a for storing a respective first strong cell row address STR_ADDR_1 related to a respective weak row address. In an alternative embodiment of the present invention, the address storing units 510_1a and 510_Ma store a plurality of second strong cell row addresses or a plurality of weak cell row addresses instead of the first strong cell row addresses STR_ADDR_1.

The address storing units 510_1a and 510_Ma provide the first strong cell row addresses STR_ADDR_1 to the comparing units 550_1a and 550_Ma, respectively. For example, a first address storing unit 510_1a outputs first through N-th bits SA11_1, SA12_1, and SA1N_1 of a respective one of the first strong cell row addresses STR_ADDR_1 to a first comparing unit 550_1a. Similarly, an M-th address storing unit 510_Ma outputs first through N-th bits SA11_M, SA12_M, and SA1N_M of a respective one of the first strong cell row addresses STR_ADDR_1 to an M-th comparing unit 550_Ma.

The refresh counter 530a generates an initial refresh row address REF_ADDR and a strong cell flag STR_FLAG by counting. The refresh counter 530a is an N+1 bit counter with the MSB of the count being the strong cell flag STR_FLAG, and the lower N bits of the count being used as the initial refresh row address REF_ADDR.

The comparing units 550_1a and 550_Ma generate a plurality of first match signals MATCH1_1 and MATCH1_M by comparing the initial refresh row address REF_ADDR with the respective first strong cell row addresses STR_ADDR_1. The comparing units 550_1a and 550_Ma also generate a plurality of second match signals MATCH2_1 and MATCH2_M based on the strong cell flag STR_FLAG and from a comparison of the initial refresh row address REF_ADDR with the respective second strong cell row addresses.

Each comparing unit 550_1a or 550_Ma includes a respective plurality of comparators 551a, 552a, and 553a and a respective plurality of logic gates 561a, 562a, 563a, and 564a. The OR operation units 591a and 592a are a first OR gate 591a and a second OR gate 592a. The first OR gate 591a generates a first match signal MATCH1 by performing a first OR operation on the plurality of first match signals MATCH1_1 and MATCH1_M. The second OR gate 592a generates a second match signal MATCH2 by performing a second OR operation on the plurality of second match signals MATCH2_1 and MATCH2_M.

For example, if the refresh row address REF_ADDR matches one of the plurality of first strong cell row addresses STR_ADDR_1, a corresponding one of the plurality of first match signals MATCH1_1 and MATCH1_M is at a logic high level such that the first OR gate 591a outputs the first match signal MATCH1 with a logic high level. If the refresh row address REF_ADDR matches one of the plurality of second strong cell row addresses and the strong cell flag STR_FLAG is at a logic high level, a corresponding one of the plurality of second match signals MATCH2_1 and MATCH2_M is at a logic high level such that the second OR gate 592a outputs the second match signal MATCH2 with a logic high level.

The address changing unit 570a includes inverters 571a, 573a, 581a, 582a, 583a, and 584a and multiplexers 572a and 574a. Such components are configured to output a corresponding weak cell row address by inverting the MSB of the refresh row address REF_ADDR in response to the first match signal MATCH1. Alternatively, the address changing unit 570a outputs a corresponding first strong cell row address by inverting the LSB of the refresh row address REF_ADDR in response to the second match signal MATCH2.

In this manner, the refresh address generator 500a outputs a corresponding weak cell row address when the refresh counter 530a generates one of the plurality of first strong cell row addresses STR_ADDR_1. In addition, the refresh address generator 500a alternately outputs one of the first strong cell row addresses or one of the second strong cell row addresses each refresh period RP when the refresh counter 530a generates one of the second strong cell row addresses. Accordingly, the refresh address generator 500a allows weak cell rows to be refreshed instead of first strong cell rows to decrease refresh periods of the weak cell rows without increasing the refresh current and the refresh power consumption.

Figure 35:
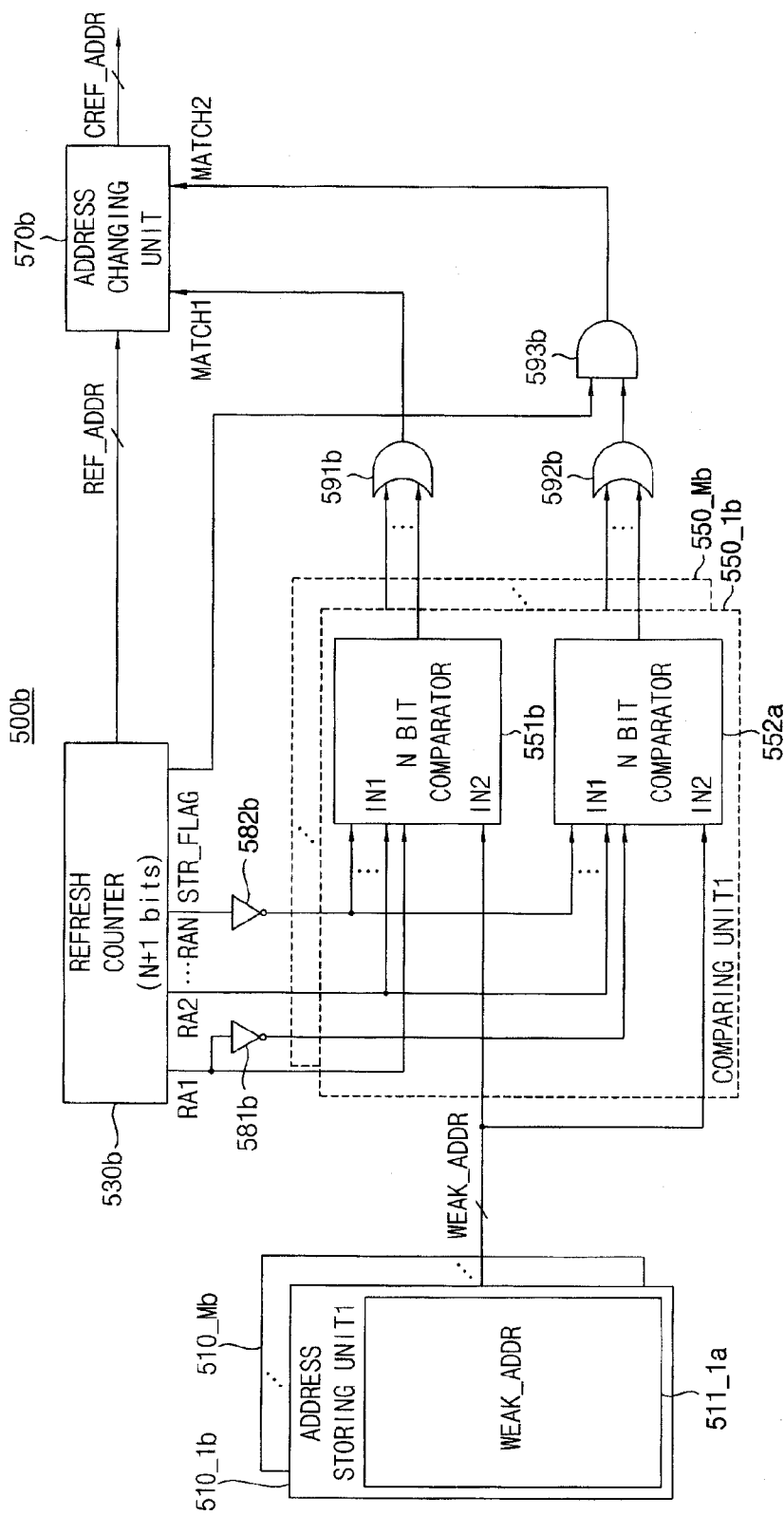
FIG. 35 is a block diagram of another refresh address generator with multiple comparing units, according to another example embodiment of the present invention.

FIG. 35 is a block diagram of another refresh address generator 500b with multiple comparing units, according to another example embodiment of the present invention. In FIG. 35, first strong cell row addresses are determined by inverting the respective MSB of weak cell row addresses WEAK_ADDR, and second strong cell row addresses are determined by inverting the LSB of the first strong cell row addresses.

The refresh address generator 500b includes a plurality of address storing units 510_1b and 510_Mb, a refresh counter 530b, first and second inverters 581b and 582b, a plurality of comparing units 550_1b and 550_Mb, an address changing unit 570b, and an OR operation unit with a first OR gate 591b, a second OR gate 592b, and an AND gate 593b. Each of the address storing units 510_1b and 510_Mb includes a respective storing region 511_1a for storing a respective weak cell row address.

In an alternative embodiment of the present invention, the address storing units 510_1b and 510_Mb store a plurality of first strong cell row addresses or a plurality of second strong cell row addresses instead of the plurality of weak cell row addresses WEAK_ADDR. The address storing units 510_1a and 510_Ma provide the weak cell row addresses WEAK_ADDR to the respective comparing units 550_1b and 550_Mb.

The refresh counter 530b generates an initial refresh row address REF_ADDR and a strong cell flag STR_FLAG by counting. The first inverter 581b inverts a first bit RA1 of the refresh row address REF_ADDR, and the second inverter 582b inverts an N-th bit RAN of the refresh row address REF_ADDR. The number or connections of the inverters 581b and 582b may vary according to a method in which the first and second strong cell rows are selected and/or according to address information stored in the plurality of address storing units 510_1b and 510_Mb. For example in a case where the plurality of first strong cell row addresses are stored in the address storing units 510_1b and 510_Mb, the refresh address generator may not include the second inverter 582b.

The plurality of comparing units 550_1b and 550_Mb receive a first bit, an inverted first bit, second through N-th bits, and an inverted N-th bit of the refresh row address REF_ADDR from the refresh counter 530b and the inverters 581b and 582b. The plurality of comparing units 550_1b and 550_Mb further receive the weak cell row addresses WEAK_ADDR from the address storing units 510_1b and 510_Mb, respectively.

Each of the comparing units 550_1b and 550_Mb includes a first N bit comparator 551b and a second N bit comparator 552b. The first N bit comparator 551b receives the first through N−1-th bits and the inverted N-th bit of the refresh row address REF_ADDR at a first input terminal IN1. The first N bit comparator 551b also receives the weak cell row address WEAK_ADDR at a second input terminal IN2.

The first N bit comparator 551b generates an output signal with a logic high level when the first through N−1-th bits and the inverted N-th bit of the refresh row address REF_ADDR match first through N-th bits of the weak cell row address WEAK_ADDR. Thus, when the refresh row address REF_ADDR matches a first strong cell row address, the first N bit comparator 551b generates the output signal with a logic high level.

The second N bit comparator 552b receives the inverted first bit, the second through N−1-th bits, and the inverted N-th bit of the refresh row address REF_ADDR at a first input terminal IN1. The second N bit comparator 552b also receives the weak cell row address WEAK_ADDR at a second input terminal IN2.

The second N bit comparator 552b generates an output signal with a logic high level when the inverted first bit, the second through N−1-th bits, and the inverted N-th bit of the refresh row address REF_ADDR match the first through N-th bits of the weak cell row address WEAK_ADDR. Thus, when the initial refresh row address REF_ADDR matches a second strong cell row address, the second N bit comparator 552b generates the output signal with a logic high level.

The first OR gate 591b generates a first match signal MATCH1 by performing an OR operation on output signals of the first N bit comparators 551b of the plurality of comparing units 550_1b and 550_Mb. The first OR gate 591b outputs the first match signal MATCH1 with a logic high level when the refresh row address REF_ADDR matches one of the plurality of first strong cell row addresses.

The second OR gate 592b performs an OR operation on output signals of the second N bit comparators 552b of the plurality of comparing units 550_1b and 550_Mb. The AND gate 593b performs an AND operation on an output signal of the second OR gate 592b and the strong cell flag STR_FLAG. The second OR gate 592b and the AND gate 593b are configured to generate a second match signal MATCH2 with a logic high level when the refresh row address REF_ADDR matches one of the plurality of second strong cell row addresses and when the strong cell flag STR_FLAG has a logic high level.

The address changing unit 570b may change the initial refresh row address REF_ADDR into a corresponding weak cell row address in response to the first match signal MATCH1. The address changing unit 570b may also change the refresh row address REF_ADDR into a corresponding first strong cell row address in response to the second match signal MATCH2. In this manner, the refresh address generator 500b allows weak cell rows to be refreshed instead of first strong cell rows to decrease refresh periods of the weak cell rows without increasing the refresh current and the refresh power consumption.

Figure 36:
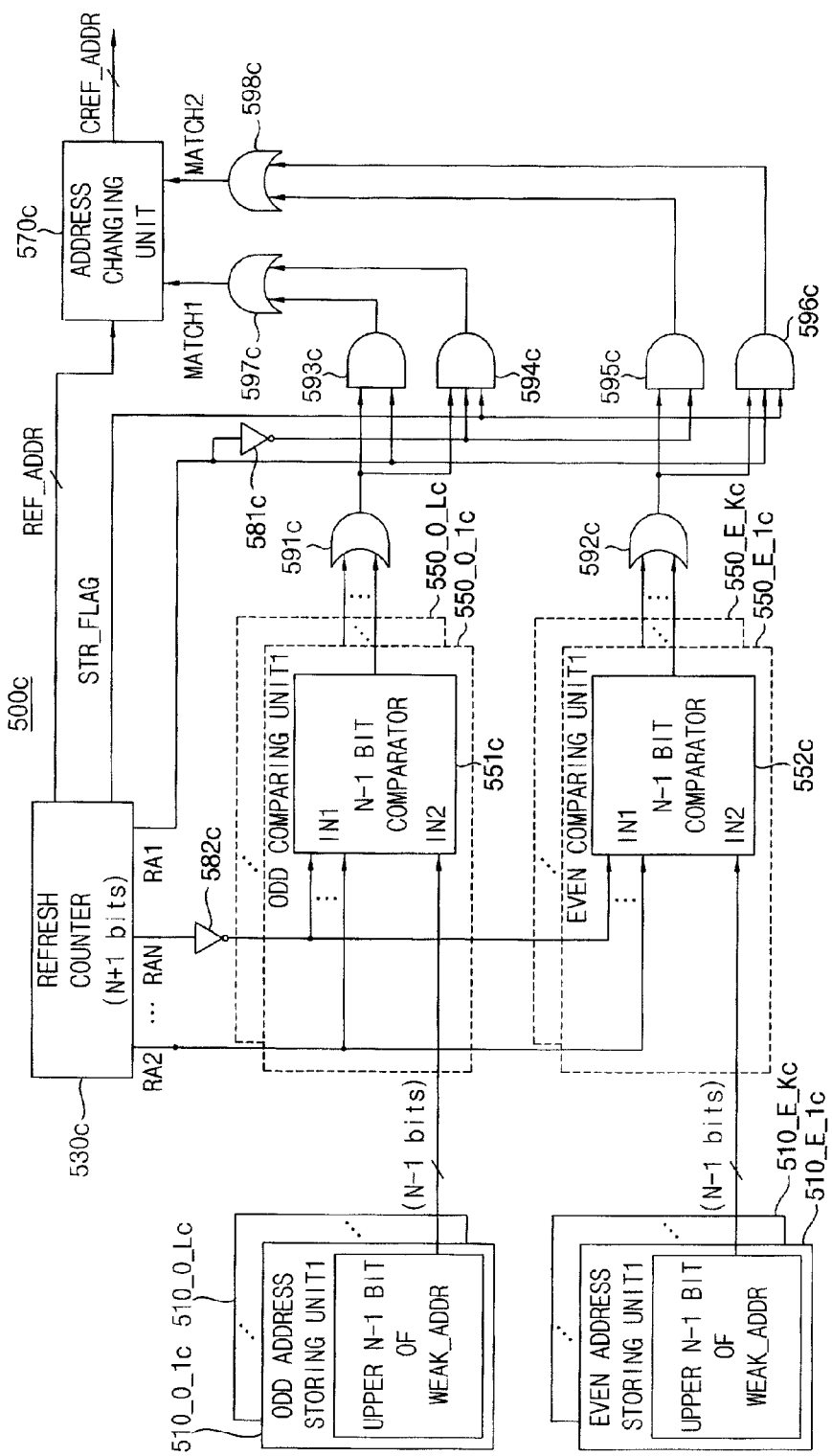
FIG. 36 is a block diagram of another refresh address generator with multiple comparing units, according to another example embodiment of the present invention.

FIG. 36 is a block diagram of another refresh address generator 500c with multiple comparing units, according to another example embodiment of the present invention. In FIG. 36, first strong cell row addresses are determined by inverting the MSBs of weak cell row addresses WEAK_ADDR. In addition, the second strong cell row addresses are determined by inverting the LSBs of the first strong cell row addresses.

The refresh address generator 500c includes a plurality of odd address storing units 510_O_1c and 510_O_Lc, a plurality of even address storing units 510_E_1c and 510_E_Kc, a refresh counter 530c, first and second inverters 581c and 582c, and a plurality of odd comparing units 550_O_1c and 550_O_Lc. The refresh address generator 500c also includes a plurality of even comparing units 550_E_1c and 550_E_Kc, an OR operation unit with first and second OR-gates 591c and 592c, a plurality of logic gates 593c, 594c, 595c, 596c, 597c and 598c, and an address changing unit 570c.

In the refresh address generator 500c according to an example embodiment of the present invention, the address storing units 510_O_1c, 510_O_Lc, 510_E_1c, and 510_E_Kc are divided into a plurality of groups. In addition, a row address to be stored in the address storing units 510_O_1c, 510_O_Lc, 510_E_1c, and 510_E_Kc may be stored in an address storing unit included in a corresponding group according to at least one bit of the row address. For example, M address storing units 510_O_1c, 510_O_Lc, 510_E_1c and 510_E_Kc are divided into a first group including L odd address storing units 510_O_1c and 510_O_Lc and a second group including K even address storing units 510_E_1c and 510_E_Kc, where L is an integer greater than 0, K is an integer greater than 0, and M is L+K.

Upper N−1 bits of a weak cell row address WEAK_ADDR with the LSB being "1" is stored in the odd address storing units 510_O_1c and 510_O_Le. Upper N−1 bits of a weak cell row address WEAK_ADDR with the LSB being "0" is stored in the even address storing units 510_E_1c and 510_E_Kc. In an example embodiment of the present invention, L and K have different values. Alternatively, L and K have the same value of M/2.

The refresh counter 530c generates an initial refresh row address REF_ADDR and a strong cell flag STR_FLAG by counting. The first inverter 581c inverts a first bit RA1 of the refresh row address REF_ADDR, and the second inverter 582c inverts an N-th bit RAN of the refresh row address REF_ADDR. The number or connections of the inverters 581c and 582c may vary according to a method of selecting the first and second strong cell rows and/or according to address information stored in the address storing units 510_O_1c, 510_O_Lc, 510_E_1c, and 510_E_Kc.

The plurality of comparing units 550_O_1c, 550_O_Lc, 550_E_1c, and 550_E_Kc are coupled to the plurality of address storing units 510_O_1c, 510_O_Lc, 510_E_1c, and 510_E_Kc, respectively. The plurality of comparing units 550_O_1c, 550_O_Lc, 550_E_1c, and 550_E_Kc are divided into a plurality of groups similarly to the plurality of address storing units 510_O_1c, 510_O_Lc, 510_E_1c, and 510_E_Kc. For example, M comparing units 550_O_1c, 550_O_Lc, 550_E_1c, and 550_E_Kc are divided into a first group including L odd comparing units 550_O_1c and 550_O_Lc and a second group including K even comparing units 550_E_1c and 550_E_Kc.

The odd comparing units 550_O_1c and 550_O_Lc receive second through N-th bits and an inverted N-th bit of the refresh row address REF_ADDR from the refresh counter 530c. In addition, the odd comparing units 550_O_1c and 550_O_Lc also receive upper N−1 bits of the weak cell row address WEAK_ADDR from the odd address storing units 510_O_1c and 510_O_Lc.

The even comparing units 550_E_1c and 550_E_Kc receive the second through N-th bits and the inverted N-th bit of the refresh row address REF_ADDR from the refresh counter 530c. The even comparing units 550_E_1c and 550_E_Kc also receive upper N−1 bits of the weak cell row address WEAK_ADDR from the even address storing units 510_E_1c and 510_E_Kc.

Each odd comparing unit 550_O_1c or 550_O_Lc includes a first N−1 bit comparator 551c, and each even comparing unit 550_E_1c or 550_E_Kc includes a second N−1 bit comparator 552c. Each of the first N−1 bit comparator 551c and the second N−1 bit comparator 552c compares the upper N−1 bits of the refresh row address REF_ADDR of which an N-th bit RAN (i.e., MSB) is inverted with the upper N−1 bits of the weak cell row address WEAK_ADDR.

The first OR gate 591c performs an OR operation on output signals of the odd comparing units 550_O_1c and 550_O_Lc. The second OR gate 592c performs an OR operation on output signals of the even comparing units 550_E_1c and 550_E_Kc.

The logic gates 593c, 594c, 595c, 596c, 597c, and 598c are configured to generate a first match signal MATCH1 and a second match signal MATCH2 based on output signals of the first and second OR gates 591c and 592c, a first bit RA1 and an inversion thereof of the refresh row address REF_ADDR, and the strong cell flag STR_FLAG. A first AND gate 593c performs an AND operation on the output signal of the first OR gate 591c and the first bit RA1 of the refresh row address REF_ADDR. The second AND gate 595*c* performs an AND operation on the output signal of the second OR gate 592*c* and the inverted first bit of the refresh row address REF_ADDR.

When the upper N−1 bits of the refresh row address REF_ADDR with the MSB being inverted match the upper N−1 bits of the weak cell row address WEAK_ADDR, and when the first bit RA1 (i.e., LSB) of the refresh row address REF_ADDR is "1", the first AND gate 593*c* generates an output signal with a logic high level. Since the weak cell row address WEAK_ADDR with the LSB being "1" is stored in the odd address storing units 510_O_1*c* and 510_O_L*c*, the first AND gate 593*c* generates the output signal with a logic high level when only the MSB is different between the refresh row address REF_ADDR and the weak cell row address WEAK_ADDR (i.e., when the initial refresh row address REF_ADDR matches a first strong cell row address).

When the upper N−1 bits of the refresh row address REF_ADDR with the MSB being inverted match the upper N−1 bits of the weak cell row address WEAK_ADDR, and when the LSB of the refresh row address REF_ADDR is "0", the second AND gate 595*c* generates an output signal with a logic high level. Since the weak cell row address WEAK_ADDR with the LSB being "0" is stored in the even address storing units 510_E_1*c* and 510_E_K*c*, the second AND gate 595*c* generates the output signal with a logic high level when only the MSB is different between the refresh row address REF_ADDR and the weak cell row address WEAK_ADDR (i.e., when the refresh row address REF_ADDR matches a first strong cell row address).

A third AND gate 594*c* performs an AND operation on the output signal of the first OR gate 591*c*, the inverted first bit of the refresh row address, and the strong cell flag STR_FLAG. A fourth AND gate 596*c* performs an AND operation on the output signal of the second OR gate 592*c*, the first bit RA1 of the refresh row address REF_ADDR, and the strong cell flag STR_FLAG.

When the upper N−1 bits of the refresh row address REF_ADDR with the MSB being inverted matches the upper N−1 bits of the weak cell row address WEAK_ADDR, and when the LSB of the refresh row address REF_ADDR is "0", and when the strong cell flag STR_FLAG is at a logic high level, the third AND gate 594*c* generates an output signal with a logic high level. Since the weak cell row address WEAK_ADDR with the LSB being "1" is stored in the odd address storing units 510_O_1*c* and 510_O_L*c*, the third AND gate 594*c* generates the output signal with a logic high level when the refresh row address REF_ADDR matches a second strong cell row address and when the strong cell flag STR_FLAG has a logic high level.

When the upper N−1 bits of the refresh row address REF_ADDR with the MSB being inverted match the upper N−1 bits of the weak cell row address WEAK_ADDR, the LSB of the refresh row address REF_ADDR is "1", and the strong cell flag STR_FLAG is at a logic high level, the fourth AND gate 596*c* generates an output signal with a logic high level. Since the weak cell row address WEAK_ADDR with the LSB being "0" is stored in the even address storing units 510_E_1*c* and 510_E_K*c*, the fourth AND gate 596*c* generates the output signal with a logic high level when the refresh row address REF_ADDR matches a second strong cell row address and when the strong cell flag STR_FLAG has a logic high level.

The third OR gate 597*c* generates the first match signal MATCH1 by performing an OR operation on the output signals of the first and third AND gates 593*c* and 594*c*. The third OR gate 597*c* generates the first match signal MATCH1 with a logic high level when the refresh row address matches one of a plurality of first strong cell row addresses.

The fourth OR gate 598*c* generates the second match signal MATCH2 by performing an OR operation on the output signals of the second and fourth AND gates 595*c* and 596*c*. The fourth OR gate 598*c* generates the second match signal MATCH2 with a logic high level when the refresh row address matches one of a plurality of second strong cell row addresses and when the strong cell flag STR_FLAG has a logic high level.

The address changing unit 570*c* may change the refresh row address REF_ADDR into a corresponding weak cell row address in response to the first match signal MATCH1. The address changing unit 570*c* may also change the refresh row address REF_ADDR into a corresponding first strong cell row address in response to the second match signal MATCH2.

In this manner, the refresh address generator 500*c* allows weak cell rows to be refreshed instead of first strong cell rows to decrease refresh periods of the weak cell rows without increasing the refresh current and the refresh power consumption. Furthermore, since each comparing unit 550_O_1*c*, 550_O_L*c*, 550_E_1*c*, and 550_E_K*c* includes one respective N−1 bit comparator, the refresh address generator 500*c* may be reduced in size and complexity.

In FIG. 36, the address storing units and the comparing units are divided into odd and even groups according to the LSB of a weak cell row address. However the present invention may also be practiced with the address storing units and the comparing units being divided according to any one or more bits of a row address.

For example, the address storing units and the comparing units may be divided into four groups according to the lower 2 bits of a weak cell row address. In that case, upper N−2 bits of a row address (e.g., one of a weak cell row address, a first strong cell row address, and a second strong cell row address) is stored in each address storing unit, and each comparing unit includes a respective one N−2 bit comparator that compares upper N−2 bits of a refresh row address with the upper N−2 bits of the row address stored in each address storing unit.

Figure 37:
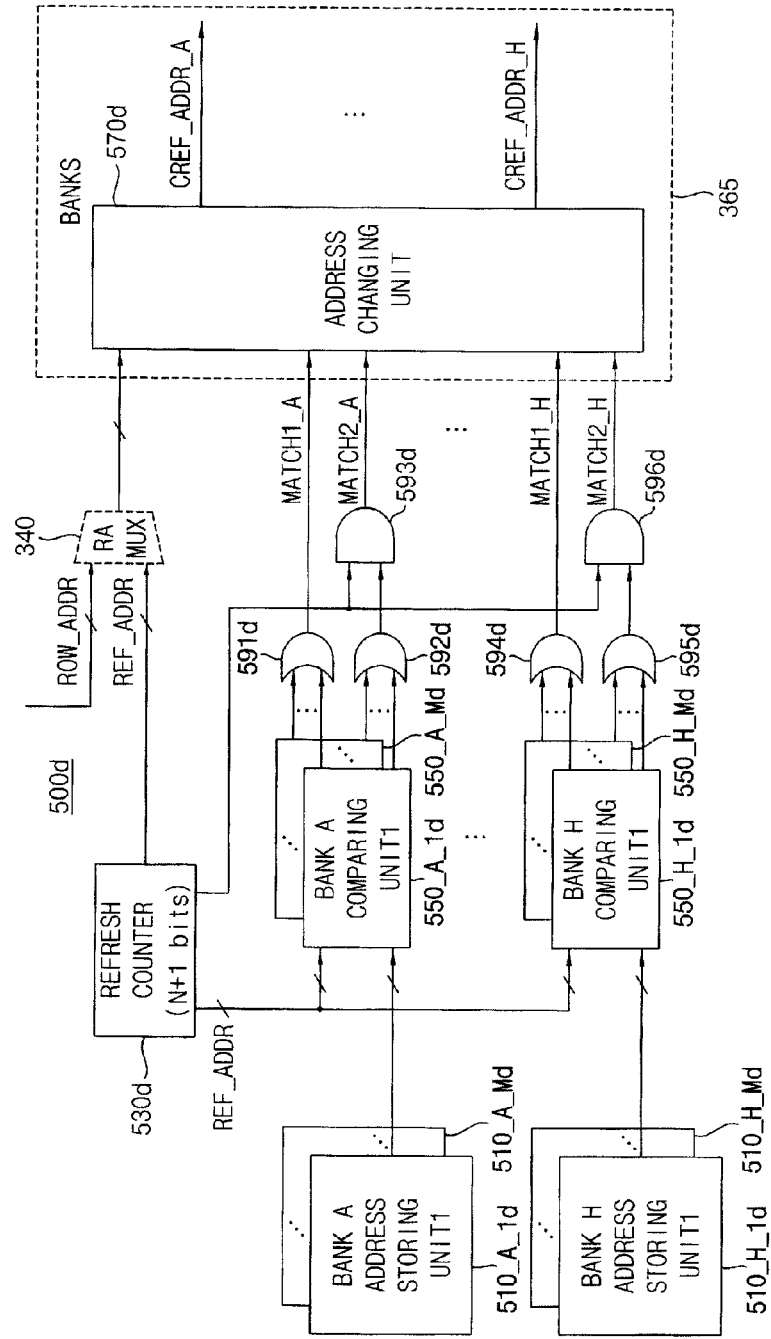
FIG. 37 is a block diagram of another refresh address generator with multiple comparing units for multiple memory banks, according to another example embodiment of the present invention.

FIG. 37 is a block diagram of a refresh address generator 500*d* with multiple comparing units for multiple memory banks, according to another example embodiment of the present invention. The refresh address generator 500*d* includes A-th through H-th bank address storing units 510_A_1*d*, 510_A_M*d*, 510_H_1*d*, and 510_H_M*d*, a refresh counter 530*d*, A-th through H-th comparing units 550_A_1*d*, 550_A_M*d*, 550_H_1*d*, and 550_H_M*d*, an OR operation unit with OR gates and AND gates 591*d*, 592*d*, 593*d*, 594*d*, 595*d*, and 596*d*, and an address changing unit 570*d*.

The address storing units 510_A_1*d*, 510_A_M*d*, 510_H_1*d*, and 510_H_M*d* are divided into a plurality of groups. A row address is stored in one of the address storing units 510_A_1*d*, 510_A_M*d*, 510_H_1*d*, and 510_H_M*d* included in a corresponding group according to a bank including a corresponding weak cell row. For example, the address storing units 510_A_1*d*, 510_A_M*d*, 510_H_1*d*, and 510_H_M*d* are divided according to A-th through H-th banks. In that case, a row address for a weak cell row included in bank A is stored in the A-th bank address storing units 510_A_1*d* and 510_A_M*d*. Similarly, a row address for a weak cell row included in bank H is stored in the H-th bank address storing units 510_H_1*d* and 510_H_M*d*.

The refresh counter 530*d* generates an initial refresh row address REF_ADDR and a strong cell flag STR_FLAG by counting. The refresh row address REF_ADDR is provided to respective banks 365 via a row address multiplexer 340 similarly as illustrated in FIG. 4. The comparing units 550_A_1d, 550_A_Md, 550_Hid, and 550_H_Md are divided into a plurality of groups similarly to the plurality of address storing units 510_A_1d, 510_A_Md, 510_H_1d, and 510_H_Md.

For example, the comparing units 550_A_1d, 550_A_Md, 550_H_1d, and 550_H_Md are divided into the A-th through H-th corresponding to each memory bank. The A-th comparing units 550_A_1d and 550_A_Md compare the refresh row address REF_ADDR with row addresses received from the A-th bank address storing units 510_A_1d and 510_A_Md. The H-th comparing units 550_H_1d and 550_H_Md compare the refresh row address REF_ADDR with row addresses received from the H-th bank address storing units 510_H_1d and 510_H_Md.

The OR operation unit includes first, second, third, and fourth OR gates 591d, 592d, 594d, and 595d, respectively, and first and second AND gates 593d and 596d, respectively. The first OR gate 591d generate a first match signal MATCH1_A for the bank A. The second OR gate 592d and the first AND gate 593d generate a second match signal MATCH2_A for the bank A. Furthermore, the third OR gate 594d generates a first match signal MATCH1_H for the bank H. The fourth OR gate 595d and the second AND gate 596d generate a second match signal MATCH2_H for the bank H.

The address changing unit 570d has components located at the respective banks 365, in an example embodiment of the present invention. The address changing unit 570d may change the initial refresh row address REF_ADDR into a weak cell row address as the final refresh row address in a corresponding bank in response to a respective one of the first match signals MATCH1_A and MATCH1_H for the respective banks 365. In addition, the address changing unit 570d may change the refresh row address REF_ADDR into a first strong cell row address in a corresponding bank in response to a respective one of the second match signals MATCH2_A and MATCH2_H for the respective banks 365.

For example, if the first match signal MATCH1_A for the bank A is at a logic high level and other first match signals MATCH1_H are at a logic low level, the address changing unit 570d generates the weak cell row address as a final refresh row address CREF_ADDR_A in the bank A but generates the refresh row address REF_ADDR that is not changed as the final refresh row address in the other banks. If the second match signal MATCH2_H for the bank H is at a logic high level and other second match signals MATCH2_A is at a logic low level, the address changing unit 570d generates the first strong cell row address as the final refresh row address CREF_ADDR_H in the bank H but generates the refresh row address REF_ADDR that is not changed as the final refresh row address in the other banks.

In this manner, the refresh address generator 500d allows weak cell rows to be refreshed instead of first strong cell rows for decreasing refresh periods of the weak cell rows without increasing the refresh current and the refresh power consumption. Furthermore, since the address storing units and the comparing units are divided on a bank basis, refresh leveraging is performed in at least one selected bank even if bank information is not stored in the address storing units.

In FIG. 36, the address storing units and the comparing units are divided according to row addresses. In FIG. 37, the address storing units and the comparing units are divided according to banks. However, the present invention may also be practiced with the address storing units and the comparing units being divided according to both the row addresses and the banks.

The above example embodiments of the present invention have been described for using strong cell rows for refresh leveraging of a weak cell row. However, the present invention may be practiced with using any unit of strong cells for refresh leveraging of any unit of a weak cell. For example more generally, multiple strong cells may be used for refresh leveraging of a weak cell.

Figure 38:
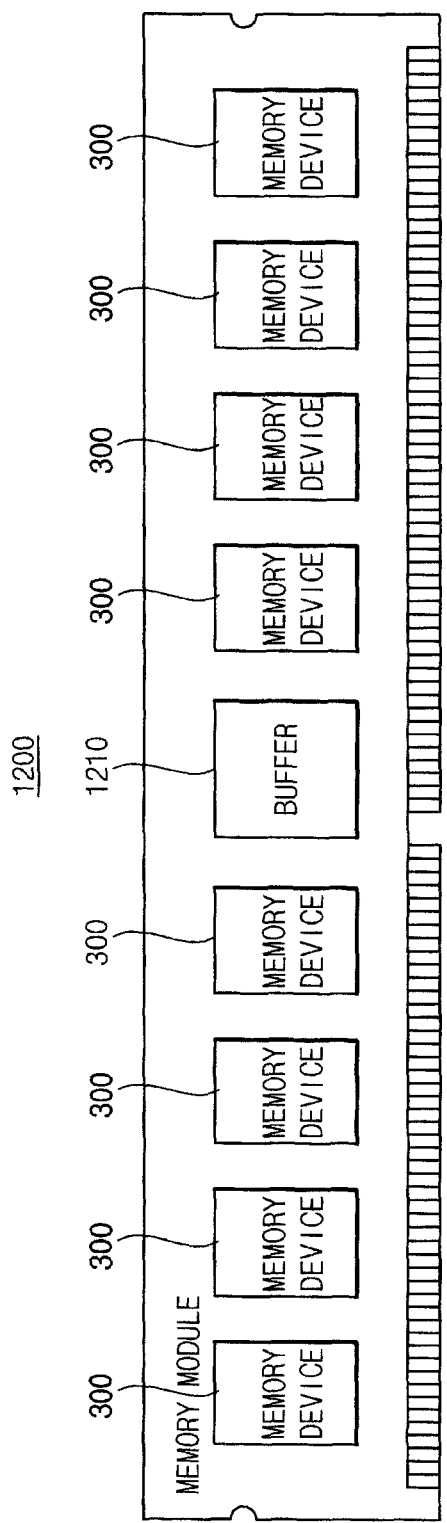
FIG. 38 is a block diagram of a memory module having a memory device with refresh leveraging performed according to example embodiments of the present invention.

FIG. 38 is a block diagram of a memory module 1200 having a memory device with refresh leveraging performed according to example embodiments of the present invention. The memory module 1200 includes a plurality of volatile memory devices 300. For example, the memory module 1200 is an unbuffered dual in-line memory module (UDIMM), a registered dual in-line memory module (RDIMM), a fully buffered dual in-line memory module (FBDIMM), or a load reduced dual in-line memory module LRDIMM.

The memory module 1200 further includes a buffer 1210 that provides a command/address signal and data by buffering the command/address signal and the data from a memory controller through a plurality of transmission lines. In an example embodiment, data transmission lines between the buffer 1200 and the volatile memory devices 300 are coupled in a point-to-point topology, and command/address transmission lines between the buffer 1200 and the volatile memory devices 300 are coupled in a multi-drop topology, a daisy-chain topology, a fly-by daisy-chain topology, or the like.

Since the buffer 1200 buffers both the command/address signal and the data, the memory controller interfaces with the memory module 1200 by driving only a load of the buffer 1200. Accordingly, the memory module 1200 includes more volatile memory devices and/or more memory ranks, and a memory system includes more memory modules.

The volatile memory devices 300 perform refresh leveraging according to embodiments of the present invention as described above. Thus, each of the volatile memory devices 300 refresh at least one weak cell row with a period shorter than a refresh period defined in the standard of the memory device without increasing the refresh current and the refresh power consumption.

Figure 39:
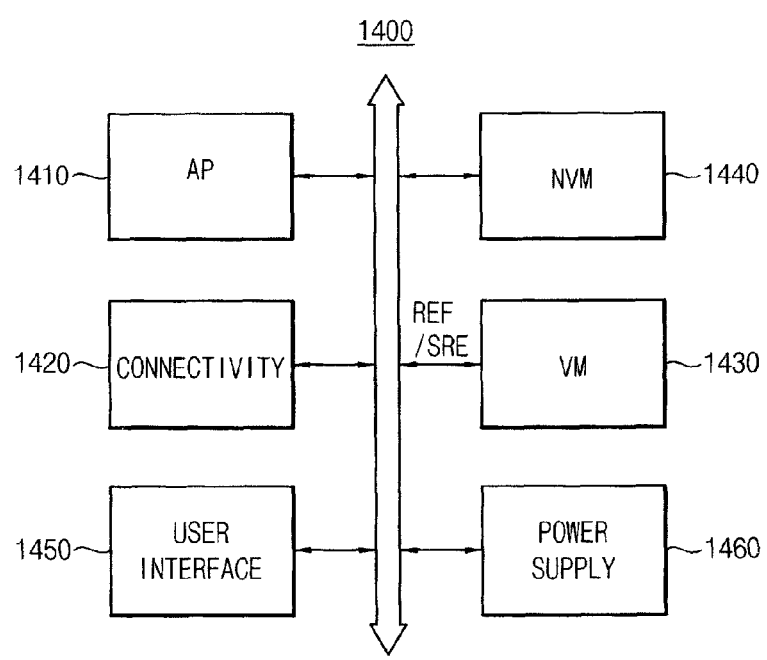
FIG. 39 is a block diagram of a mobile system having a memory device with refresh leveraging performed according to example embodiments of the present invention.

FIG. 39 is a block diagram of a mobile system 1400 having a memory device with refresh leveraging performed according to example embodiments of the present invention. The mobile system 1400 includes an application processor 1410, a connectivity unit 1420, a volatile memory device 1430, a nonvolatile memory device 1440, a user interface 1450, and a power supply 1460. For example, the mobile system 1400 is a mobile phone, a smart phone, a personal digital assistant (PDA), a portable multimedia player (PMP), a digital camera, a music player, a portable game console, or a navigation system.

The application processor 1410 executes applications such as a web browser, a game application, or a video player. For example, the application processor 1410 includes a single core or multiple cores such as when the application processor 1410 is a dual-core processor, a quad-core processor, or a hexa-core processor. In addition, the application processor 1410 may include an internal or external cache memory.

The connectivity unit 1420 performs wired or wireless communication with an external device. For example, the connectivity unit 1420 performs Ethernet communication, near field communication (NFC), radio frequency identification (RFID) communication, mobile telecommunication, memory card communication, or universal serial bus (USB) communication. For example, the connectivity unit 1420 includes a baseband chipset that supports communications, such as global system for mobile communications (GSM), general packet radio service (GPRS), wideband code division multiple access (WCDMA), or high speed downlink/uplink packet access (HSxPA).

The volatile memory device 1430 stores data processed by the application processor 1410 or operates as a working memory. For example, the volatile memory device 1430 is a dynamic random access memory, such as DDR SDRAM, LPDDR SDRAM, GDDR SDRAM, or RDRAM. In addition, the volatile memory device 1430 is a volatile memory device that performs a refresh operation with refresh leveraging according to embodiments of the present invention described above. Thus, the volatile memory device 1430 refreshes at least one weak cell row with a period shorter than a refresh period defined in the standard of the memory device without increasing the refresh current and the refresh power consumption.

The nonvolatile memory device 1440 stores a boot image for booting the mobile system 1400. For example, the nonvolatile memory device 1440 is an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), or a ferroelectric random access memory (FRAM).

The user interface 1450 includes at least one input device such as a keypad or a touch screen and at least one output device such as a speaker or a display device. The power supply 1460 supplies a power supply voltage to the mobile system 1400. The mobile system 1400 may further include a camera image processor (CIS) and/or a storage device such as a memory card, a solid state drive (SSD), a hard disk drive (HDD), or a CD-ROM.

The mobile system 1400 and/or components of the mobile system 1400 are packaged on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 40:
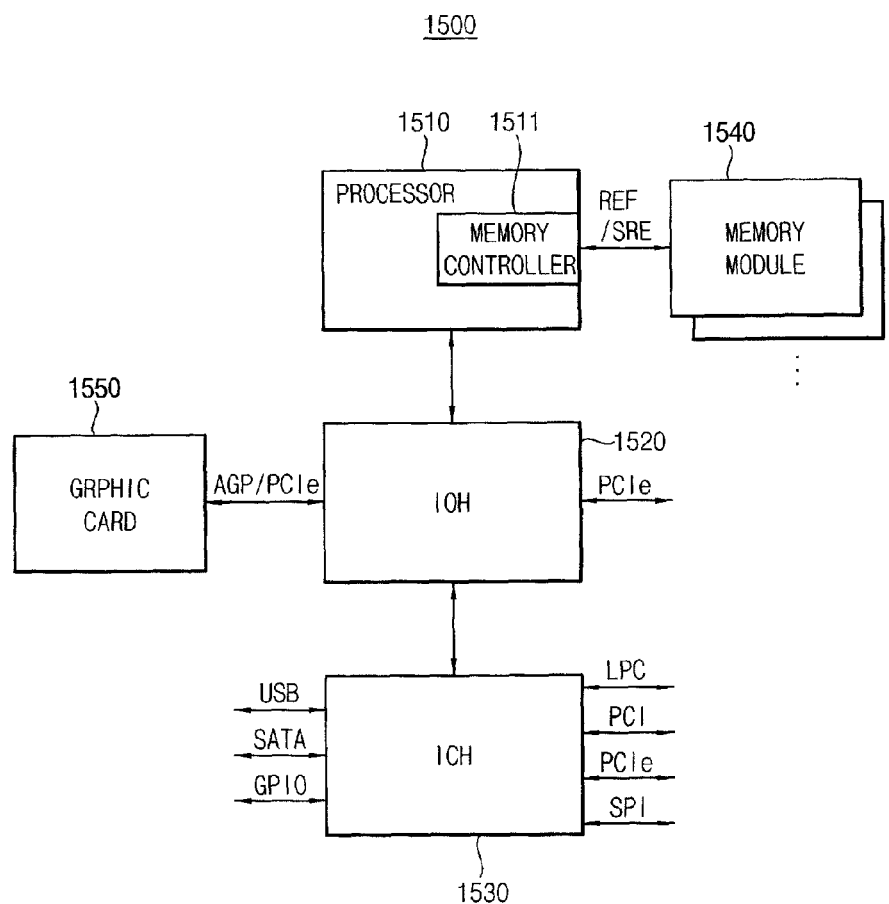
FIG. 40 is a block diagram of a computing system having a memory device with refresh leveraging performed according to example embodiments of the present invention.

FIG. 40 is a block diagram of a computing system 1500 having a memory device with refresh leveraging performed according to example embodiments of the present invention. The computing system 1500 includes a processor 1510, an input/output hub (IOH) 1520, an input/output controller hub (ICH) 1530, at least one memory module 1540, and a graphics card 1550. For example, the computing system 1500 is a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, or a navigation system.

The processor 1510 performs various computing functions such execution of specific software for performing specific calculations or tasks. For example, the processor 1510 is a microprocessor, a central process unit (CPU), a digital signal processor, or the like that includes a single core or multiple cores such as a dual-core processor, a quad-core processor, or a hexa-core processor. FIG. 40 illustrates the computing system 1500 including one processor 1510, but the computing system 1500 may include a plurality of processors. The processor 1510 may include an internal or external cache memory.

The processor 1510 includes a memory controller 1511 for controlling operations of the memory module 1540. The memory controller 1511 included in the processor 1510 may be referred to as an integrated memory controller (IMC). A memory interface between the memory controller 1511 and the memory module 1540 may be implemented with a single channel including a plurality of signal lines, or may be implemented with multiple channels to each of which at least one memory module 1540 may be coupled. In some embodiments, the memory controller 1511 may be located inside the input/output hub 1520 which may be referred to as a memory controller hub (MCH).

The memory module 1540 includes a plurality of volatile memory devices that store data provided from the memory controller 1511. The volatile memory devices perform an auto refresh operation in response to a refresh command REF from the memory controller 1511, and/or performs a self refresh operation in response to a self refresh entry command SRE from the memory controller 1511.

When performing the auto refresh operation or the self refresh operation, the volatile memory devices perform refresh leveraging according to above described embodiments of the present invention. Thus, a refresh period of at least one weak cell row is decreased without increasing the refresh current and the refresh power consumption.

The input/output hub 1520 manages data transfer between the processor 1510 and devices such as the graphics card 1550. The input/output hub 1520 is coupled to the processor 1510 via various interfaces. For example, the interface between the processor 1510 and the input/output hub 1520 is a front side bus (FSB), a system bus, a HyperTransport, a lightning data transport (LDT), a QuickPath interconnect (QPI), or a common system interface (CSI).

FIG. 40 illustrates the computing system 1500 including one input/output hub 1520, but the computing system 1500 may also include a plurality of input/output hubs. The input/output hub 1520 provides various interfaces with the devices such by providing an accelerated graphics port (AGP) interface, a peripheral component interface-express (PCIe), or a communications streaming architecture (CSA) interface.

The graphics card 1550 is coupled to the input/output hub 1520 via AGP or PCIe for controlling a display device (not shown) to display an image. The graphics card 1550 includes an internal processor for processing image data and an internal memory device. For example, the input/output hub 1520 includes an internal graphics device along with or instead of the graphics card 1550 outside the graphics card 1550. The graphics device included in the input/output hub 1520 may be referred to as integrated graphics. Furthermore, the input/output hub 1520 including the internal memory controller and the internal graphics device may be referred to as a graphics and memory controller hub (GMCH).

The input/output controller hub 1530 performs data buffering and interface arbitration to efficiently operate various system interfaces. The input/output controller hub 1530 is coupled to the input/output hub 1520 via an internal bus, such as a direct media interface (DMI), a hub interface, an enterprise Southbridge interface (ESI), or PCIe. The input/output controller hub 1530 interfaces with peripheral devices. For example, the input/output controller hub 1530 provides a universal serial bus (USB) port, a serial advanced technology attachment (SATA) port, a general purpose input/output (GPIO), a low pin count (LPC) bus, a serial peripheral interface (SPI), PCI, or PCIe.

The processor 1510, the input/output hub 1520, and the input/output controller hub 1530 may be implemented as separate chipsets or separate integrated circuits. Alternatively, at least two of the processor 1510, the input/output hub 1520, and the input/output controller hub 1530 may be implemented as a single chipset.

Embodiments of the present invention may be applied to any volatile memory device having a refresh operation and/or to a system having the volatile memory device. The foregoing is illustrative of exemplary embodiments and is not to be construed as limiting thereof. Those skilled in the art would readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A method of refreshing a memory device, comprising:
generating a refresh address with a refresh period;
performing a respective refresh on a weak cell having a first address when the refresh address is a second address instead of on a first strong cell having the second address;
performing a respective refresh on one of the first strong cell or a second strong cell having a third address when the refresh address is the third address; and
storing address information for only one of the first, second, and third addresses,
wherein the first and second addresses differ by inversion of a first bit, and wherein the second and third addresses differ by inversion of another bit that is not the first bit.

2. The method of claim 1, wherein only one of the first, second, and third addresses is stored, and wherein the remaining two of the first, second, and third addresses are determinable from a predetermined bit relationship.

3. The method of claim 1, wherein each of the first and second strong cells is not refreshed every refresh period, and wherein another refresh is performed on the weak cell when the refresh address is the first address such that the weak cell is refreshed multiple times during the refresh period.

4. The method of claim 1, further comprising:
comparing the refresh address with the address information to determine when the refresh address is any of the second and third addresses.

5. The method of claim 1, wherein the weak cell has a respective retention time shorter than the refresh period, and wherein the first and second strong cells each have a respective retention time longer than twice the refresh period.

6. The method of claim 1, wherein a respective refresh is performed on one of the first and second strong cells depending on a flag when the refresh address is the third address.

7. The method of claim 1, wherein the first an second addresses differ by inversion of a most significant bit, and wherein the second and third addresses differ by inversion of a least significant bit.

8. The method of claim 1, wherein the first, second, and third addresses are each a respective row address, and wherein the method further comprises:
performing a respective refresh on a weak row having the first address when the refresh address is the second address instead of on a first strong row having the second address; and
performing a respective refresh on one of the first strong row or a second strong row having the third address when the refresh address is the third address.

9. A method of refreshing a memory device, comprising:
generating a refresh address with a refresh period;
performing a respective refresh on a weak cell having a first address when the refresh address is a second address instead of on a first strong cell having the second address;
performing a respective refresh on one of the first strong cell or a second strong cell having a third address when the refresh address is the third address; and
storing address information for only one of the first, second, and third addresses;
wherein the first and second addresses differ by inversion of a most significant bit, and wherein the second and third addresses differ by inversion of another bit that is not the most significant bit.

10. A method of refreshing a memory device, comprising:
generating a refresh address with a refresh period;
performing a respective refresh on a weak cell having a first address when the refresh address is a second address instead of on a first strong cell having the second address;
performing a respective refresh on one of the first strong cell or a second strong cell having a third address when the refresh address is the third address; and
storing address information for only one of the first, second, and third addresses;
wherein the third address is selected from a pool of addresses having a range defined by at least two least significant bits of one of the first and second addresses.

11. The method of claim 1, further comprising:
performing a respective refresh on one of the weak cell or the first strong cell depending on a flag when the refresh address is the second address; and
performing a respective refresh on one of the weak cell or the second strong cell depending on the flag when the refresh address is the third address.

12. The method of claim 1, further comprising:
performing a respective refresh on the weak cell having the first address when the refresh address is the second address instead of on the first strong cell in a selected memory bank; and
performing a refresh on a respective cell having the second address in a non-selected memory bank.

13. The method of claim 12, further comprising:
performing a refresh on one of the first and second strong cells when the refresh address is the third address in the selected memory bank; and
performing a refresh on a respective cell having the third address in the non-selected memory bank.

14. The method of claim 1, further comprising:
performing a respective refresh on the weak cell when the refresh address is any of multiple second addresses instead of on respective cells of the second addresses.

15. The method of claim 14, further comprising:
performing a refresh on one of the respective cells of the second addresses or respective cells of multiple third addresses when the refresh address is any of the third addresses.

16. The method of claim 14, further comprising:
performing a refresh on one of the respective cells of the second addresses or the second strong cell when the refresh address is the third address.

17. The method of claim 14, further comprising:
storing the second addresses for being compared to the refresh address.

18. The method of claim 14, further comprising:
performing respective refreshes for a respective weak cell each time the refresh address is any of respective multiple second addresses for each of multiple memory banks.

19. A refresh address generator comprising:
a counter for generating an initial refresh address with a refresh period;
an address changing unit for generating a final refresh address that is a first address of a weak cell such that the weak cell is refreshed instead of a first strong cell having a second address when the initial refresh address is the second address,
and wherein the address changing unit generates the final refresh address as one of the second address and a third address of a second strong cell when the initial refresh address is the third address,
and wherein one of the first and second strong cells having the final refresh address is refreshed; and
a storing unit for storing address information for only one of the first, second, and third addresses,
wherein the first and second addresses differ by inversion of a first bit, and wherein the second and third addresses differ by inversion of another bit that is not the first bit.

20. The refresh address generator of claim 19, wherein the storing unit stores only one of the first, second, and third addresses, and wherein the remaining two of the first, second, and third addresses are determinable from a predetermined bit relationship.

21. The refresh address generator of claim 19, wherein each of the first and second strong cells is not refreshed every refresh period, and wherein the address changing unit generates the final refresh address as the first address when the initial refresh address is the first address such that the weak cell is refreshed multiple times during the refresh period.

22. The refresh address generator of claim 19, further including:
a comparing unit for comparing the initial refresh address with the address information for determining when the initial refresh address is any of the second and third addresses.

23. The refresh address generator of claim 19, wherein the weak cell has a respective retention time shorter than the refresh period, and wherein the first and second strong cells each have a respective retention time longer than twice the refresh period.

24. The refresh address generator of claim 19, wherein the address changing unit generates the final refresh address as one of the second and third addresses depending on a flag when the initial refresh address is the third address.

25. The refresh address generator of claim 19, wherein the first and second addresses differ by inversion of a most significant bit, and wherein the second and third addresses differ by inversion of a least significant bit.

26. The refresh address generator of claim 19, wherein the first, second, and third addresses are each a respective row address, and wherein a refresh is performed on a weak row having the first address instead of on a first strong row having the second address when the initial refresh address is the second address, and wherein a refresh is performed on one of the first strong row or a second strong row having the third address when the initial refresh address is the third address.

27. A refresh address generator comprising:
a counter for generating an initial refresh address with a refresh period;
an address changing unit for generating a final refresh address that is a first address of a weak cell such that the weak cell is refreshed instead of a first strong cell having a second address when the initial refresh address is the second address,
and wherein the address changing unit generates the final refresh address as one of the second address and a third address of a second strong cell when the initial refresh address is the third address,
and wherein one of the first and second strong cells having the final refresh address is refreshed; and
a storing unit for storing address information for only one of the first, second, and third addresses;
wherein the first and second addresses differ by inversion of a most significant bit, and wherein the second and third addresses differ by inversion of another bit that is not the most significant bit.

28. A refresh address generator comprising:
a counter for generating an initial refresh address with a refresh period;
an address changing unit for generating a final refresh address that is a first address of a weak cell such that the weak cell is refreshed instead of a first strong cell having a second address when the initial refresh address is the second address,
and wherein the address changing unit generates the final refresh address as one of the second address and a third address of a second strong cell when the initial refresh address is the third address,
and wherein one of the first and second strong cells having the final refresh address is refreshed; and
a storing unit for storing address information for only one of the first, second, and third addresses;
wherein the third address is selected from a pool of addresses having a range defined by at least two least significant bits of one of the first and second addresses.

29. The refresh address generator of claim 19, wherein the address changing unit generates the final refresh address as one of the first and second addresses depending on a flag when the initial refresh address is the second address, and wherein the address changing unit generates the final refresh address as one of the first and third addresses depending on the flag when the refresh address is the third address.

30. The refresh address generator of claim 19, wherein the storing unit stores bank address information such that a respective refresh is performed on the weak cell when the initial refresh address is the second address instead of on the first strong cell in a selected memory bank as indicated by the bank address, and wherein a respective refresh is preformed on a respective cell having the second address in a non-selected memory bank.

31. The refresh address generator of claim 30, wherein a respective refresh is performed on one of the first and second strong cells when the initial refresh address is the third address in the selected memory bank, and wherein a respective refresh is performed on a respective cell having the third address in the non-selected memory bank.

32. The refresh address generator of claim 19, wherein the address changing unit generates the final refresh address as the first address each time the initial refresh address is any of multiple second addresses.

33. The refresh address generator of claim 32, wherein the address changing unit generates the final refresh address as one of the second addresses and multiple third addresses when the initial refresh address is any of the third addresses.

34. The refresh address generator of claim 32, wherein the address changing unit generates the final refresh address as one of the second and third addresses when the initial refresh address is the third address.

35. The refresh address generator of claim 32, wherein the storing unit stores the second addresses for being compared to the initial refresh address.

36. The refresh address generator of claim 32, wherein respective refreshes are performed for a respective weak cell each time the initial refresh address is any of respective multiple second addresses for each of multiple memory banks.

37. A memory device comprising:
a cell array; and
a refresh address generator for refreshing the cell array, the refresh address generator including:
a counter for generating an initial refresh address with a refresh period;
an address changing unit for generating a final refresh address that is a first address of a weak cell such that the weak cell is refreshed instead of a first strong cell having a second address when the initial refresh address is the second address,
and wherein the address changing unit generates the final refresh address as one of the second address and a third address of a second strong cell when the initial refresh address is the third address,
and wherein one of the first and second strong cells having the final refresh address is refreshed; and
a storing unit for storing address information for only one of the first, second, and third addresses,
wherein the first and second addresses differ by inversion of a first bit, and wherein the second and third addresses differ by inversion of another bit that is not the first bit.

38. The memory device of claim 37, wherein the storing unit stores only one of the first, second, and third addresses, and wherein the remaining two of the first, second, and third addresses are determinable from a predetermined bit relationship.

39. The memory device of claim 37, wherein each of the first and second strong cells is not refreshed every refresh period, and wherein the address changing unit generates the final refresh address as the first address when the initial refresh address is the first address such that the weak cell is refreshed multiple times during the refresh period.

40. The memory device of claim 37, wherein the refresh address generator further includes:
a comparing unit for comparing the initial refresh address with the address information for determining when the initial refresh address is any of the second and third addresses.

41. The memory device of claim 37, wherein the weak cell has a respective retention time shorter than the refresh period, and wherein the first and second strong cells each have a respective retention time longer than twice the refresh period.

42. The memory device of claim 37, wherein the address changing unit generates the final refresh address as one of the second and third addresses depending on a flag when the initial refresh address is the third address.

43. The memory device of claim 37, wherein the first and second addresses differ by inversion of a most significant bit, and wherein the second and third addresses differ by inversion of a least significant bit.

44. The memory device of claim 37, wherein the first, second, and third addresses are each a respective row address, and wherein a refresh is performed on a weak row having the first address instead of on a first strong row having the second address when the initial refresh address is the second address, and wherein a refresh is performed on one of the first strong row or a second strong row having the third address when the initial refresh address is the third address.

45. A memory device comprising:
a cell array; and
a refresh address generator for refreshing the cell array, the refresh address generator including:
a counter for generating an initial refresh address with a refresh period;
an address changing unit for generating a final refresh address that is a first address of a weak cell such that the weak cell is refreshed instead of a first strong cell having a second address when the initial refresh address is the second address,
and wherein the address changing unit generates the final refresh address as one of the second address and a third address of a second strong cell when the initial refresh address is the third address,
and wherein one of the first and second strong cells having the final refresh address is refreshed; and
a storing unit for storing address information for only one of the first, second, and third addresses;
wherein the first and second addresses differ by inversion of a most significant bit, and wherein the second and third addresses differ by inversion of another bit that is not the most significant bit.

46. A memory device comprising:
a cell array; and
a refresh address generator for refreshing the cell array, the refresh address generator including:
a counter for generating an initial refresh address with a refresh period;
an address changing unit for generating a final refresh address that is a first address of a weak cell such that the weak cell is refreshed instead of a first strong cell having a second address when the initial refresh address is the second address,
and wherein the address changing unit generates the final refresh address as one of the second address and a third address of a second strong cell when the initial refresh address is the third address,
and wherein one of the first and second strong cells having the final refresh address is refreshed; and
a storing unit for storing address information for only one of the first, second, and third addresses;
wherein the third address is selected from a pool of addresses having a range defined by at least two least significant bits of one of the first and second addresses.

47. The memory device of claim 37, wherein the address changing unit generates the final refresh address as one of the first and second addresses depending on a flag when the initial refresh address is the second address, and wherein the address changing unit generates the final refresh address as one of the first and third addresses depending on the flag when the refresh address is the third address.

48. The memory device of claim 47, wherein the storing unit stores bank address information such that a respective refresh is performed on the weak cell when the initial refresh address is the second address instead of on the first strong cell in a selected memory bank as indicated by the bank address, and wherein a respective refresh is preformed on a respective cell having the second address in a non-selected memory bank.

49. The memory device of claim 48, wherein a respective refresh is performed on one of the first and second strong cells when the initial refresh address is the third address in the selected memory bank, and wherein a respective refresh is performed on a respective cell having the third address in the non-selected memory bank.

50. The memory device of claim 37, wherein the address changing unit generates the final refresh address as the first address each time the initial refresh address is any of multiple second addresses.

51. The memory device of claim 50, wherein the address changing unit generates the final refresh address as one of the second addresses and multiple third addresses when the initial refresh address is any of the third addresses.

52. The memory device of claim 50, wherein the address changing unit generates the final refresh address as one of the second and third addresses when the initial refresh address is the third address.

53. The memory device of claim 50, wherein the storing unit stores the second addresses for being compared to the initial refresh address.

54. The memory device of claim 50, wherein respective refreshes are performed for a respective weak cell each time the initial refresh address is any of respective multiple second addresses for each of multiple memory banks.

* * * * *